(12) United States Patent
Choi et al.

(10) Patent No.: US 12,100,784 B2
(45) Date of Patent: Sep. 24, 2024

(54) DISPLAY DEVICE AND MANUFACTURING METHOD THEREOF

(71) Applicant: SAMSUNG DISPLAY CO., LTD., Yongin-si (KR)

(72) Inventors: Hae Yun Choi, Yongin-si (KR); Jong Hyuk Kang, Yongin-si (KR); Hyun Deok Im, Yongin-si (KR); Jae Hoon Jung, Yongin-si (KR); Han Su Kim, Yongin-si (KR); Eun A Yang, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 298 days.

(21) Appl. No.: 17/610,062

(22) PCT Filed: Mar. 4, 2020

(86) PCT No.: PCT/KR2020/003078
§ 371 (c)(1),
(2) Date: Nov. 9, 2021

(87) PCT Pub. No.: WO2020/230989
PCT Pub. Date: Nov. 19, 2020

(65) Prior Publication Data
US 2022/0262984 A1    Aug. 18, 2022

(30) Foreign Application Priority Data
May 10, 2019    (KR) .................. 10-2019-0055055

(51) Int. Cl.
*H01L 33/38*    (2010.01)
*H01L 25/075*    (2006.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC . H01L 33/382; H01L 25/0753; H01L 33/005; H01L 33/505; H01L 33/62;
(Continued)

(56) References Cited

U.S. PATENT DOCUMENTS 9,059,114 B2    6/2015  Do et al.
9,181,630 B2    11/2015 Shibata et al.
(Continued)

FOREIGN PATENT DOCUMENTS

CN    108074956    5/2018
JP    2008-112644   5/2008
(Continued)

OTHER PUBLICATIONS

International Search Report, with English translation, corresponding to International Application No. PCT/KR2020/003078 dated Jun. 15, 2020.
(Continued)

*Primary Examiner* — Yasser A Abdelaziz
(74) *Attorney, Agent, or Firm* — KILE PARK REED & HOUTTEMAN PLLC

(57) ABSTRACT

A pixel includes a first bank pattern and a second bank pattern disposed on a base layer; a first electrode and a second electrode disposed on the first bank pattern and the second bank pattern, and spaced apart from each other; a light emitting element disposed between the first electrode and the second electrode, and including a first end electrically connected to the first electrode, and a second end electrically connected to the second electrode; and at least one insulating layer overlapping the light emitting element (Continued)

and at least one of the first electrode and the second electrode. The at least one insulating layer includes at least one of a first opening adjacent to the first end of the light emitting element and a second opening adjacent to the second end of the light emitting element.

20 Claims, 56 Drawing Sheets

(51) Int. Cl.
    *H01L 33/00*      (2010.01)
    *H01L 33/50*      (2010.01)
    *H01L 33/62*      (2010.01)

(52) U.S. Cl.
    CPC ............ *H01L 33/505* (2013.01); *H01L 33/62* (2013.01); *H01L 2933/0016* (2013.01)

(58) Field of Classification Search
    CPC . H01L 2933/0016; H01L 33/20; H01L 33/60; H01L 25/167; H01L 27/1248; H01L 27/1255; H01L 27/156; H01L 27/1214; H01L 27/124; H01L 33/36; H01L 33/58
    See application file for complete search history.

(56) References Cited

U.S. PATENT DOCUMENTS

| | | |
|---|---|---|
| 9,570,425 B2 | 2/2017 | Do |
| 9,773,761 B2 | 9/2017 | Do |
| 10,451,940 B2 | 10/2019 | Park et al. |
| 10,497,680 B2 | 12/2019 | Sung et al. |
| 10,797,212 B2 | 10/2020 | Im et al. |
| 2018/0122836 A1 | 5/2018 | Kang et al. |
| 2018/0175009 A1 | 6/2018 | Kim et al. |
| 2018/0175106 A1 | 6/2018 | Kim et al. |
| 2019/0096858 A1 | 3/2019 | Woo et al. |
| 2020/0105828 A1* | 4/2020 | Ryu ........................ G06V 40/13 |
| 2020/0402453 A1* | 12/2020 | Cho ..................... G09G 3/3225 |
| 2021/0288217 A1* | 9/2021 | Li ........................... H01L 33/38 |
| 2021/0335963 A1* | 10/2021 | Ding ..................... H10K 59/13 |

FOREIGN PATENT DOCUMENTS

| | | |
|---|---|---|
| KR | 10-2013-0033450 | 4/2013 |
| KR | 10-2018-0007025 | 1/2018 |
| KR | 10-2018-0046494 | 5/2018 |
| KR | 10-2018-0072909 | 7/2018 |
| KR | 10-1874993 | 7/2018 |
| KR | 10-2019-0034379 | 4/2019 |
| KR | 10-2019-0042130 | 4/2019 |
| KR | 10-2020-0010704 | 1/2020 |

OTHER PUBLICATIONS

Written Opinion, with English translation, corresponding to International Application No. PCT/KR2020/003078, dated Jun. 15, 2020.

* cited by examiner

DISPLAY DEVICE AND MANUFACTURING METHOD THEREOF

CROSS-REFERENCE TO RELATED APPLICATION(S)

This application is a national entry of International Application No. PCT/KR2020/003078, filed on Mar. 4, 2020, which claims under 35 U.S.C. §§ 119(a) and 365(b) priority to and benefits of Korean Patent Application No. 10-2019-0055055, filed on May 10, 2019 in the Korean Intellectual Property Office, the entire contents of which are incorporated herein by reference.

BACKGROUND

1. Technical Field

Embodiments relate to a display device and a method of fabricating the same.

2. Description of the Related Art

Recently, technologies of manufacturing a subminiature light emitting element using a material having a reliable inorganic crystal structure and manufacturing a light emitting device using the light emitting element have been developed. For example, the technologies of fabricating subminiature light emitting elements each having a small size in a range from the nanometer scale to the micrometer scale, and forming light sources of various light emitting devices including pixels of display devices using the subminiature light emitting elements, have been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object is to provide a display device including a light emitting element and a method of fabricating the same.

A display device in accordance with an embodiment may include a pixel disposed in a display area. The pixel may include a first bank pattern and a second bank pattern disposed on a base layer and spaced apart from each other; a first electrode and a second electrode disposed on the first bank pattern and the second bank pattern, respectively, and spaced apart from each other; a light emitting element disposed between the first electrode and the second electrode, and including a first end electrically connected to the first electrode, and a second end electrically connected to the second electrode; and at least one insulating layer overlapping the light emitting element and at least one of the first electrode and the second electrode, and including at least one of a first opening adjacent to the first end of the light emitting element and a second opening adjacent to the second end of the light emitting element.

In an embodiment, the first opening of the at least one insulating layer may be disposed in an area corresponding to a space between the first end of the light emitting element and the first bank pattern. The second opening of the at least one insulating layer may be disposed in an area corresponding to a space between the second end of the light emitting element and the second bank pattern.

In an embodiment, the first opening of the at least one insulating layer may overlap the first bank pattern. The second opening of the at least one insulating layer may overlap the second bank pattern.

In an embodiment, the first opening of the at least one insulating layer may have a width equal to or less than a width of the first bank pattern and may overlap the first bank pattern. The second opening of the at least one insulating layer may have a width equal to or less than a width of the second bank pattern and may overlap the second bank pattern.

In an embodiment, the first opening and the second opening of the at least one insulating layer may be spaced apart from the light emitting element by a distance.

In an embodiment, each of the first opening and the second opening of the at least one insulating layer may vertically pass through the at least one insulating layer at an angle in a range of about 80° to about 100° with respect to a plane on which the light emitting element is disposed.

In an embodiment, the first bank pattern may include a substantially inclined surface or substantially curved surface facing the first end of the light emitting element. The second bank pattern may include a substantially inclined surface or a substantially curved surface facing the second end of the light emitting element.

In an embodiment, each of the first electrode and the second electrode may include a substantially inclined surface or a substantially curved surface substantially corresponding to a shape of the first bank pattern and the second bank pattern, respectively, and may include a reflective electrode layer.

In an embodiment, the display device may further include at least one of a first insulating layer disposed on the first electrode and the second electrode and exposing an area of the first electrode and an area of the second electrode; and a second insulating layer disposed on the light emitting element and exposing the first end and the second end of the light emitting element.

In an embodiment, the pixel may include a third electrode disposed on the first end of the light emitting element and the first electrode, and electrically connecting the first end of the light emitting element to the first electrode; and a fourth electrode disposed on the second end of the light emitting element and the second electrode, and electrically connecting the second end of the light emitting element to the second electrode.

In an embodiment, the at least one insulating layer may be disposed directly on at least one of the third electrode and the fourth electrode. The first opening and the second opening of the at least one insulating layer may expose an area of the third electrode and an area of the fourth electrode, respectively.

In an embodiment, the at least one insulating layer may include at least one of a third insulating layer disposed on the third electrode and an area including the first end of the light emitting element, and overlapping an end of the third electrode on the light emitting element; and a fourth insulating layer disposed on a surface of the display area including a space over the light emitting element, the third electrode, and the fourth electrode.

In an embodiment, the first opening of the at least one insulating layer may pass through the third insulating layer and the fourth insulating layer. The second opening of the at least one insulating layer may pass through the fourth insulating layer.

In an embodiment, the display device may further include an upper substrate overlapping the pixel, and including a light conversion layer overlapping the pixel.

In an embodiment, the light conversion layer may include at least one of a color filter layer facing the pixel, on the upper substrate; and a color conversion layer disposed between the color filter layer and the pixel, and including color conversion particles.

A method of fabricating a display device in accordance with an embodiment may include forming a first bank pattern and a second bank pattern spaced apart from each other on a base layer; forming a first electrode and a second electrode on the first bank pattern and the second bank pattern, respectively; aligning a light emitting element between the first electrode and the second electrode; forming a third electrode and a fourth electrode that connect a first end and a second end of the light emitting element to the first electrode and the second electrode, respectively; forming at least one insulating layer on the light emitting element and at least one of the third electrode and the fourth electrode; and forming at least one opening in the at least one insulating layer in an area adjacent to at least one end of the first end and the second end of the light emitting element.

In an embodiment, the forming of the at least one opening may include dry-etching the at least one insulating layer in a direction.

In an embodiment, the method may include forming the third electrode and the fourth electrode. The forming of the at least one insulating layer may include at least one of forming an insulating layer overlapping the third electrode and an area including the first end of the light emitting element after the forming of the third electrode; and forming an insulating layer overlapping a surface of a display area including a space over the light emitting element, the third electrode, and the fourth electrode after forming the fourth electrode.

In an embodiment, the forming of the at least one opening may include forming a first opening by etching the at least one insulating layer in an area corresponding to a space between the first bank pattern and the first end of the light emitting element, and forming a second opening by etching the at least one insulating layer in an area corresponding to a space between the second bank pattern and the second end of the light emitting element.

In an embodiment, the forming of the at least one opening may include forming a first opening by etching the at least one insulating layer in an area over the first bank pattern, and forming a second opening by etching the at least one insulating layer in an area over the second bank pattern.

In a display device and a method of fabricating the display device in accordance with various embodiments, the light efficiency of a pixel including a light emitting element may be enhanced.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
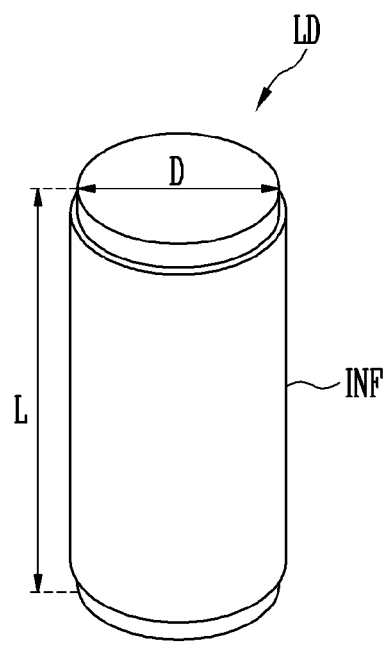
FIGS. 1A and 1B are respectively a schematic perspective view and a schematic cross-sectional view illustrating a light emitting element in accordance with an embodiment.

Reference will now be made in detail to various embodiments, examples of which are illustrated in the accompanying drawings and described below, but the embodiments e can be variously modified in many different forms. However, the disclosure is not limited to the following embodiments and may be modified into various forms.

Some elements which may not be directly related to the features in the drawings may be omitted to clearly explain the disclosure. Furthermore, the sizes, ratios, etc. of some elements in the drawings may be slightly exaggerated. It should be noted that the same reference numerals are used to designate the same or similar elements throughout the drawings, and repetitive explanation may be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprise", "include", "have", etc. and variations thereof when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first component or part is disposed on a second component or part, the first component or part may be not only directly on the second component or part but a third component or part may also intervene between them. Furthermore, the term "position", "direction", etc. used in the following description are defined in relative terms, and it should be noted that they may be changed into a reverse position or direction depending on a view angle or direction.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B, 2A, 2B, 3A, and 3B are schematic perspective views and schematic cross-sectional views each illustrating a light emitting element LD in accordance with an embodiment. Although FIGS. 1A to 3B illustrate cylindrical rod-type light emitting elements LD, the type and/or shape of the light emitting elements LD in accordance with the disclosure is not limited thereto.

Figure 1B:
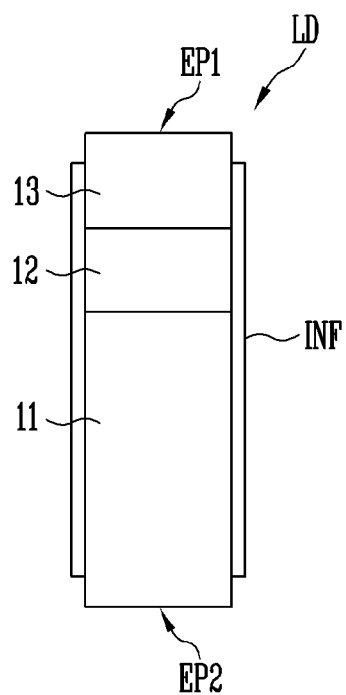

Referring to FIGS. 1A and 1B, a light emitting element LD in accordance with an embodiment may include a first conductivity type semiconductor layer (or first semiconductor layer) 11, a second conductivity type semiconductor layer (or second semiconductor layer) 13, and an active layer 12 interposed between the first and second conductivity type semiconductor layers 11 and 13. For example, the light emitting element LD may include the first conductivity type semiconductor layer 11, the active layer 12, and the second conductivity type semiconductor layer 13 which may be successively stacked each other in a longitudinal direction.

In an embodiment, the light emitting element LD may be provided in the form of a rod extending in a direction. If the direction in which the light emitting element LD extends is defined as the longitudinal direction, the light emitting element LD may have a first end EP1 and a second end EP2 in the longitudinal direction.

In an embodiment, one of the first and second conductivity type semiconductor layers 11 and 13 may be disposed on the first end EP1 of the light emitting element LD. The other one of the first and second conductivity type semiconductor layers 11 and 13 may be disposed on the second end EP2 of the light emitting element LD.

In an embodiment, the light emitting element LD may be a rod-type light emitting element (also referred to as "rod-type light emitting diode") fabricated in the form of a rod by an etching scheme or the like within the spirit and the scope of the disclosure. In this specification, the term "rod-type shape" embraces a rod-like shape and a bar-like shape such as a cylindrical shape and a prismatic shape extending in a longitudinal direction (for example, having an aspect ratio greater than 1), and the cross-sectional shape thereof is not limited to a particular shape. For example, the length L of the light emitting element LD may be greater than a diameter D thereof (or a width of the cross-section thereof). In the specification, shape may mean a shape substantially corresponding to a shape. For example, a cylindrical shape may mean a substantially cylindrical shape within the spirit and the scope of the disclosure.

In an embodiment, the light emitting element LD may have a small size ranging from the nanometer scale to the micrometer scale. For example, each light emitting element LD may have a diameter D (or a width) and/or a length L ranging from the nanometer scale to the micrometer scale. However, in the disclosure, the size of the light emitting element LD is not limited thereto. For example, the size of the light emitting element LD may be changed in various ways depending on design conditions of various devices, for example, a display device, which employs, as a light source, a light emitting device using a light emitting element LD.

The first conductivity type semiconductor layer 11 may include, for example, at least one N-type semiconductor layer. For instance, the first conductivity type semiconductor layer 11 may include an N-type semiconductor layer which may include any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited thereto, and the first conductivity type semiconductor layer 11 may be formed of various other materials.

The active layer 12 may be disposed on the first conductivity type semiconductor layer 11 and have a single or multi-quantum well (MQW) structure. In an embodiment, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

The second conductivity type semiconductor layer 13 may be disposed on the active layer 12 and include a semiconductor layer having a type different from that of the first conductivity type semiconductor layer 11. For example, the second conductivity type semiconductor layer 13 may include at least one P-type semiconductor layer. For instance, the second conductivity type semiconductor layer 13 may include a P-type semiconductor layer which may include any one semiconductor material of InAlGaN, GaN, AlGaN, InGaN, AlN, and InN, and is doped with a second conductive dopant such as Mg. However, the material for forming the second conductivity type semiconductor layer 13 is not limited thereto, and the second conductivity type semiconductor layer 13 may be formed of various other materials.

In case that a voltage equal to or greater than a threshold voltage is applied between the opposite ends of the light emitting element LD, the light emitting element LD may emit light by recombination of electron-hole pairs in the active layer 12. Since light emission of the light emitting element LD can be controlled based on the foregoing principle, the light emitting element LD may be used as a light source of various light emitting devices as well as a pixel of the display device.

In an embodiment, the light emitting element LD may further include an insulating film INF provided on the surface of the light emitting element LD. The insulating film INF may be formed on the surface of the light emitting element LD to enclose an outer circumferential surface of at least the active layer 12, and may further enclose areas (or portions) of the first and second conductivity type semiconductor layers 11 and 13. Here, the insulating film INF may allow the opposite ends of the light emitting element LD that have different polarities to be exposed to the outside. For example, the insulating film INF may expose the first and second ends EP1 and EP2 that are disposed on the respective opposite ends of the light emitting element LD in the longitudinal direction (for example, may expose the top and bottom surfaces of the light emitting element LD that correspond to two base sides of the cylinder as shown in FIGS. 1A and 1B) rather than covering or overlapping the first and second ends EP1 and EP2.

In an embodiment, the insulating film INF may include at least one insulating material of silicon dioxide ($SiO_2$), silicon nitride ($Si_3N_4$), aluminium oxide ($Al_2O_3$), and titanium dioxide ($TiO_2$), but it is not limited thereto. In other words, the material that forms the insulating film INF is not limited to a particular material, and the insulating film INF may be formed of various insulating materials.

In an embodiment, the light emitting element LD may further include additional other components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on one end or an end of the first conductivity type semiconductor layer 11, the active layer 12, and/or the second conductivity type semiconductor layer 13.

Figure 2A:
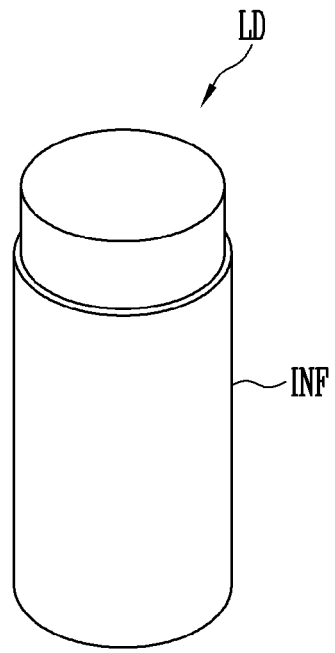
FIGS. 2A and 2B are respectively a schematic perspective view and a schematic cross-sectional view illustrating a light emitting element in accordance with an embodiment.
Figure 2B:
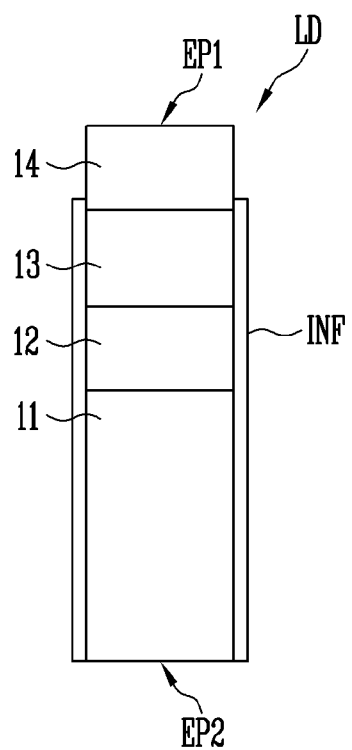

For example, as illustrated in FIGS. 2A and 2B, the light emitting element LD may further include at least one electrode layer 14 disposed on one end or an end of the second conductivity type semiconductor layer 13. For example, the light emitting element LD may further include an electrode layer 14 disposed on the first end EP1.

Figure 3A:
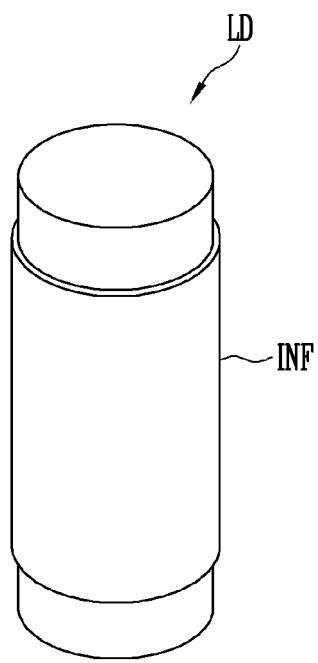
FIGS. 3A and 3B are respectively a schematic perspective view and a schematic cross-sectional view illustrating a light emitting element in accordance with an embodiment.
Figure 3B:
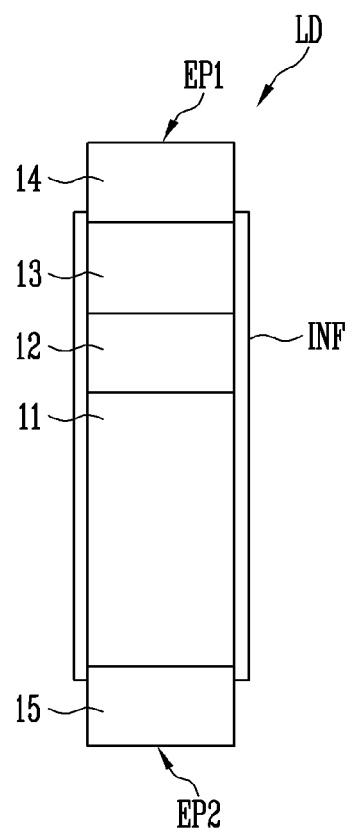

In an embodiment, as illustrated in FIGS. 3A and 3B, the light emitting element LD may further include at least one electrode layer 15 disposed on one end or an end of the first conductivity type semiconductor layer 11. For example, the light emitting element LD may include electrode layers 14 and 15 that are respectively disposed on the first and second ends EP1 and EP2.

Each of the electrode layers 14 and 15 may be an ohmic contact electrode, but it is not limited thereto. Each of the electrode layers 14 and 15 may include metal or metal oxide. For example, each of the electrode layers 14 and 15 may be formed of chromium (Cr), titanium (Ti), aluminium (Al), gold (Au), nickel (Ni), oxides or alloys thereof, transparent electrode materials such as indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer circumferential surfaces of the electrode layers 14 and 15, or may not enclose the outer circumferential surfaces thereof. In other words, the insulating film INF may be selectively formed on the surfaces of the electrode layers 14 and 15. Furthermore, the insulating film INF may be formed to expose the opposite ends of the light emitting element LD that have different conductivity types (for example, P-type and N-type, respectively). For example, the insulating film INF may expose at least areas of the electrode layers 14 and 15 on the first and second ends EP1 and EP2 of the light emitting element LD. As an example, in an embodiment, the insulating film INF may not be provided in the light emitting element LD.

If the insulating film INF is provided to cover or overlap a surface of the light emitting element LD, for example, an outer circumferential surface of the active layer 12, the active layer 12 may be prevented from short-circuiting with at least one electrode (for example, a first or second electrode of the pixel), which is not shown. The electrical stability of the light emitting element LD may be secured. In the description of each embodiment, the term "connecting (or connection)" may comprehensively refer to physical and/or electrical connecting (or connection). Furthermore, the term "connecting (or connection)" may comprehensively refer to direct or indirect connecting (or connection) and integral or non-integral connecting (or connection).

Furthermore, by forming the insulating film INF on the surface of the light emitting element LD, occurrence of a defect on the surface of the light emitting element LD may be minimized, whereby the lifetime and efficiency of the light emitting element LD may be improved. If the insulating film INF is formed on each light emitting element LD, even in case that light emitting elements LD are disposed adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that light emitting elements LD are mixed with a fluidic solution (or solvent) and supplied to each emission area (for example, an emission area of each pixel), the light emitting elements LD can be evenly dispersed rather than unevenly aggregating in the solution.

In an unlimited embodiment pertaining to this, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, for example, within the spirit and the scope of the disclosure. Furthermore, the hydrophobic material may be a commercially available fluorine containing material such as Teflon™ or Cytop™, or a corresponding material.

The above-described light emitting element LD may be used as a light source in different types of light emitting devices including a pixel of a display device. For instance, at least one subminiature light emitting element LD, for example, subminiature light emitting elements LD each having a size ranging from the nanometer scale to the micrometer scale, may be disposed in each pixel area of the display panel for forming a screen of the display device, and form a light source (or, a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 4A:
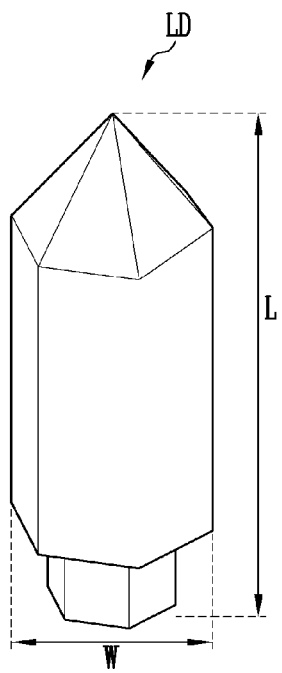
FIGS. 4A and 4B are respectively a schematic perspective view and a schematic cross-sectional view illustrating a light emitting element in accordance with an embodiment.
Figure 4B:
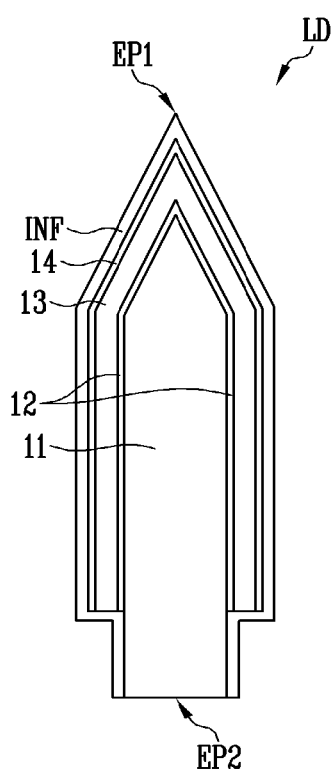

FIGS. 4A and 4B are respectively a schematic perspective view and a schematic cross-sectional view illustrating a light emitting element LD in accordance with an embodiment. In an embodiment, FIGS. 4A and 4B illustrate a light emitting element LD having a structure different from that of the light emitting elements LD illustrated in FIGS. 1A to 3B, and for example illustrate a light emitting element LD having a core-shell structure. In other words, the type, the structure, and/or the shape of the light emitting element LD in accordance with an embodiment may be changed in various ways. In descriptions of an embodiment of FIGS. 4A and 4B, like reference numerals are used to designate components similar or equal (or corresponding) to those of the embodiments of FIGS. 1A to 3B, and detailed descriptions thereof will be omitted.

Referring to FIGS. 4A and 4B, the light emitting element LD in accordance with an embodiment may include a first conductivity type semiconductor layer 11, a second conductivity type semiconductor layer 13, and an active layer 12 interposed between the first and second conductivity type semiconductor layers 11 and 13. In an embodiment, the first conductivity type semiconductor layer 11 may be disposed in a central area of the light emitting element LD, and the active layer 12 may be disposed on a surface of the first conductivity type semiconductor layer 11 to enclose at least one area or an area of the first conductivity type semiconductor layer 11. The second conductivity type semiconductor layer 13 may be disposed on a surface of the active layer 12 to enclose at least one area or an area of the active layer 12.

The light emitting element LD may selectively further include an electrode layer 14 to enclose at least one area or an area of the second conductivity type semiconductor layer 13, and/or an insulating film INF disposed on an outermost surface of the light emitting element LD. For example, the light emitting element LD may further include the electrode layer 14 disposed on a surface of the second conductivity type semiconductor layer 13 to enclose at least one area or an area of the second conductivity type semiconductor layer 13, and the insulating film INF disposed on a surface of the electrode layer 14 to enclose at least one area or an area of the electrode layer 14.

In an embodiment, the insulating film INF may be provided on the surface of the light emitting element LD to cover or overlap a portion of the outer circumferential surface of the first conductivity type semiconductor layer 11 and an outer circumferential surface of the electrode layer 14. The insulating film INF may include transparent insulating material.

In an embodiment, after the insulating film INF is formed to cover or overlap the entirety of the outer circumferential surface of the electrode layer 14 included in the light emitting element LD, the insulating film INF may be partially removed to expose one area or an area of the electrode layer 14 for electrical connection with an electrode, which is not shown, (for example, a first electrode of a pixel).

The light emitting element LD in accordance with the foregoing embodiment may be a core-shell light emitting element (also referred to as "core-shell light emitting diode") fabricated by a growth scheme or the like within the spirit and the scope of the disclosure. For example, the light emitting element LD may have a core-shell structure including the first conductivity type semiconductor layer 11, the active layer 12, the second conductivity type semiconductor layer 13, the electrode layer 14, and the insulating film INF that are successively disposed in a direction from the center to the periphery. In an embodiment, the light emitting element LD may not include at least one of the electrode layer 14 and the insulating film INF.

In an embodiment, the light emitting element LD may have a polypyramid shape extending in one direction. For example, at least one area or an area of the light emitting element LD may have a hexagonal pyramid shape. However, the shape of the light emitting element LD may be changed in various ways.

If the direction in which the light emitting element LD extends is defined as the longitudinal direction, the light emitting element LD may have a first end EP1 and a second end EP2 in the longitudinal direction. In an embodiment, one of the first and second conductivity type semiconductor layers 11 and 13 (or an electrode layer to enclose any one of the first and second conductivity type semiconductor layers 11 and 13) is disposed on the first end EP1 of the light emitting element LD. The other one of the first and second conductivity type semiconductor layers 11 and 13 (or an electrode layer to enclose the other one of the first and second conductivity type semiconductor layers 11 and 13) may be disposed on the second end EP2 of the light emitting element LD.

In an embodiment, the light emitting element LD may be a light emitting diode, which has a core-shell structure with the first end EP1 protruding in a polypyramid shape (for example, a hexagonal pyramid shape), and has a subminiature size. For example, the light emitting element LD may have a shape corresponding to a combination of a hexagonal pyramid and a hexagonal prism, and may have a small size ranging from the nanometer scale to the micrometer scale, for example, a width W and/or a length L corresponding to the nanometer scale or the micrometer scale. Here, the size and the shape of the light emitting element LD may be changed depending on design conditions of various devices, for example, a display device, which employs the light emitting element LD as a light source.

In an embodiment, the opposite ends of the first conductivity type semiconductor layer 11 may have shapes protruding in the longitudinal direction of the light emitting element LD. The shapes in which the opposite ends of the first conductivity type semiconductor layer 11 protrude outward may differ from each other. For example, disposed at an upper position, a first end of the opposite ends of the first conductivity type semiconductor layer 11 may have a pyramid shape (for example, a hexagonal pyramid shape) the width of which is reduced upward to form one apex. Furthermore, disposed at a lower position, a second end of the opposite ends of the first conductivity type semiconductor layer 11 may have a prismatic shape (for example, a hexagonal prism shape) having a constant width, but the disclosure is not limited thereto. For example, in an embodiment, the first conductivity type semiconductor layer 11 may have a polygonal or stepped cross-section, the width of which is gradually reduced downward. The shapes of the opposite ends of the first conductivity type semiconductor layer 11 may be changed in various ways depending on embodiments.

The first conductivity type semiconductor layer 11 may be disposed in a core of the light emitting element LD, for example, a central (or middle) portion of the light emitting element LD. Furthermore, the light emitting element LD may have a shape corresponding to the shape of the first conductivity type semiconductor layer 11. For instance, if the first conductivity type semiconductor layer 11 has a hexagonal pyramid shape on the upper one end or an end thereof, the light emitting element LD may have a hexagonal pyramid shape on an upper one end or an end thereof (for example, the first end EP1).

The active layer 12 may be provided and/or formed in a shape enclosing an outer circumferential surface of the first conductivity type semiconductor layer 11. For example, the active layer 12 may be provided and/or formed in a shape enclosing an area of the first conductivity type semiconductor layer 11, other than one end or an end (for example, the lower one end or an end) of the first conductivity type semiconductor layer 11 with respect to the longitudinal direction of the light emitting element LD.

The second conductivity type semiconductor layer 13 may be provided and/or formed in a shape enclosing an outer circumferential surface of the active layer 12, and include a semiconductor layer having a type different from that of the first conductivity type semiconductor layer 11. For example, in the case where the first conductivity type semiconductor layer 11 may include an N-type semiconductor layer, the second conductivity type semiconductor layer 13 may include a P-type semiconductor layer.

In an embodiment, the light emitting element LD may further include an electrode layer 14 that encloses an outer circumferential surface of the second conductivity type semiconductor layer 13. The electrode layer 14 may be an ohmic contact electrode electrically connected to the second conductivity type semiconductor layer 13, but the disclosure is not limited thereto.

As described above, the light emitting element LD may have a core-shell structure with the opposite ends protruding outward, and may include the first conductivity type semiconductor layer 11 provided in the central portion thereof, the active layer 12 which encloses the first conductivity type semiconductor layer 11, and the second conductivity type semiconductor layer 13 which encloses the active layer 12. Furthermore, the light emitting element LD may selectively further include the electrode layer 14 that encloses the second conductivity type semiconductor layer 13. One end or an end of the electrode layer 14 may be disposed on the first end EP1 of the light emitting element LD, and one end or an end of the first conductivity type semiconductor layer 11 may be disposed on the second end EP2 of the light emitting element LD.

The above-described light emitting element LD may be used as a light source in different types of light emitting devices including a pixel. For instance, at least one subminiature light emitting element LD, for example, subminiature light emitting elements LD each having a size ranging from the nanometer scale to the micrometer scale, may be disposed in each pixel area of the display panel to form a light source (or, a light source unit) of the corresponding pixel using the subminiature light emitting elements LD. In an embodiment, each pixel may include at least one rod-type light emitting element LD or at least one core-shell light emitting element LD, or include a combination of the rod-type light emitting element LD and the core-shell light emitting element LD. In an embodiment, each pixel may include other light emitting elements having a type and/or shape different from that of the rod-type light emitting element LD or the core-shell light emitting element LD.

Figure 5:
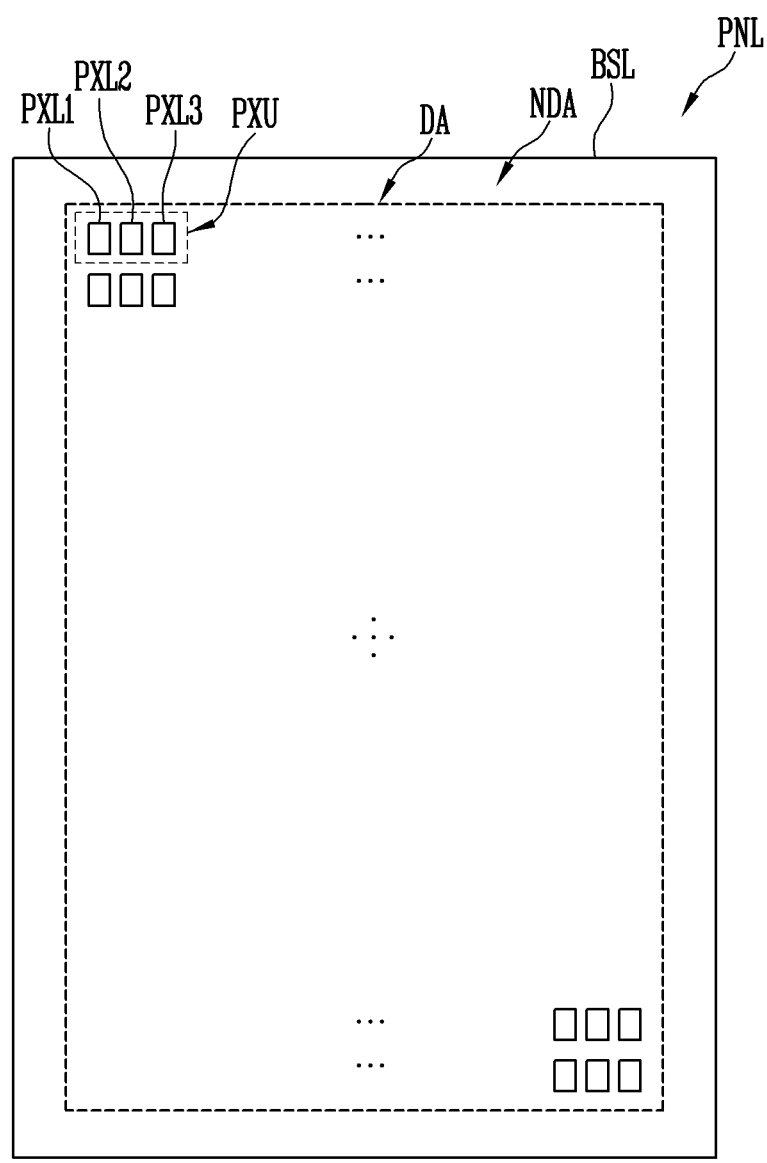
FIG. 5 is a schematic plan view illustrating a display device in accordance with an embodiment.

FIG. 5 is a schematic plan view illustrating a display device in accordance with an embodiment. In an embodiment, FIG. 5 illustrates a display device, for example, a display panel PNL provided in the display device, as an example of a device which may use, as a light source, the light emitting element LD described in the embodiments of FIGS. 1A to 4B. For example, each pixel unit PXU of the display panel PNL and each pixel for forming the pixel unit PXU may include light emitting elements LD. However, the disclosure is not limited thereto. For example, in an embodiment, at least one pixel may include a single light emitting element LD.

For the sake of explanation, FIG. 5 simply illustrates the structure of the display panel PNL in accordance with an embodiment, focusing on a display area DA. In an embodiment, although not illustrated, at least one driving circuit (for example, at least one of a scan driver and a data driver) and/or lines may be further provided in the display panel PNL.

Referring to FIG. 5, the display panel PNL in accordance with an embodiment may include a base layer BSL, and pixels disposed on the base layer BSL. The pixels may include first color pixels PXL1, second color pixels PXL2, and/or third color pixels PXL3. In the following embodiments, the term "pixel PXL" or "pixels PXL" will be used to collectively designate any one pixel or two or more kinds of pixels among the first color pixel PXL1, the second color pixel PXL2, and the third color pixel PXL3.

In detail, the display panel PNL and the base layer BSL for forming the display panel PNL may include a display area DA for displaying an image, and a non-display area NDA other than the display area DA. The pixels PXL may be disposed in the display area DA on the base layer BSL.

In an embodiment, the display area DA may be disposed in a central area of the display panel PNL, and the non-display area NDA may be disposed in a peripheral area of the display panel PNL in such a way as to enclose the display area DA. The locations of the display area DA and the non-display area NDA are not limited thereto, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

One area or an area of the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed around the display area DA. Various lines and/or internal circuits which are connected to the pixels PXL of the display area DA may be disposed in the non-display area NDA.

Pixels PXL are dispersed and disposed in the display area DA. For example, the pixels PXL may be regularly arranged in the display area DA in a stripe or PenTile® arrangement manner or the like within the spirit and the scope of the disclosure. The arrangement structure of the pixels PXL is not limited thereto, and the pixels PXL may be arranged in the display area DA in various structures and/or schemes.

In an embodiment, two or more kinds of pixels PXL which emit different colors of light may be disposed in the display area DA. For example, first color pixels PXL1 to emit a first color of light, second color pixels PXL2 to emit a second color of light, and third color pixels PXL3 to emit a third color of light may be regularly arranged in the display area DA. At least one first color pixel PXL1, at least one second color pixel PXL2, and at least one third color pixel PXL3 that are disposed adjacent to each other may form one pixel unit PXU which may emit different colors of light.

In an embodiment, each first color pixel PXL1 may be a red pixel to emit red light, each second color pixel PXL2 may be a green pixel to emit green light, and each third color pixel PXL3 may be a blue pixel to emit blue light. In an embodiment, the first color pixels PXL1, the second color pixels PXL2, and the third color pixels PXL3 may respectively include, as light sources, a light emitting element LD related to the first color, a light emitting element LD related to the second color, and a light emitting element LD related to the third color, so that the first color pixels PXL1, the second color pixels PXL2, and the third color pixels PXL3 may respectively emit the light of the first color, the light of the second color, and the light of the third color. In an embodiment, the first color pixels PXL1, the second color pixels PXL2, and the third color pixels PXL3 may respectively include light emitting elements LD having the same color, and color filters and/or light conversion layers having different colors may be disposed on the respective light emitting elements LD so that the first color pixels PXL1, the second color pixels PXL2, and the third color pixels PXL3 may respectively emit the light of the first color, the light of the second color, and the light of the third color.

The color, the type, and/or the number of pixels PXL which form each pixel unit PXU is not particularly limited. For example, the color of light emitted from each pixel PXL may be changed in various ways.

Each pixel PXL may include at least one light source which is driven by a control signal (for example, a scan signal and a data signal) and/or a power supply (for example, a first power supply and a second power supply). In an embodiment, each of the pixels PXL may include at least one light emitting element LD in accordance with any one of the embodiments of FIGS. 1A to 3B, for example, at least one subminiature rod-type light emitting element LD having a small size corresponding to the nanometer scale or the micrometer scale. In an embodiment, each of the pixels PXL may include at least one light emitting element LD in accordance with the embodiment of FIGS. 4A and 4B, for example, at least one subminiature core-shell light emitting element LD having a small size corresponding to the nanometer scale or the micrometer scale. Different types of light emitting elements LD may be used as a light source of the pixel PXL.

In an embodiment, each pixel PXL may be formed of an active pixel. However, the types, structures, and/or driving schemes of the pixels PXL capable of being applied to the display device according to the disclosure are not particularly limited. For example, each pixel PXL may have the same structure as that of a pixel for passive or active light emitting display devices which have various structures and/or may be operated in various driving schemes.

FIGS. 6A to 6E are schematic diagrams of an equivalent circuit of a pixel PXL in accordance with an embodiment. For example, FIGS. 6A to 6E illustrate different embodiments of the pixel PXL which can be applied to an active display device. However, the types of pixels PXL and display devices to which embodiments may be applied are not limited thereto.

In an embodiment, the pixel PXL illustrated in FIGS. 6A to 6E may be any one of the first color pixel PXL1, the second color pixel PXL2, and the third color pixel PXL3 which are provided in the display panel PNL of FIG. 5. Furthermore, the first color pixel PXL1, the second color pixel PXL2, and the third color pixel PXL3 may have substantially the same or similar structure.

Figure 6A:
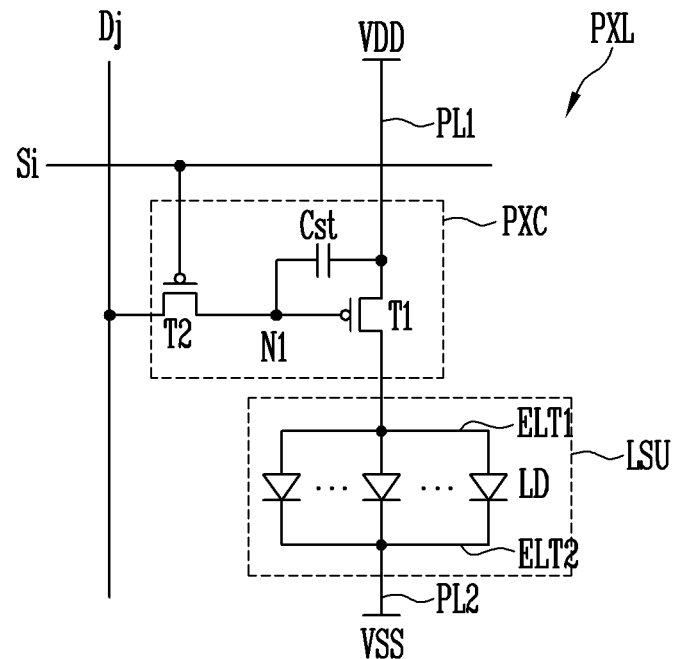
FIGS. 6A to 6E are schematic diagrams of an equivalent circuit of a pixel in accordance with an embodiment.

Referring to FIG. 6A, the pixel PXL in accordance with an embodiment may include a light source unit LSU to generate light having a luminance corresponding to a data signal. The pixel PXL may selectively further include a pixel circuit PXC to drive the light source unit LSU.

The light source unit LSU may include a first electrode ELT (also referred to as "first pixel electrode" or "first alignment electrode"), a second electrode ELT2 (also referred to as "second pixel electrode" or "second alignment electrode"), and at least one light emitting element LD, for example, light emitting elements LD, connected between the first and second electrodes ELT1 and ELT2. In an embodiment, the first electrode ELT1 may be connected to a first power supply VDD through the pixel circuit PXC and a first power line PL1. In other words, the light emitting elements LD may be connected in parallel with each other in an identical direction between the first and second electrodes ELT1 and ELT2. In an embodiment, the first electrode ELT1 may be an anode electrode, and the second electrode ELT2 may be a cathode electrode, but the disclosure is not limited thereto.

Each of the light emitting elements LD may include a P-type end connected to the first power supply VDD through the first electrode ELT1 and/or the pixel circuit PXC, and an N-type end connected to the second power supply VSS through the second electrode ELT2. In other words, the light emitting elements LD may be connected in parallel between the first electrode ELT1 and the second electrode ELT2 in a forward direction. As such, each of the light emitting elements LD connected in a forward direction between the first power supply VDD and the second power supply VSS may form a valid light source. A group of valid light sources may form the light source unit LSU of the pixel PXL.

In an embodiment, the first and second power supplies VDD and VSS may supply voltages having different potentials to make it possible for the light emitting elements LD to emit light. For example, the first power supply VDD may be set as a high-potential power supply, and the second power supply VSS may be set as a low-potential power supply. Here, a difference between the voltages of the first and second power supplies VDD and VSS may be set to a threshold voltage of the light emitting elements LD or more during at least an emission period of the pixel PXL.

In an embodiment, the first ends (for example, the P-type ends) of the light emitting elements LD that form each light source unit LSU may be connected in common to the pixel circuit PXC through one electrode of the light source unit LSU (for example, the first electrode ELT1 of each pixel PXL), and be connected to the first power supply VDD through the pixel circuit PXC and the first power line PL1. The second ends (for example, the N-type ends) of the light emitting elements LD may be connected in common to the second power supply VSS through another electrode of the light source unit LSU (for example, the second electrode ELT2 of each pixel PXL) and the second power line PL2.

The light emitting elements LD of the light source unit LSU may emit light having a luminance corresponding to driving current supplied thereto through the pixel circuit PXC. For example, during each frame period, the pixel circuit PXC may supply, to the light source unit LSU, driving current corresponding to a gray scale value of data of the corresponding frame. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

Although in FIG. 6A illustration of the light source unit LSU is focused on the light emitting elements LD that form each valid light source, the light source unit LSU may further include at least one invalid light source other than the light emitting elements LD in an embodiment. For example, the light source unit LSU may further include at least one light emitting element (hereinafter, referred to as "invalid light source") which may be connected in a reverse direction between the first and second electrodes ELT1 and ELT2 or is incompletely connected between the first and second electrodes ELT1 and ELT2. Even in case that a driving voltage (for example, a forward directional driving voltage) is applied between the first and second electrodes ELT1 and ELT2, each invalid light source remains disabled. Hence, current substantially does not flow through the invalid light source.

The pixel circuit PXC may be connected to a scan line Si and a data line Dj of the corresponding pixel PXL. For example, if the pixel PXL is disposed on an i-th row (i is a natural number) and a j-th column (j is a natural number) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor T1 (also referred to as "driving transistor") may be connected between the first power supply VDD and the light source unit LSU. A gate electrode of the first transistor T1 may be connected to a first node N1. The first transistor T1 may control driving current to be supplied to the light source unit LSU in response to the voltage of the first node N1.

The second transistor T2 (also referred to as "switching transistor") may be connected between the data line Dj and the first node N1. A gate electrode of the second transistor T2 may be connected to the scan line Si. In case that a scan signal having a gate-on voltage (for example, a low level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Thereby, a voltage corresponding to the data signal is charged to the storage capacitor Cst.

One electrode of the storage capacitor Cst may be connected to the first power supply VDD, and the other electrode thereof may be connected to the first node N1. The storage capacitor Cst may charge a voltage corresponding to a data signal to be supplied to the first node N1 during each frame period.

Although in FIG. 6A illustrates the transistors, for example, the first and second transistors T1 and T2, included in the pixel circuit PXC as P-type transistors, the disclosure is not limited thereto. In other words, at least one of the first and second transistors T1 and T2 may be changed to an N-type transistor.

Figure 6B:
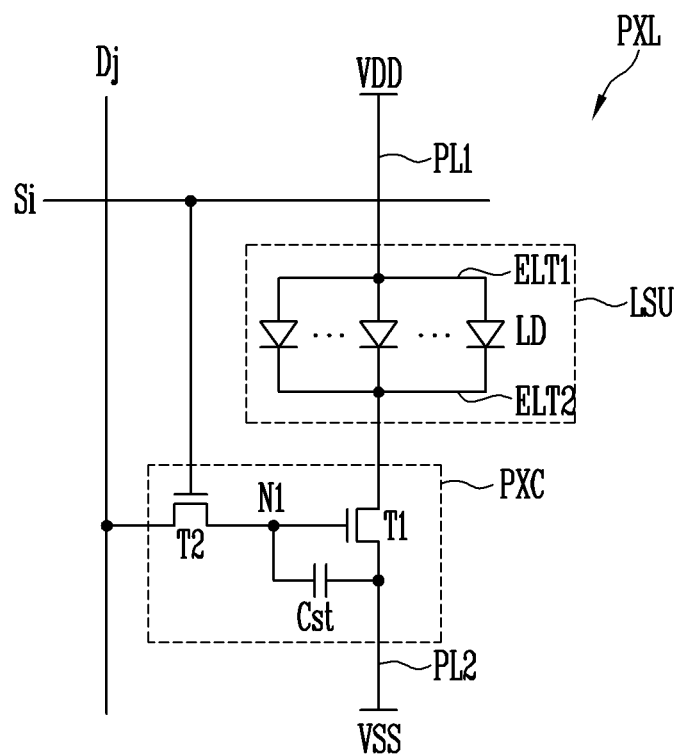

For example, as shown in FIG. 6B, both the first and second transistors T1 and T2 may be formed of N-type transistors. The gate-on voltage of the scan signal for writing the data signal supplied to the data line Dj to the pixel PXL in each frame period may be a high level voltage (also referred to as "gate-high voltage"). Likewise, the voltage of the data signal for turning on the first transistor T1 may be a voltage having a level opposite to that of the embodiment of FIG. 6A. For example, in the embodiment of FIG. 6B, as a grayscale value that is to be expressed increases, a data signal having a higher voltage may be supplied.

In an embodiment, an interconnection position between the pixel circuit PXC and the light source unit LSU may be changed. For example, as illustrated in FIG. 6B, in case that both the first and second transistors T1 and T2 that form the pixel circuit PXC are N-type transistors, the pixel circuit PXC may be connected between the light source unit LSU and the second power supply VSS, and the storage capacitor Cst may be connected between the first node N1 and the second power supply VSS. However, the disclosure is not limited thereto. For example, in an embodiment, even if the pixel circuit PXC is formed of N-type transistors, the pixel circuit PXC may be connected between the first power supply VDD and the light source unit LSU, and the storage capacitor Cst may be connected between the first node N1 and the first power supply VDD.

The pixel PXL shown in FIG. 6B is substantially similar in configuration and operation to the pixel PXL of FIG. 6A, except that the connection positions of some or a part of circuit elements and the voltage levels of control signals (for example, a scan signal and a data signal) are changed depending on a change in type of the transistor. Therefore, detailed descriptions of the pixel PXL of FIG. 6B will be omitted.

The structure of the pixel circuit PXC is not limited to the embodiments shown in FIGS. 6A and 6B. In other words, the pixel circuit PXC may be formed of a pixel circuit which may have various structures and/or be operated by various driving schemes. For example, the pixel circuit PXC may be configured in the same manner as that of an embodiment illustrated in FIG. 6C.

Figure 6C:
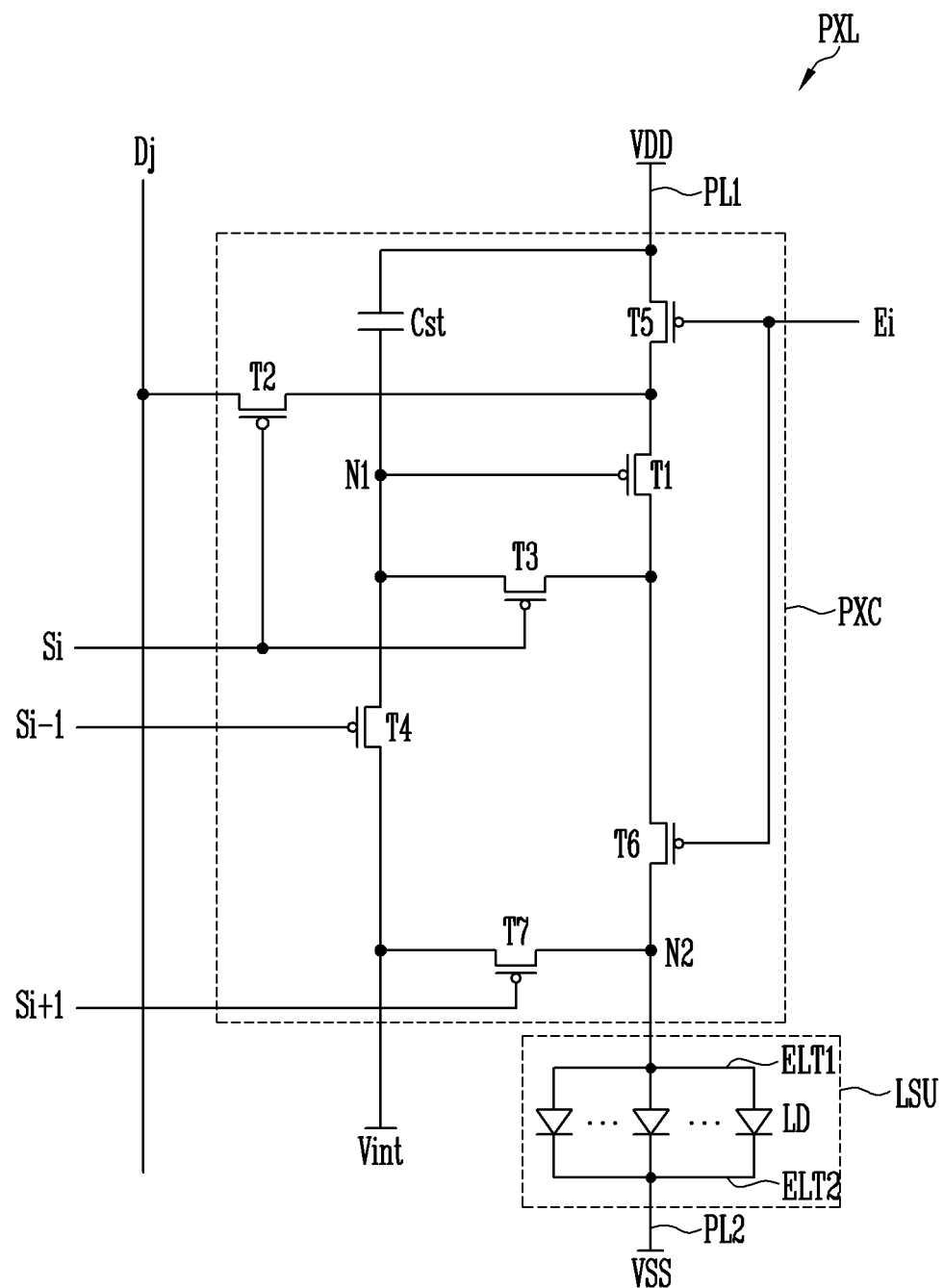

Referring to FIG. 6C, the pixel circuit PXC may be connected not only to a scan line Si of a corresponding horizontal line but also to at least one other scan line (or a control line). For example, the pixel circuit PXC of the pixel PXL disposed in the i-th row of the display area DA may be further connected to an i−1-th scan line Si−1 and/or an i+1-th scan line Si+1. In an embodiment, the pixel circuit PXC may be connected not only to the first and second power supplies VDD and VSS but also to a third power supply. For instance, the pixel circuit PXC may also be connected to an initialization power supply Vint. In an embodiment, the pixel circuit PXC may include first to seventh transistors T1 to T7 and a storage capacitor Cst.

The first transistor T1 may be connected between the first power supply VDD and the light source unit LSU. For example, a first electrode (for example, a source electrode) of the first transistor T1 may be connected to the first power supply VDD via the fifth transistor T5 and the first power line PL1, and a second electrode (for example, a drain electrode) of the first transistor T1 may be connected via the sixth transistor T6 to the first electrode ELT1 (for example, the first pixel electrode of the corresponding pixel PXL) of the light source unit LSU. A gate electrode of the first transistor T1 may be connected to a first node N1. The first transistor T1 may control driving current to be supplied to the light source unit LSU in response to the voltage of the first node N1.

The second transistor T2 may be connected between the data line Dj and the first electrode of the first transistor T1. A gate electrode of the second transistor T2 may be connected to the corresponding scan line Si. In case that a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be connected between the other electrode of the first transistor T1 and the first node N1. A gate electrode of the third transistor T3 may be connected to the corresponding scan line Si. In case that a scan signal having a gate-on voltage is supplied from the scan line Si, the third transistor T3 may be turned on to connect the first transistor T1 in the form of a diode.

The fourth transistor T4 may be connected between the first node N1 and the initialization power supply Vint. A gate electrode of the fourth transistor T4 may be connected to a preceding scan line, for example, an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. In an embodiment, in case that the first transistor T1 is a P-type transistor, the voltage of the initialization power supply Vint for initializing the gate voltage of the first transistor T1 may be equal to the lowest voltage of the data signal or less.

The fifth transistor T5 may be connected between the first power supply VDD and the first transistor T1. A gate electrode of the fifth transistor T5 may be connected to a corresponding emission control line, for example, an i-th emission control line Ei. The fifth transistor T5 may be turned off in case that an emission control signal having a gate-off voltage (for example, a high level voltage) is supplied to the emission control line Ei, and may be turned on in other cases.

The sixth transistor T6 may be connected between the first transistor T1 and the light source unit LSU. A gate electrode of the sixth transistor T6 may be connected to a corresponding emission control line, for example, the i-th emission control line Ei. The sixth transistor T6 may be turned off in case that an emission control signal having a gate-off voltage is supplied to the emission control line Ei, and may be turned on in other cases.

The seventh transistor T7 may be connected between a second node N2 and the first electrode ELT1 of the light source unit LSU and the initialization power supply Vint. A gate electrode of the seventh transistor T7 may be connected to any one of scan lines of a subsequent stage (a subsequent horizontal pixel column), for example, to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first electrode ELT1 of the light source unit LSU. During each initialization period in which the voltage of the initialization power supply Vint is transmitted to the light source unit LSU, the voltage of the first electrode ELT1 of the light source unit LSU may be initialized. The control signal for controlling the operation of the seventh transistor T7 may be changed in various ways. For example, in an embodiment, the gate electrode of the seventh transistor T7 may be connected to a scan line of a corresponding horizontal line, for example, an i-th scan line Si. In case that a scan signal having a gate-on voltage is supplied to the i-th scan line Si, the seventh transistor T7 may be turned on so that the voltage of the initialization power supply Vint may be supplied to the first electrode ELT1 of the light source unit LSU.

The storage capacitor Cst may be connected between the first power supply VDD and the first node N1. The storage capacitor Cst may store a voltage corresponding both to the data signal applied to the first node N1 and to the threshold voltage of the first transistor T1 during each frame period.

Although in FIG. 6C the transistors, for example, the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

Figure 6D:
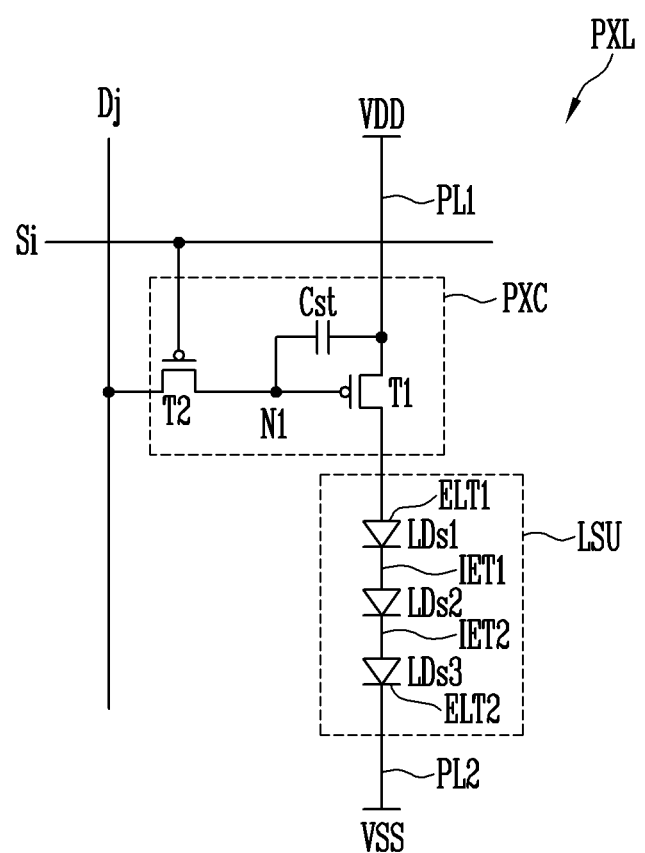
Figure 6E:
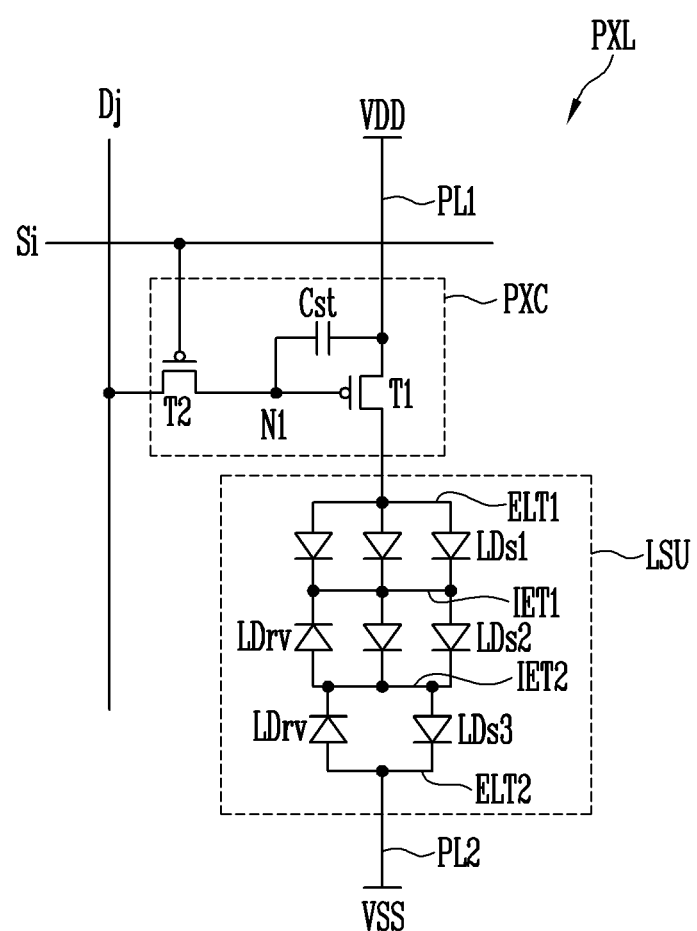

Although FIGS. 6A to 6C illustrate embodiments in which all valid light sources, for example, normal-direction light emitting elements LD, constituting each light source unit LSU are connected in parallel to each other, the disclosure is not limited thereto. For example, in an embodiment, as illustrated in FIGS. 6D and 6E, the light source unit LSU of each pixel PXL may include a serial structure. In the following descriptions of embodiments of FIGS. 6D and 6E, detailed descriptions of components (for example, the pixel circuit PXC) similar or equal to that of the embodiments of FIGS. 6A to 6C will be omitted.

Referring to FIG. 6D, the light source unit LSU may include at least two light emitting elements connected in series to each other. For example, the light source unit LSU may include a first stage light emitting element LDs1, a second stage light emitting element LDs2, and a third stage light emitting element LDs3 which are connected in series in a forward direction between the first power supply VDD and the second power supply VSS and thus form each valid light source. Hereinafter, in case that a specific or given light emitting element among the first, second, and third stage light emitting elements LDs1, LDs2, and LDs3 is designated, the corresponding light emitting element will be referred to as "first stage light emitting element LDs1", "second stage light emitting element LDs2", or "third stage light emitting element LDs3". The term "light emitting element LD" or "light emitting elements LD" will be used to arbitrarily designate at least one light emitting element of the first, second, and third stage light emitting elements LDs1, LDs2, and LDs3 or collectively designate the first, second, and third light stage emitting elements LDs1, LDs2, and LDs3.

The P-type end of the first stage light emitting element LDs1 may be connected to the first power supply VDD through the first electrode ELT1 of the light source unit LSU, the pixel circuit PXC, and/or the first power line PL1. The N-type end of the first stage light emitting element LDs1 may be connected to the P-type end of the second stage light emitting element LDs2 through a first intermediate electrode IET1. The P-type end of the second stage light emitting element LDs2 may be connected to the N-type end of the first stage light emitting element LDs1. The N-type end of the second stage light emitting element LDs2 may be connected to the P-type end of the third stage light emitting element LDs3 through a second intermediate electrode IET2. The P-type end of the third stage light emitting element LDs3 may be connected to the N-type end of the second stage light emitting element LDs2. The N-type end of the third stage light emitting element LDs3 may be connected to the second power supply VSS through the second electrode ELT2 of the light source unit LSU and the second power line PL2. In this way, the first, second, and third stage light emitting elements LDs1, LDs2, and LDs3 may be successively connected in series between the first electrode ELT1 and the second electrode ELT2 of the light source unit LSU.

Although in FIG. 6D there is illustrated an embodiment where the light emitting elements LD are connected to have a three-stage serial structure, the disclosure is not limited thereto. For example, in an embodiment, two light emitting elements LD may be connected to have a two-stage serial structure, or four or more light emitting elements LD may be connected to have a four- or more-stage serial structure.

In case that it is assumed that the same luminance is expressed using light emitting elements LD having the same conditions (for example, the same size and/or number), in a light source unit LSU having a structure in which light emitting elements LD are connected in series, the voltage to be applied between the first and second electrodes ELT1 and ELT2 may be increased, and the amount of driving current flowing to the light source unit LSU may be reduced, compared to a light source unit LSU having a structure in which light emitting elements LD are connected in parallel. Therefore, in the case where the serial connection structure of the light emitting elements LD is used to form the light source unit LSU of each pixel PXL, panel current flowing through the display panel PNL may be reduced as the display device is driven.

In an embodiment, at least one serial stage may include light emitting elements LD connected in parallel to each other. The light source unit LSU may be formed of a serial/parallel combination structure. For example, the light source unit LSU may be as illustrated in the embodiment of FIG. 6E.

Referring to FIG. 6E, at least one serial stage that forms the light source unit LSU may include light emitting elements LD connected in parallel to each other in the forward direction. For example, the light source unit LSU may include first stage light emitting elements LDs1 disposed in a first serial stage (also referred to as "first stage" or "first row"), second stage light emitting elements LDs2 disposed in a second serial stage (also referred to as "second stage" or "second row") subsequent to the first serial stage, and at least one third stage light emitting element LDs3 disposed in a third serial stage (also referred to as "third stage" or "third row") subsequent to the second serial stage.

Although in FIG. 6E there has been illustrated the light source unit LSU formed of light emitting elements LD disposed in three serial stages, the disclosure is not limited thereto. For example, the light source unit LSU may include light emitting elements LD disposed in only two serial stages, or light emitting elements LD dispersed in four or more serial stages. Furthermore, the number of light emitting elements LD connected in the forward direction in each serial stage may be one or more and be changed to various values. In an embodiment, the numbers of light emitting elements LD included in the pixels PXL disposed in the display area (DA of FIG. 5) may be identical or similar to each other. For example, at the step of supplying light emitting elements LD to each pixel area (for example, the emission area of each pixel PXL) for forming each pixel PXL, light emitting element ink (also referred to as "light emitting element solution") including the light emitting elements LD may be controlled to be uniformly applied to the emission area of each pixel PXL, and an electric field may be controlled to be applied to each pixel PXL under identical conditions, so that the light emitting elements LD may be aligned. Hence, the pixels PXL may be formed such that the pixels PXL include an identical or similar number of light emitting elements LD, whereby emission characteristics of the respective pixels PXL may be uniform.

In an embodiment, each pixel PXL may further include at least one reverse light emitting element LDrv disposed in at least one serial stage. For example, at least one of serial stages may further include at least one reverse light emitting element LDrv connected in a direction opposite to that of the light emitting elements LD.

Even in case that the reverse light emitting element LDrv may be connected to at least one serial stage, the driving current of the pixel PXL may flow successively via the serial stages if at least one valid light source (for example, the first, second, and/or third stage light emitting elements LDs1, LDs2, and LDs3) connected in the forward direction to the serial stage is disposed. Hence, the light source unit LSU may emit light at a luminance corresponding to the driving current.

As described in the foregoing embodiments, each light source unit LSU may include light emitting elements LD which are connected in the forward direction between the first power supply VDD and the second power supply VSS and form respective valid light sources. Furthermore, the connection structure between the light emitting elements LD may be changed in various ways depending on embodiments. For example, the light emitting elements LD may be connected only in series or parallel to each other, or in a series/parallel combination structure.

As described above, the pixel PXL may include a pixel circuit PXC and/or a light source unit LSU which may have various structures. The structure of the pixel PXL which may be applied to the disclosure is not limited to the embodiments illustrated in FIGS. 6A to 6E, and each pixel PXL may have various structures. For example, the pixel circuit PXC included in each pixel PXL may be formed of a pixel circuit which may have various structures and/or be operated by various driving schemes. In an embodiment, each pixel PXL may be a passive light emitting display device, or the like within the spirit and the scope of the disclosure. The pixel circuit PXC may be omitted, and each of the first and second electrodes ELT1 and ELT2 may be connected to or directly connected to the scan line Si, the data line Dj, a power line, and/or a control line.

Figure 7:
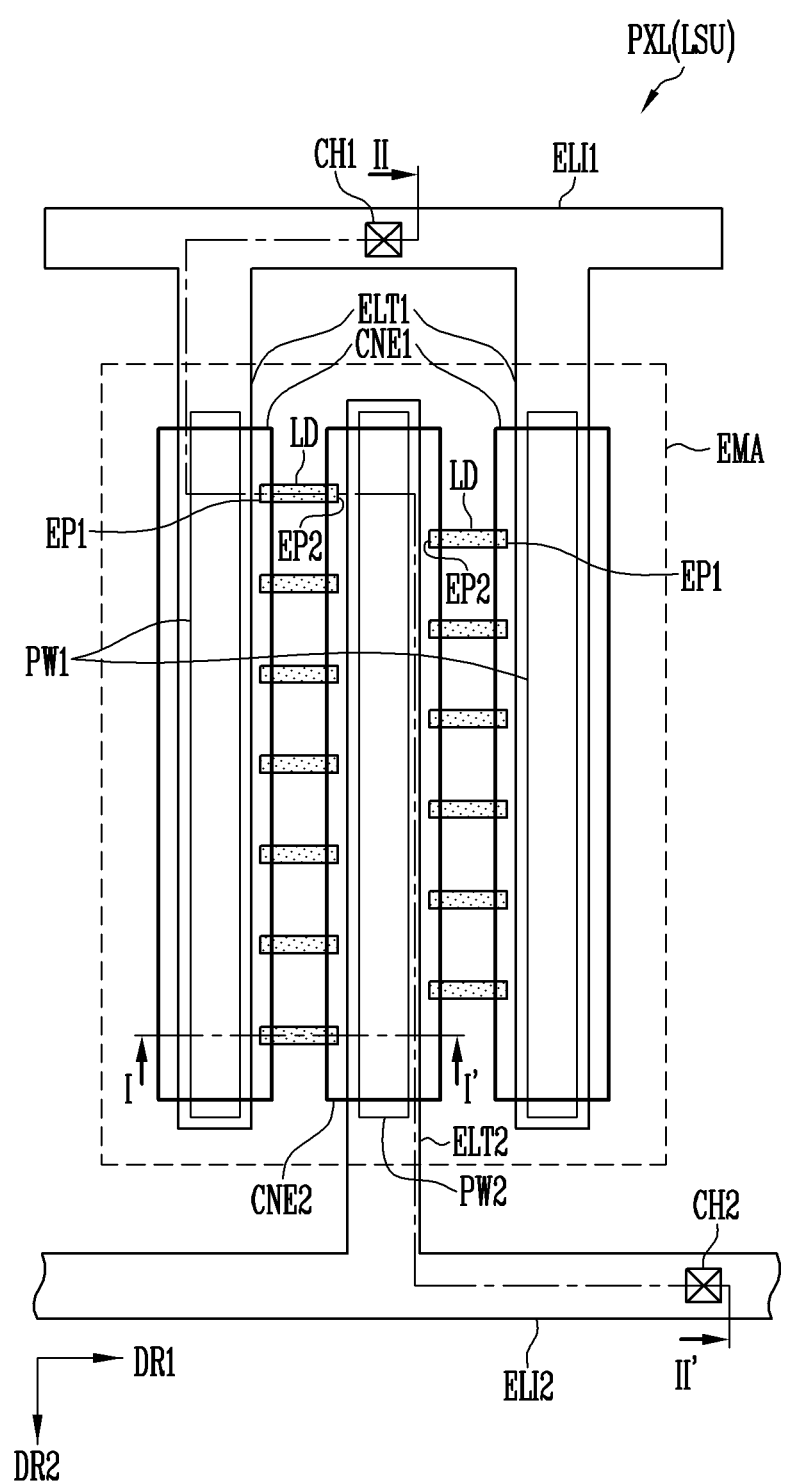
FIG. 7 is a schematic plan view illustrating a pixel in accordance with an embodiment.

FIG. 7 is a schematic plan view illustrating a pixel PXL in accordance with an embodiment. In an embodiment, FIG. 7 illustrates the structure of the pixel PXL, centered on the light source unit LSU of the pixel PXL. In an embodiment, each pixel PXL may selectively further include circuit elements (for example, circuit elements that form each pixel circuit PXC) connected to the light source unit LSU.

In an embodiment, the pixel PXL shown in FIG. 7 may be any one of the pixels PXL illustrated in FIGS. 5 to 6E, but the disclosure is not limited thereto. For example, each pixel PXL illustrated in FIG. 7 may be a pixel PXL including a light source unit LSU having a parallel structure, as shown in the embodiments of FIGS. 6A to 6C. However, the disclosure is not limited thereto. For example, in an embodiment, the light source unit LSU having a serial/parallel combination structure may be formed by changing the disposition and/or connection structure, for example, of the electrodes and the light emitting elements LD that form each light source unit LSU. As an example, in an embodiment, at least one pixel PXL disposed in the display area DA may include only one light emitting element LD connected in the forward direction between the first electrode ELT1 and the second electrode ELT2.

Furthermore, FIG. 7 illustrates an embodiment in which each light source unit LSU may be connected, through first and second contact holes CH1 and CH2, to a power line (for example, first and/or second power lines PL1 and/or PL2), a circuit element (for example, at least one circuit element that forms the pixel circuit PXC), and/or a signal line (for example, a scan line Si and/or a data line Dj), but the disclosure is not limited thereto. For example, in an embodiment, at least one of the first and second electrodes ELT1 and ELT2 of each pixel PXL may be connected to or directly connected to a power line and/or signal line without using a contact hole and/or an intermediate line.

Referring to FIGS. 5 to 7, the pixel PXL in accordance with an embodiment may include a first electrode ELT1 and a second electrode ELT2 which are disposed in each emission area EMA, and at least one light emitting element LD arranged between the first and second electrodes ELT1 and ELT2 (for example, light emitting elements LD connected in parallel between the first and second electrodes ELT1 and ELT2). Furthermore, the pixel PXL may selectively further include at least one of a first electrode line ELI1 (also referred to as "first connection electrode" or "first alignment line") and a first contact hole CH1 which are provided to connect the first electrode ELT1 to the first power line PL1, a second electrode line ELI2 (also referred to as "second connection electrode" or "second alignment line") and a second contact hole CH2 which are provided to connect the second electrode ELT2 to the second power line PL2, a first partition wall (or first bank pattern) PW1 and a second partition wall (or second bank pattern) PW2 which respectively overlap the first electrode ELT1 and the second electrode ELT2, and a first contact electrode CNE1 (also referred to as "third electrode") and a second contact electrode CNE2 (also referred to as "fourth electrode") which are provided to electrically connect the light emitting elements LD between the first and second electrodes ELT1 and ELT2. In an embodiment, the first and second partition walls PW1 and PW2, the first and second electrodes ELT1 and ELT2, the light emitting elements LD, and/or the first and second contact electrodes CNE1 and CNE2, for example, may form a light source unit LSU of the pixel PXL in accordance with an embodiment.

The first electrode ELT1 and the second electrode ELT2 may be disposed, at positions spaced apart from each other, in each pixel area in which the corresponding pixel PXL is provided and/or formed, and for example, may be disposed in the emission area EMA of the corresponding pixel PXL. In an embodiment, each pixel area may comprehensively mean a pixel circuit area in which circuit elements for forming the corresponding pixel PXL are disposed, and an emission area EMA in which the light source unit LSU of the pixel PXL is disposed. The emission area EMA may be an area in which light emitting elements LD (for example, valid light sources validly connected between the first and second electrodes ELT1 and ELT2) that form the light source unit LSU of each pixel PXL are disposed. Furthermore, electrodes connected to the light emitting elements LD (for example, the first and second electrodes ELT1 and ELT2 and/or the first and second contact electrodes CNE1 and CNE2) or areas of the electrodes may be disposed in the emission area EMA. The emission area EMA may be enclosed by a light shielding and/or reflective bank (also referred to as "pixel defining layer") which is formed between the pixels PXL to define each pixel area and the emission area EMA formed in the pixel area. For example, a bank which encloses the emission area EMA may be disposed around the emission area EMA.

In an embodiment, the first and second electrodes ELT1 and ELT2 may be spaced apart from each other. For example, the first and second electrodes ELT1 and ELT2 may be disposed in parallel in each emission area EMA at positions spaced apart from each other by a distance in a first direction DR1.

In an embodiment, each of the first and second electrodes ELT1 and ELT2 may have a bar shape extending in any one direction. For example, each of the first and second electrodes ELT1 and ELT2 may have a bar shape extending in the second direction DR2 intersecting with (for example, perpendicular to) the first direction DR1. However, the disclosure is not limited thereto. For example, the shapes, the orientations, and/or the relative disposition relationship of the first and second electrodes ELT1 and ELT2 may be changed in various ways.

Furthermore, one or more first and second electrodes ELT1 and ELT2 may be disposed in each emission area EMA, and the numbers of first and second electrodes ELT1 and ELT2 disposed in the emission area EMA are not particularly limited. For example, first electrodes ELT1 which extend in the second direction DR2 and are parallel to each other may be disposed in each emission area EMA. Facing each first electrode ELT1, at least one second electrode ELT2 may be disposed in each emission area EMA. For example, in each emission area EMA, one second electrode ELT2 may be disposed between two first electrodes ELT1, and second electrodes ELT2 may be respectively disposed to correspond to the first electrodes ELT1.

In an embodiment, the first electrode ELT1 may be electrically connected to a circuit element (for example, at least one transistor that forms the pixel circuit PXC), a power line (for example, the first power line PL1), and/or a signal line (for example, a scan line Si, a data line Dj, or a control line) through the first electrode line ELI1 and/or the first contact hole CH1. In an embodiment, the first electrode ELT1 may be electrically connected to a circuit element disposed therebelow through the first electrode line ELI1 and the first contact hole CH1, and be electrically connected to a first line through the circuit element. The first line may be the first power line PL1 for supply the voltage of the first power supply VDD, but the disclosure is not limited thereto. For example, in an embodiment, the first line may be a signal line through which a first driving signal (for example, a scan signal, a data signal, or a control signal) may be supplied.

As an example, in an embodiment, the first electrode ELT1 may be connected to or directly connected to a power line or signal line without passing through the first electrode line ELI1, the first contact hole CH1, and/or the circuit element. The first electrode ELT1 may be integrally or non-integrally connected to the power line or the signal line.

In an embodiment, the first electrode ELT1 and the first electrode line ELI1 may extend in different directions in each pixel area. For example, in case that the first electrode line ELI1 extends in the first direction DR1, the first electrode ELT1 may extend in the second direction DR2 intersecting with the first direction DR1.

In an embodiment, the first electrode ELT1 and the first electrode line ELI1 may be integrally connected with each other. For instance, the first electrode ELT1 may diverge in at least one way from the first electrode line ELI1. In the case where the first electrode ELT1 and the first electrode line ELI1 are integrally connected with each other, the first electrode line ELI1 may be regarded as an area of the first electrode ELT1. However, the disclosure is not limited thereto. For example, in an embodiment, the first electrode ELT1 and the first electrode line ELI1 may be formed separately from each other, and connected to each other through at least one contact hole, via hole, or the like within the spirit and the scope of the disclosure.

In an embodiment, the second electrode ELT2 may be electrically connected to a circuit element (for example, at least one transistor that forms the pixel circuit PXC), a power line (for example, the second power line PL2), and/or a signal line (for example, a scan line Si, a data line Dj, or a control line) through the second electrode line ELI2 and/or the second contact hole CH2. For example, the second electrode ELT2 may be electrically connected, through the second electrode line ELI2 and the second contact hole CH2, to a second line disposed thereunder. The second line may be the second power line PL2 for supply the voltage of the second power supply VSS, but the disclosure is not limited thereto. For example, in an embodiment, the second line may be a signal line through which a second driving signal (for example, a scan signal, a data signal, or a control signal) is supplied.

In an embodiment, the second electrode ELT2 may be connected to or directly connected to a power line or signal line without passing through the second electrode line ELI2 and/or the second contact hole CH2. The second electrode ELT2 may be integrally or non-integrally connected to the power line or the signal line.

In an embodiment, the second electrode ELT2 and the second electrode line ELI2 may extend in different directions. For example, in case that the second electrode line ELI2 extends in the first direction DR1, the second electrode ELT2 may extend in the second direction DR2 intersecting with the first direction DR1.

In an embodiment, the second electrode ELT2 and the second electrode line ELI2 may be integrally connected with each other. For instance, the second electrode ELT2 may diverge in at least one way from the second electrode line ELI2. In the case where the second electrode ELT2 and the second electrode line ELI2 are integrally connected with each other, the second electrode line ELI2 may be regarded as an area of the second electrode ELT2. However, the disclosure is not limited thereto. For example, in an embodiment, the second electrode ELT2 and the second electrode line ELI2 may be formed separately from each other, and connected to each other through at least one contact hole, via hole, or the like within the spirit and the scope of the disclosure.

Here, during a process of forming the pixel PXL, for example, before the alignment of the light emitting elements LD is completed, the first electrodes ELT1 of the pixels PXL disposed in the display area DA may be connected to each other, and the second electrodes ELT2 of the pixels PXL may be connected to each other. The first and second electrodes ELT1 and ELT2 may be respectively supplied with a first alignment signal (or a first alignment voltage) and a second alignment signal (or a second alignment voltage) at the step of aligning the light emitting elements LD. For example, any one of the first and second electrodes ELT1 and ELT2 may be supplied with an AC alignment signal, and the other one of the first and second electrodes ELT1 and ELT2 may be supplied with an alignment voltage having a constant voltage level (for example, a ground voltage).

In other words, at the step of aligning the light emitting elements LD, alignment signals may be applied to the first and second electrodes ELT1 and ELT2, so that an electric field may be formed between the first and second electrodes ELT1 and ELT2. The light emitting elements LD supplied to each pixel area, for example, the emission area EMA of each pixel PXL, may be self-aligned between the first and second electrodes ELT1 and ELT2 by the electric field. After the alignment of the light emitting elements LD has been completed, connection between the first electrodes ELT1 and/or connection of the second electrodes ELT2 may be disconnected between the pixel PXL so that the pixels PXL can be individually driven.

Each of the first and second electrodes ELT1 and ELT2 may have a single-layer or multi-layer structure. For example, each first electrode ELT1 may include at least one reflective electrode layer, and selectively further include at least one transparent electrode layer and/or a conductive capping layer. Likewise, each second electrode ELT2 may include at least one reflective electrode layer, and selectively further include at least one transparent electrode layer and/or a conductive capping layer.

The first partition wall PW1 may be disposed under or below each first electrode ELT1 to overlap the first electrode ELT1. For example, the first partition wall PW1 may have a width less than that of each first electrode ELT1 and be disposed under or below the first electrode ELT1. If the first partition wall PW1 is disposed under or below the first electrode ELT1, the first electrode ELT1 may protrude upward in the area in which the first partition wall PW1 is disposed. The first partition wall PW1 along with the first electrode ELT1 may form a reflective partition wall. Therefore, light emitted from the first ends EP1 of the light emitting elements LD that face the first electrode ELT1 may be controlled to more effectively travel in the frontal direction of the display device.

The second partition wall PW2 may be disposed under or below the second electrode ELT2 to overlap an area of the second electrode ELT2. For example, the second partition wall PW2 may have a width less than that of the second electrode ELT2 and be disposed under or below the second electrode ELT2. If the second partition wall PW2 is disposed under or below the second electrode ELT2, the second electrode ELT2 may protrude upward in the area in which the second partition wall PW2 is disposed. The second partition wall PW2 along with the second electrode ELT2 may form a reflective partition wall. Therefore, light emitted from the second ends EP2 of the light emitting elements LD that face the second electrode ELT2 may be controlled to more effectively travel in the frontal direction of the display device.

The light emitting elements LD may be disposed in parallel between the first electrode ELT1 and the second electrode ELT2. For example, each light emitting element LD may be disposed in the first direction DR1 (for example, in a horizontal direction) between the first electrode ELT1 and the second electrode ELT2 and be electrically connected between the first and second electrodes ELT1 and ELT2.

Although FIG. 7 illustrates that the light emitting elements LD are uniformly oriented in any one direction, for example, in the first direction DR1, the disclosure is not limited thereto. For example, at least one of the light emitting elements LD may be oriented in a diagonal direction between the first and second electrodes ELT1 and ELT2.

Although not illustrated in FIG. 7, at least one light emitting element (for example, an invalid light source) that is incompletely connected between the first and second electrodes ELT1 and ELT2 may be further disposed in each emission area EMA and/or a peripheral area thereof.

In an embodiment, each of the light emitting elements LD may be a light emitting element which is made of material having an inorganic crystal structure and has a subminiature size, for example, a size ranging from the nanometer scale to the micrometer scale. For example, each light emitting element LD may be a subminiature light emitting element having a size ranging from the nanometer scale to the micrometer scale, as illustrated in FIGS. 1A to 4B. However, the type and/or size of the light emitting element LD may be changed in various ways depending on design conditions, for example, of each light emitting device, for example, the pixel PXL, using the light emitting element LD as a light source.

In an embodiment, each light emitting element LD may include a first end EP1 disposed to face the adjacent first electrode ELT1, and a second end EP2 disposed to face the adjacent second electrode ELT2. In an embodiment, each of the light emitting elements LD may overlap the adjacent first electrode ELT1 and/or second electrode ELT2, or may not overlap the adjacent first electrode ELT1 and/or second electrode ELT2. For example, the first end EP1 of the light emitting element LD may overlap the adjacent first electrode ELT1 or may not overlap therewith. Likewise, the second end EP2 of the light emitting element LD may overlap the adjacent second electrode ELT2 or may not overlap therewith.

In an embodiment, the respective first ends EP1 of the light emitting elements LD may be connected to the first electrode ELT1. The respective second ends EP2 of the light emitting elements LD may be connected to the second electrode ELT2. For example, the respective first ends EP1 of the light emitting elements LD may be electrically connected to the first electrode ELT1 via the first contact electrode CNE1. The respective second ends EP2 of the light emitting elements LD may be electrically connected to the second electrode ELT2 via the second contact electrode CNE2. In an embodiment, at least one of the first and second ends EP1 and EP2 of each of the light emitting elements LD may contact or directly contact the first and/or second electrodes ELT1 and/or ELT2 and be electrically connected to the first and/or second electrodes ELT1 and/or ELT2. The first contact electrode CNE1 and/or the second contact electrode CNE2 may be selectively omitted.

In an embodiment, the light emitting elements LD may be prepared in a diffused form in a solution, and supplied to each pixel area (for example, the emission area EMA of each pixel PXL) by various methods such as an inkjet scheme or a slit coating scheme. For example, the light emitting elements LD may be mixed with a volatile solvent and supplied to the emission area EMA of each pixel PXL. Here, if alignment voltages (or alignment signals) are applied to the first and second electrodes ELT1 and ELT2 of the pixels PXL, an electric field is formed between the first and second electrodes ELT1 and ELT2, whereby the light emitting elements LD may be aligned between the first and second electrodes ELT1 and ELT2. After the light emitting elements LD have been aligned, the solvent may be removed by a volatilization method or other methods. In this way, the light emitting elements LD may be reliably disposed between the first and second electrodes ELT1 and ELT2. Furthermore, the first contact electrode CNE1 and the second contact electrode CNE2 may be respectively formed on the opposite ends of the light emitting elements LD, for example, the first and second ends EP1 and EP2. The light emitting elements LD may be more reliably connected between the first and second electrodes ELT1 and ELT2.

For example, the first contact electrode CNE1 may be disposed on each corresponding first electrode ELT1 and the first ends EP1 of the light emitting elements LD adjacent thereto such that the first contact electrode CNE1 overlaps the first electrode ELT1 and the first ends EP1 of the light emitting elements LD. The first contact electrode CNE1 may electrically connect the first electrode ELT1 with the first ends EP1 of the light emitting elements LD. Furthermore, the first contact electrode CNE1 may reliably fix the first ends EP1 of the light emitting elements LD, so that the light emitting elements LD may be prevented from being removed from the aligned positions. In an embodiment, in the case where the first contact electrode CNE1 is not formed, the first ends EP1 of the light emitting elements LD may be disposed to overlap the adjacent first electrode ELT1 and be connected to or directly connected to the first electrode ELT1.

The second contact electrode CNE2 may be disposed on each corresponding second electrode ELT2 and the second ends EP2 of the light emitting elements LD adjacent thereto such that the second contact electrode CNE2 overlaps the second electrode ELT2 and the second ends EP2 of the light emitting elements LD. The second contact electrode CNE2 may electrically connect the second electrode ELT2 with the second ends EP2 of the light emitting elements LD. Furthermore, the second contact electrode CNE2 may stably fix the second ends EP2 of the light emitting elements LD, so that the light emitting elements LD may be prevented from being removed from the aligned positions. In an embodiment, in the case where the second contact electrode CNE2 is not formed, the second ends EP2 of the light emitting elements LD may be disposed to overlap the adjacent second electrode ELT2 and be connected to or directly connected to the second electrode ELT2.

Each light emitting element LD connected between the first and second electrodes ELT1 and ELT2 in the forward direction may form a valid light source of the corresponding pixel PXL. Such valid light sources may be collected to form the light source unit LSU of the corresponding pixel PXL.

For example, in case that the voltage of the first power supply VDD (or, a first control signal such as a scan signal or a data signal) is applied to the first ends EP1 of the light emitting elements LD via the first power line PL1, the first electrode ELT1, and/or the first contact electrode CNE1, and the voltage of the second power supply VS S (or a second control signal such as a scan signal or a data signal) is applied to the second ends EP2 of the light emitting elements LD via the second power line PL2, the second electrode ELT2, and/or the second contact electrode CNE2, at least one light emitting element LD that may be connected in the forward direction between the first and second electrodes ELT1 and ELT2 may emit light. Thereby, the pixel PXL may emit light.

Figure 8A:
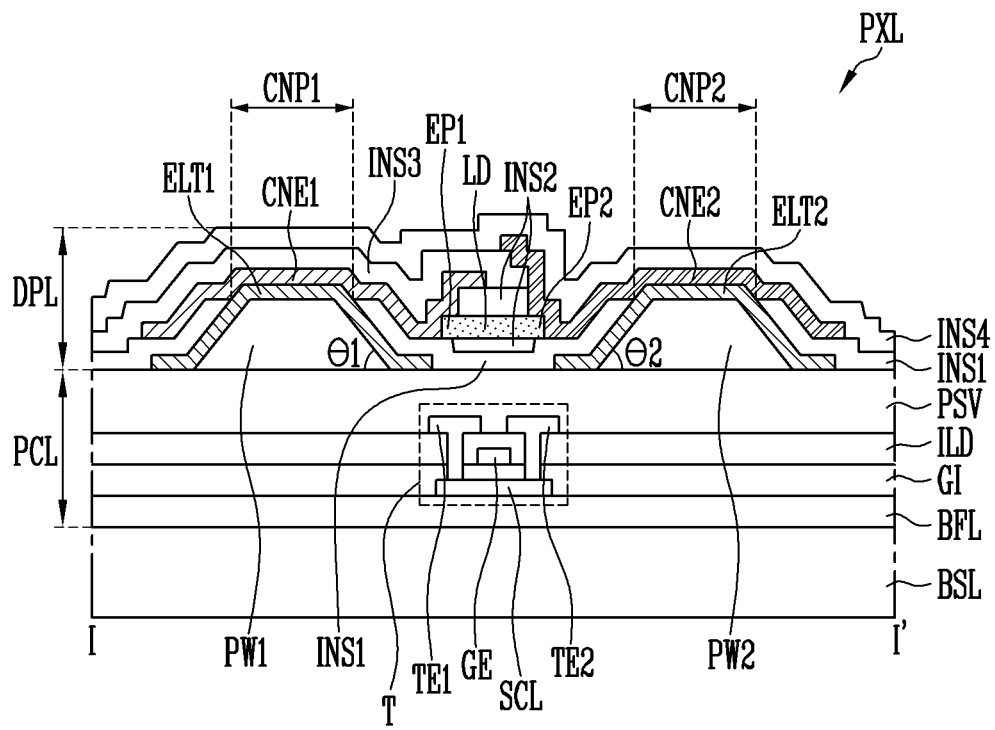
FIGS. 8A and 8B are schematic cross-sectional views each illustrating a pixel in accordance with an embodiment.
Figure 8B:
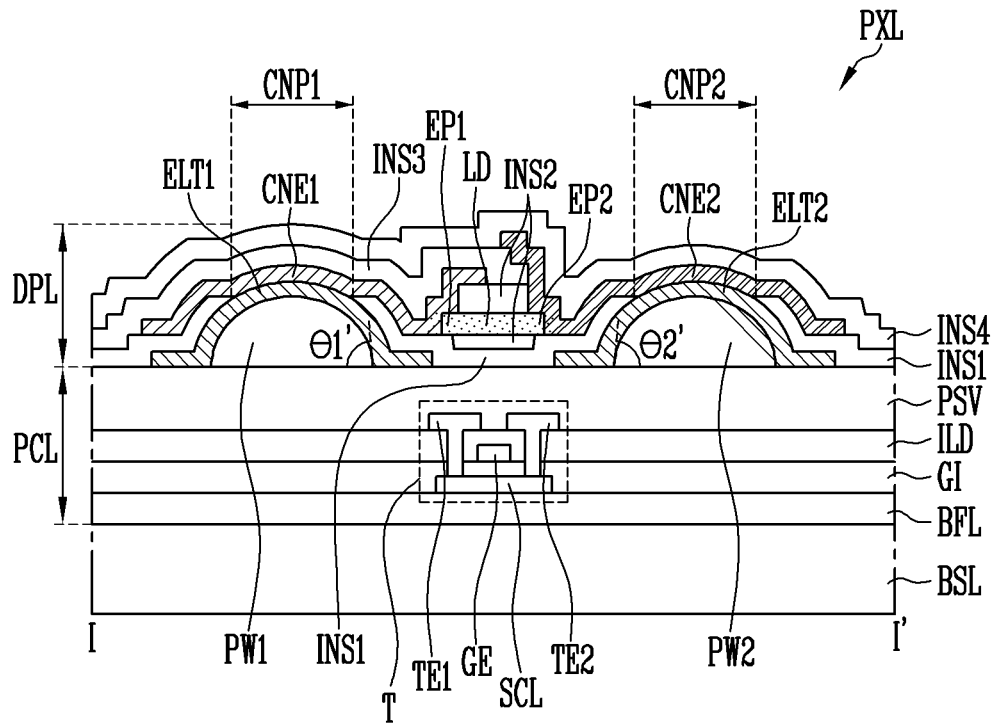
Figure 9:
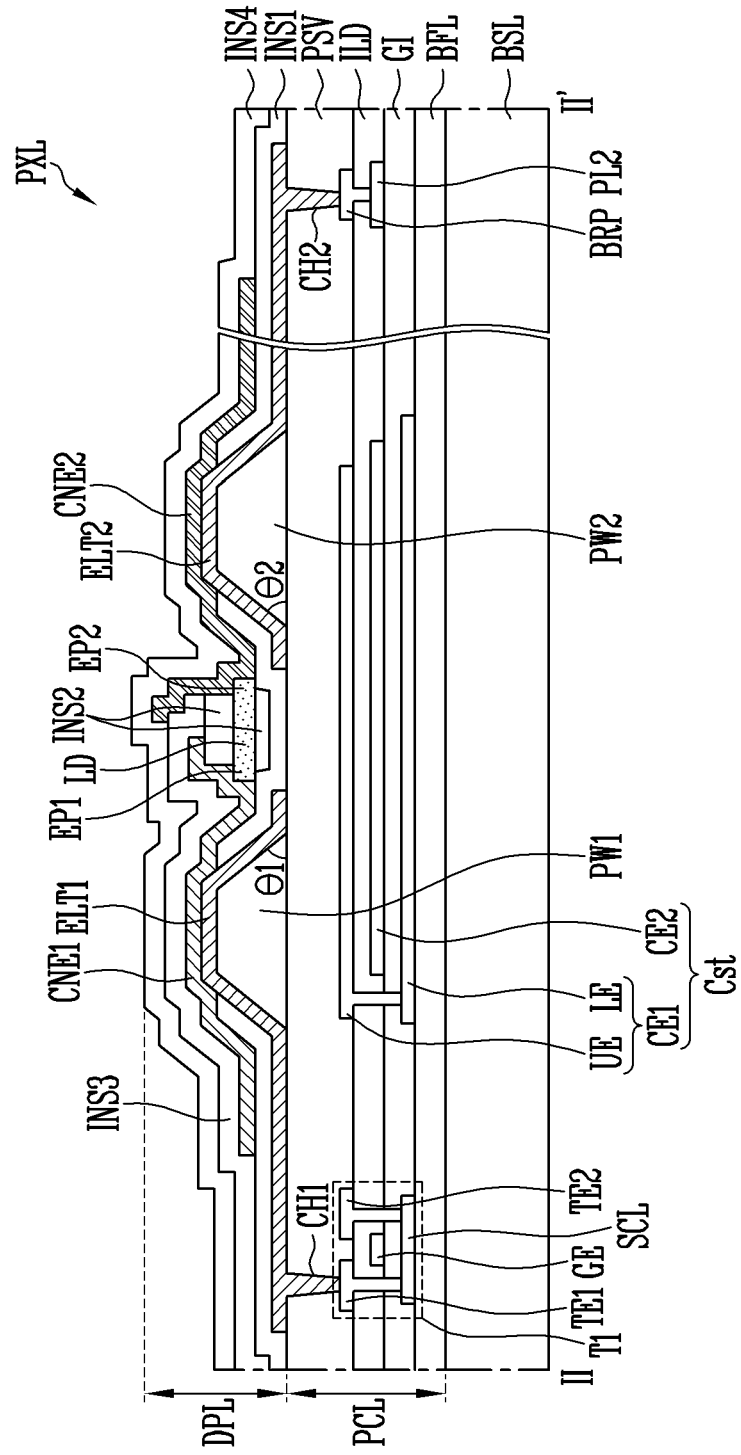
FIG. 9 is a schematic cross-sectional view illustrating a pixel in accordance with an embodiment.

FIGS. 8A, 8B, and 9 are schematic cross-sectional views each illustrating a pixel PXL in accordance with an embodiment. For example, FIGS. 8A and 8B illustrate different embodiments of a cross-section corresponding to line I-I' of FIG. 7, and FIG. 9 illustrates an embodiment of a cross-section corresponding to line of FIG. 7.

In embodiments, FIGS. 8A and 8B illustrate any one transistor T of circuit elements that form a pixel circuit PXC, and FIG. 9 illustrates a storage capacitor Cst and a transistor that may be connected to the first electrode ELT1 of the circuit elements that form the pixel circuit PXC, for example, the first transistor T1 of FIGS. 6A and 6B. Hereinafter, in case that there is no need to separately designate the first transistor T1, the term "transistor T" may be comprehensively used to designate the first transistor T1.

In an embodiment, the transistors T that form each pixel circuit PXC may have a substantially identical or similar structure, but the disclosure is not limited thereto. Furthermore, the structures and/or positions of the transistors T and the storage capacitor Cst may be changed in various ways depending on embodiments, rather than being limited to those of the embodiments of FIGS. 8A to 9.

Referring to FIGS. 5 to 9, the pixel PXL in accordance with an embodiment may include a display element layer DPL disposed on one surface or a surface of the base layer BSL and including light emitting elements LD. Furthermore, the pixel PXL may selectively further include a pixel circuit layer PCL disposed between the base layer BSL and the display element layer DPL.

In an embodiment, the pixel circuit layer PCL may include at least one circuit element which forms each pixel circuit PXC. For example, the pixel circuit layer PCL may include transistors T and a storage capacitor Cst that form the pixel circuit PXC, and further include at least one power line and/or a signal line that may be connected to the pixel circuit PXC and/or the light source unit LSU. Here, in the case where the pixel circuit PXC is omitted and the light source unit LSU of each pixel PXL is connected to or directly connected to the first and second power lines PL1 and PL2 (or signal lines), the pixel circuit layer PCL may be omitted.

Furthermore, the pixel circuit layer PCL may include insulating layers disposed between respective electrodes and/or lines. In an embodiment, the pixel circuit layer PCL may include a buffer layer BFL, a gate insulating layer GI, an interlayer insulating layer ILD, and a passivation layer PSV which may be successively stacked each other on one surface or a surface of the base layer BSL. The pixel circuit layer PCL may selectively further include at least one light shielding pattern (not shown) disposed under or below at least some or a part of transistors T.

Each transistor T may include a semiconductor layer SCL, a gate electrode GE, and first and second transistor electrodes TE1 and TE2. Although FIGS. 8A to 9 illustrate an embodiment in which each transistor T may include the first and second transistor electrodes TE1 and TE2 that are formed separately from the semiconductor layer SCL, the disclosure is not limited thereto. For example, in an embodiment, the first and/or second transistor electrode TE1 and/or TE2 provided in at least one transistor T disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which comes into contact with each first transistor electrode TE1, a second area which comes into contact with each second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, for example, within the spirit and the scope of the disclosure. The channel area of the semiconductor layer SCL may be an intrinsic semiconductor, which is an undoped semiconductor pattern. Each of the first and second areas of the semiconductor layer SCL may be a semiconductor pattern doped with an impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap one area or an area of the semiconductor layer SCL.

The first and second transistor electrodes TE1 and TE2 may be disposed over each semiconductor layer SCL and the corresponding gate electrode GE with at least one interlayer insulating layer ILD interposed therebetween. For example, the first and second transistor electrodes TE1 and TE2 may be disposed between the interlayer insulating layer ILD and the passivation layer PSV. The first and second transistor electrodes TE1 and TE2 may be electrically connected to each semiconductor layer SCL. For example, the first and second transistor electrodes TE1 and TE2 may be connected to the first and second areas of each semiconductor layer SCL through corresponding contact holes which pass through the gate insulating layer GI and the interlayer insulating layer ILD. In an embodiment, any one of the first and second transistor electrodes TE1 and TE2 may be a source electrode, and the other may be a drain electrode.

At least one transistor T provided in the pixel circuit PXC may be connected to any one electrode of the light source unit LSU. For example, any one of the first and second transistor electrodes TE1 and TE2 of the first transistor T1 shown in FIGS. 6A and 6B may be electrically connected to the first electrode ELT1 and/or the first electrode line ELI1 of the light source unit LSU disposed over the passivation layer PSV, through the first contact hole CH1 passing through the passivation layer PSV.

The storage capacitor Cst may include a first capacitor electrode CE1 and a second capacitor electrode CE2 which may overlap each other. In an embodiment, each of the first and second capacitor electrodes CE1 and CE2 may be formed of a single layer or multiple layers. Furthermore, at least one of the first and second capacitor electrodes CE1 and CE2 may be disposed on a layer identical with that of at least one electrode or the semiconductor layer SCL of the first transistor T1.

For example, the first capacitor electrode CE1 may be formed of a multilayer electrode including a lower electrode LE disposed on a layer identical with that of the semiconductor layer SCL of the first transistor T1, and an upper electrode UE disposed on a layer identical with that of the first and second transistor electrodes and TE2 of the first transistor T1 and electrically connected to the lower electrode LE. The second capacitor electrode CE2 may be formed of a single layer electrode which is disposed on a layer identical with that of the gate electrode GE of the first transistor T1 and disposed between the lower electrode LE and the upper electrode UE of the first capacitor electrode CE1.

Here, the disclosure is not limited thereto. The structure and/or position of each of the first and second capacitor electrodes CE1 and CE2 may be changed in various ways. For example, in an embodiment, any one of the first and second capacitor electrodes CE1 and CE2 may include at least one layer or layer of conductive pattern disposed on a layer different from that of the electrodes (for example, the gate electrode GE, and the first and second transistor electrodes TE1 and TE2) and the semiconductor layer SCL that form the first transistor T1.

In an embodiment, at least one signal line and/or power line that may be connected to each pixel PXL may be disposed on a layer identical with that of one electrode of each of the circuit elements that form the pixel circuit PXC. For example, the scan line Si of each pixel PXL may be disposed on the same layer as that of the gate electrodes GE. The data line Dj of each pixel PXL may be disposed on the same layer as that of the first and second transistor electrodes TE1 and TE2 of the transistors T. Furthermore, the first and/or second power lines PL1 and/or PL2 may be disposed on the same layer as that of the gate electrodes GE or the first and second transistor electrodes TE1 and TE2 of the transistors T. For example, the second power line PL2 for supplying the voltage of the second power supply VSS may be disposed on a layer identical with that of the gate electrodes GE of the transistors T, and electrically connected to the second electrode ELT2 of the light source unit LSU and/or the second electrode line ELI2, both through a bridge pattern BRP disposed on a layer identical with that of the first and second transistor electrodes and TE2 of the transistors T and through a second contact hole CH2 passing through the passivation layer PSV. However, the structures and/or positions of the second power line PL2, for example, may be changed in various ways.

In an embodiment, the display element layer DPL may include a light source unit LSU of each of the pixels PXL. For example, the display element layer DPL may include at least one pair of first and second electrodes ELT1 and ELT2 that are disposed in the emission area EMA of each pixel PXL, and at least one light emitting element LD electrically connected between the first and second electrodes ELT1 and ELT2, and may further include at least one conductive layer and/or insulating layer, for example, within the spirit and the scope of the disclosure.

In an embodiment, each pixel PXL may include light emitting elements LD connected in the forward direction between the first and second electrodes ELT1 and ELT2, as shown in the embodiments of FIGS. 6A to 7. However, the number of light emitting elements LD provided in each pixel PXL is not limited thereto, and this may be changed in various ways. For the sake of explanation, in the description of the embodiments of FIGS. 8A to 9 and the other embodiments to be described below, each embodiment will be explained on the assumption that each pixel PXL may include light emitting elements LD. Here, it should be noted that the light emitting elements LD provided in the pixel PXL in accordance with each embodiment may be changed to a single light emitting element LD.

In an embodiment, in each pixel area, the display element layer DPL may include a first partition wall PW1, a second partition wall PW2, a first electrode ELT1, a second electrode ELT2, a first insulating layer INS1, light emitting elements LD, a second insulating layer INS2, a first contact electrode CNE1, a third insulating layer INS3, a second contact electrode CNE2, and a fourth insulating layer INS4, which are successively disposed and/or formed over the base layer BSL and/or the pixel circuit layer PCL.

The first and second partition walls PW1 and PW2 may be disposed at positions spaced apart from each other on one surface or a surface of the base layer BSL on which the pixel circuit layer PCL is selectively formed. For example, at least one pair of first and second partition walls PW1 and PW2 spaced apart from each other may be disposed in each pixel area (for example, each emission area EMA) on the base layer BSL.

The first and second partition walls PW1 and PW2 may protrude from the base layer BSL and/or the pixel circuit layer PCL in a height direction toward a front surface of the display panel PNL. In an embodiment, the first and second partition walls PW1 and PW2 may have substantially the same shape and/or height, but the disclosure is not limited thereto.

In an embodiment, the first partition wall PW1 may be disposed between the base layer BSL and/or the pixel circuit layer PCL and each first electrode ELT1. The first partition wall PW1 may be disposed adjacent to the first ends EP1 of the light emitting elements LD. For example, one side surface or a side surface of the first partition wall PW1 may be positioned adjacent to the first ends EP1 of the light emitting elements LD and disposed to face the first ends EP1.

In an embodiment, the second partition wall PW2 may be disposed between the base layer BSL and/or the pixel circuit layer PCL and the second electrode ELT2. The second partition wall PW2 may be disposed adjacent to the second ends EP2 of the light emitting elements LD. For example, one side surface or a side surface of the second partition wall PW2 may be positioned adjacent to the second ends EP2 of the light emitting elements LD and disposed to face the second ends EP2.

In an embodiment, each of the first and second partition walls PW1 and PW2 may have various shapes. In an embodiment, as illustrated in FIGS. 8A and 9, the first and second partition walls PW1 and PW2 may have a trapezoidal cross-section the width of which is gradually reduced upward. Each of the first and second partition walls PW1 and PW2 may have an inclined surface on at least one side or a side. For example, the first partition wall PW1 may include an inclined surface facing the first ends EP1 of the light emitting elements LD, and the second partition wall PW2 may have an inclined surface facing the second ends EP2 of the light emitting elements LD. In an embodiment, the inclined surface of each of the first and second partition walls PW1 and PW2, for example, the inclined surface facing one ends or ends of the adjacent light emitting elements LD, may be formed to have an inclined angle $\theta 1$, $\theta 2$ (for example, an initial inclined angle) ranging from approximately 15° to approximately 80° with respect to a plane on which the light emitting elements LD are disposed.

In an embodiment, as illustrated in FIG. 8B, the first and second partition walls PW1 and PW2 may have a semicircular or semi-elliptical cross-section the width of which is gradually reduced upward. Each of the first and second partition walls PW1 and PW2 may have a curved surface on at least one side or a side. For example, the first partition wall PW1 may include a curved surface facing the first ends EP1 of the light emitting elements LD, and the second partition wall PW2 may have a curved surface facing the second ends EP2 of the light emitting elements LD. In an embodiment, the curved surface of each of the first and second partition walls PW1 and PW2, for example, the curved surface facing one ends or ends of the adjacent light emitting elements LD, may be formed to have an initial inclined angle $\theta 1'$, $\theta 2'$ ranging from approximately 15° to approximately 80° with respect to the plane on which the light emitting elements LD are disposed.

Here, the shapes, for example, of the first and second partition walls PW1 and PW2 may be changed in various ways depending on embodiments. For example, in an embodiment, the first and second partition walls PW1 and PW2 each may have a stepped structure on at least one side or a side thereof.

In an embodiment, the shape (for example, the inclined angle), the size (for example, the height), and/or positions, for example, of the first and second partition walls PW1 and PW2 may be designed in various ways, taking into account the light efficiency, for example, of each pixel PXL. In other words, the shape, the size, and/or the position of the first and second partition walls PW1 and PW2 are not particularly limited, and these may be changed in various ways, taking into account design conditions or the light efficiency, for example, of each pixel PXL. In an embodiment, at least one of the first and second partition walls PW1 and PW2 may be omitted or changed in position.

Each of the first and second partition walls PW1 and PW2 may include insulating material having at least one inorganic material and/or organic material. For example, the first and second partition walls PW1 and PW2 may include at least one inorganic layer including various inorganic insulating materials such as silicon nitride ($SiN_x$) or silicon oxide ($SiO_x$). As an example, the first and second partition walls PW1 and PW2 may include at least one organic layer and/or photoresist layer containing various organic insulating materials, or may form a single- or multi-layer insulator containing organic/inorganic materials in combination. In an embodiment, the constituent materials of the first and second partition walls PW1 and PW2 may be changed in various ways.

In an embodiment, each of the first and second partition walls PW1 and PW2 may function as a reflector. For example, the first and second partition walls PW1 and PW2, along with the first and second electrodes ELT1 and ELT2 provided on the first and second partition walls PW1 and PW2, may function as reflectors that guide light emitted from each light emitting element LD in a desired direction, thus enhancing (or improving) the light efficiency of the pixel PXL. For example, the first partition wall PW1 along with the first electrode ELT1 provided thereover may form a first reflective partition wall, and the second partition wall PW2 along with the second electrode ELT2 provided thereover may form a second reflective partition wall.

The first and second electrodes ELT1 and ELT2 may be respectively disposed over the first and second partition walls PW1 and PW2. The first and second electrodes ELT1 and ELT2 may be disposed at positions spaced apart from each other in each emission area EMA.

In an embodiment, the first and second electrodes ELT1 and ELT2 that are respectively disposed over the first and second partition walls PW1 and PW2 may have shapes corresponding to the respective shapes of the first and second partition walls PW1 and PW2. For example, the first electrode ELT1 and the second electrode ELT2 may have inclined surfaces or curved surfaces corresponding to the shapes of the first partition wall PW1 and the second partition wall PW2, respectively, and protrude in the height direction of the base layer BSL. Likewise, at least one conductive layer and/or insulating layer disposed on the first and second electrodes ELT1 and ELT2 may have a shape corresponding to the shapes of the first and second electrodes ELT1 and ELT2.

Each of the first and second electrodes ELT1 and ELT2 may include at least one conductive material. For example, each of the first and second electrodes ELT1 and ELT2 may include at least one material among at least one metal of various metal materials including silver (Ag), magnesium (Mg), aluminium (Al), platinum (Pt), palladium (Pd), gold (Au), nickel (Ni), neodymium (Nd), iridium (Ir), chromium (Cr), titanium (Ti), molybdenum (Mo), copper (Cu), for example, or an alloy thereof, conductive oxide such as indium tin oxide (ITO), indium zinc oxide (IZO), zinc oxide (ZnO), antimony zinc oxide (AZO), indium tin zinc oxide (ITZO), zinc oxide (ZnO), tin oxide (SnO2), and a conductive polymer such as PEDOT, but the disclosure is not limited thereto. For example, each of the first and second electrodes ELT1 and ELT2 may include other conductive materials such as a carbon nano tube and a graphene. In other words, each of the first and second electrodes ELT1 and ELT2 may include at least one of various conductive materials to have conductivity, and the constituent material thereof is not particularly limited. Furthermore, each of the first and second electrodes ELT1 and ELT2 may have the same conductive material, or at least one different conductive material.

Each of the first and second electrodes ELT1 and ELT2 may have a single-layer or multilayer structure. For example, each of the first and second electrodes ELT1 and ELT2 may include a reflective electrode layer. Furthermore, each of the first and second electrodes ELT1 and ELT2 may selectively further include at least one of a transparent electrode layer disposed over and/or under or below the reflective electrode layer, and a conductive capping layer covering or overlapping an upper portion of the reflective electrode layer and/or the transparent electrode layer.

In an embodiment, the reflective electrode layer of each of the first and second electrodes ELT1 and ELT2 may be formed of conductive material having a uniform reflectivity. For example, the reflective electrode layer may include at least one of various metal materials including silver (Ag), magnesium (Mg), aluminium (Al), platinum (Pt), palladium (Pd), gold (Au), nickel (Ni), neodymium (Nd), iridium (Ir), chromium (Cr), titanium (Ti), molybdenum (Mo), copper (Cu), for example, or an alloy thereof, but the disclosure is not limited thereto. In other words, the reflective electrode layer may be formed of various reflective conductive materials. Each of the first and second electrodes ELT1 and ELT2 that may include the reflective electrode layer may enable light emitted from the opposite ends of each of the light emitting elements LD, for example, the first and second ends EP1 and EP2, to travel in a direction (for example, in a frontal direction) in which an image is displayed. For example, if the first and second electrodes ELT1 and ELT2 respectively have inclined or curved surfaces corresponding to the shapes of the first and second partition walls PW1 and PW2 and are respectively disposed to face the first and second ends EP1 and EP2 of the light emitting elements LD, light emitted from the first and second ends EP1 and EP2 of each of the light emitting elements LD may be reflected by the first and second electrodes ELT1 and ELT2 and thus more reliably travel in the frontal direction of the display panel PNL (for example, in an upward direction of the base layer BSL). Thereby, the efficiency of light emitted from the light emitting elements LD may be enhanced.

Furthermore, the transparent electrode layer of each of the first and second electrodes ELT1 and ELT2 may be formed of various transparent electrode materials. For example, the transparent electrode layer may include ITO, IZO or ITZO, but the disclosure is not limited thereto. In an embodiment, each of the first and second electrodes ELT1 and ELT2 may have a triple-layer structure having a stacked structure of ITO/Ag/ITO. As such, if the first and second electrodes ELT1 and ELT2 each are formed of a multilayer structure of at least two layers, voltage drop due to signal delay (RC delay) may be minimized. Thus, a desired voltage can be effectively transmitted to the light emitting elements LD.

If each of the first and second electrodes ELT1 and ELT2 may include the conductive capping layer covering or overlapping the reflective electrode layer and/or the transparent electrode layer, it is possible to prevent the reflective electrode layer of the first and second electrodes ELT1 and ELT2 from being damaged due to defects caused during the manufacturing process of the pixel PXL. However, the conductive capping layer may be selectively included in the first and second electrodes ELT1 and ELT2, and may be omitted according to an embodiment. Furthermore, the conductive capping layer may be considered as a component of each of the first and second electrodes ELT1 and ELT2, or considered as a separate component disposed on the first and second electrodes ELT1 and ELT2.

The first insulating layer INS1 may be disposed on one area or an area of each of the first and second electrode ELT1 and ELT2. For example, the first insulating layer INS1 may be formed to cover or overlap areas of the first and second electrodes ELT1 and ELT2, and may include openings which expose other areas (for example, the first and second contact portions CNP1 and CNP2) of the first and second electrodes ELT1 and ELT2.

In an embodiment, the first insulating layer INS1 may be primarily formed to cover or overlap the overall surfaces of the first and second electrodes ELT1 and ELT2. After the light emitting elements LD are supplied and aligned on the first insulating layer INS1, the first insulating layer INS1 may be partially opened to expose the first and second electrodes ELT1 and ELT2 in the first and second contact portions CNP1 and CNP2, respectively. In an embodiment, the first insulating layer INS1 may be patterned in the form of an individual pattern which is sectionally disposed under or below the light emitting elements LD after the supply and alignment of the light emitting elements LD have been completed.

In other words, the first insulating layer INS1 may be interposed between the first and second electrodes ELT1 and ELT2 and the light emitting elements LD, and may expose at least one area or an area of each of the first and second electrodes ELT1 and ELT2. After the first and second electrodes ELT1 and ELT2 are formed, the first insulating layer INS1 may be formed to cover or overlap the first and second electrodes ELT1 and ELT2, so that it is possible to prevent the first and second electrodes ELT1 and ELT2 from being damaged during a subsequent process. Furthermore, the first insulating layer INS1 may stably support each light emitting element LD.

The first insulating layer INS1 may be selectively provided depending on embodiments. For example, in an embodiment, the first insulating layer INS1 may be omitted. The light emitting elements LD may be disposed on or directly on the passivation layer PSV to contact the passivation layer PSV between the first and second electrodes ELT1 and ELT2, or may be disposed between the first and second electrodes ELT1 and ELT2 such that the first and/or second ends EP1 and EP2 of the light emitting elements LD are respectively disposed on or directly on the first and/or second electrodes ELT1 and/or ELT2.

Light emitting elements LD may be supplied to and aligned in each emission area EMA in which the first insulating layer INS1 is formed. For example, light emitting elements LD may be supplied to each emission area EMA through an inkjet scheme, a slit coating scheme, or the like, and the light emitting elements LD may be aligned between the first and second electrodes ELT1 and ELT2 by alignment voltages (or alignment signals) applied to the first and second electrodes ELT1 and ELT2.

The second insulating layer INS2 may be disposed over the light emitting elements LD, for example, the light emitting elements LD aligned between the first and second electrodes ELT1 and ELT2, and may expose the first and second ends EP1 and EP2 of the light emitting elements LD. For example, the second insulating layer INS2 may be partially disposed only over areas including the central areas of the light emitting elements LD without covering or overlapping the first and second ends EP1 and EP2 of the light emitting elements LD. The second insulating layer INS2 may be formed in an independent pattern in each emission area EMA; however, the disclosure is not limited thereto.

The second insulating layer INS2 may reliably fix the light emitting elements LD. For example, after the alignment of the light emitting elements LD has been completed, the second insulating layer INS2 is formed on the light emitting elements LD so that the light emitting elements LD may be prevented from being removed from the aligned position. If space is present between the first insulating layer INS1 and the light emitting elements LD before the second insulating layer INS2 is formed, the space may be filled with the second insulating layer INS2 during a process of forming the second insulating layer INS2. The light emitting elements LD may be more stably supported.

The second insulating layer INS2 may be selectively provided depending on embodiments. For example, in an embodiment, the second insulating layer INS2 may be omitted. One end or an end of each of the first and second contact electrodes CNE1 and CNE2 may be disposed over or directly over the light emitting elements LD.

The first contact electrode CNE1 may be disposed on the first electrode ELT1 and areas of the light emitting elements LD. For example, the first contact electrode CNE1 may be formed on the first electrode ELT1 and the first ends EP1 of the light emitting elements LD to cover or overlap at least one area or an area of the first electrode ELT1 including the first contact portion CNP1, and the first ends EP1 of the light emitting elements LD. The first contact electrode CNE1 may contact each first electrode ELT1 through the first contact portion CNP1, and contact the first ends EP1 of the light emitting elements LD that are exposed from the second insulating layer INS2. Hence, the first ends EP1 of the light emitting elements LD may be electrically connected to the first electrode ELT1 through the first contact electrode CNE1.

A third insulating layer INS3 may be disposed on the first contact electrode CNE1. For example, the third insulating layer INS3 may be disposed on or directly on the first contact electrode CNE1 to cover or overlap at least the first contact electrode CNE1. For example, the third insulating layer INS3 may be disposed on the first contact electrode CNE1 and an area of the light emitting elements LD including the first ends EP1, and cover or overlap one end or an end of the first contact electrode CNE1 on the light emitting elements LD.

The third insulating layer INS3 may be interposed between the first contact electrode CNE1 and the second contact electrode CNE2 and reliably insulate the first and second contact electrodes CNE1 and CNE2. In other words, as the third insulating layer INS3 is formed, a short-circuit defect may be effectively prevented from occurring between the first and second contact electrodes CNE1 and CNE2. The third insulating layer INS3 may be formed on only partial areas of the light emitting elements LD such that the second ends EP2 of the light emitting elements LD are not covered with or overlapped by the third insulating layer INS3.

The second contact electrode CNE2 may be disposed on the second electrode ELT2 and areas of the light emitting elements LD. For example, the second contact electrode CNE2 may be formed on the second electrode ELT2 and the second ends EP2 of the light emitting elements LD to cover or overlap at least one area or an area of the second electrode ELT2 including the second contact portion CNP2, and the second ends EP2 of the light emitting elements LD. The second contact electrode CNE2 may contact each second electrode ELT2 through the second contact portion CNP2, and contact the second ends EP2 of the light emitting elements LD that are exposed from the second and third insulating layers INS2 and INS3. Hence, the second ends EP2 of the light emitting elements LD may be electrically connected to the second electrode ELT2 through the second contact electrode CNE2.

The fourth insulating layer INS4 may be disposed on the first and second contact electrodes CNE1 and CNE2. For example, the fourth insulating layer INS4 may be formed and/or disposed on an overall surface of the display area DA of the base layer BSL, including an area over the first and second partition walls PW1 and PW2, the first and second electrodes ELT1 and ELT2, the light emitting elements LD, and the first and second contact electrodes CNE1 and CNE2 of each pixel PXL. As the fourth insulating layer INS4 is formed, the pixels PXL formed in the display area DA may be protected from an external environment. For example, as the fourth insulating layer INS4 is formed, foreign material such as water or the like may be prevented from being drawn into the pixels PXL, or the pixels PXL may be prevented from being damaged by external shocks. The fourth insulating layer INS4 may include at least one inorganic layer and/or organic layer.

In an embodiment, the fourth insulating layer INS4 may include a thin-film encapsulation layer having a multilayer structure, but the disclosure is not limited thereto. In an embodiment, at least one overcoat layer and/or an upper substrate (for example, an encapsulation substrate), for example, which is not shown, may be further disposed over the fourth insulating layer INS4.

In an embodiment, each of the first to fourth insulating layers INS1 to INS4 may have a single-layer or multi-layer structure, and include at least one inorganic insulating material and/or organic insulating material. For example, each of the first to fourth insulating layers INS1 to INS4 may include various kinds of organic/inorganic insulating materials including silicon nitride ($SiN_x$), and the constituent material of each of the first to fourth insulating layers INS1 to INS4 is not particularly limited. The first to fourth insulating layers INS1 to INS4 may include different insulating materials, or at least some or a part of the first to fourth insulating layers INS1 to INS4 may include the same insulating material.

FIGS. 10 and 11A to 11C are schematic cross-sectional views each illustrating a display device in accordance with an embodiment. For example, FIGS. 10, and 11A to 11C illustrate different embodiments of a cross-section of one area or an area of the display panel PNL including the pixel PXL in accordance with an embodiment of FIG. 9. In an embodiment, FIGS. 10, and 11A to 11C each illustrate a cross-section of the display panel PNL, centered on an area in which any one pixel unit PXU formed of a first color pixel PXL1, a second color pixel PXL2, and a third color pixel PXL3 adjacent to each other is disposed.

Since the illustrative structure of each pixel PXL has been described in detail through the above-mentioned embodiments, each of FIGS. 10, and 11A to 11C schematically illustrates the structure of each pixel PXL, centered on one light emitting element LD. In the description of the embodiments of FIGS. 10, and 11A to 11C, like reference numerals will be used to designate components similar or equal to those of the previous embodiments, and detailed descriptions thereof will be omitted.

Referring to FIGS. 5 to 10, the light source unit LSU of each pixel PXL may be disposed in the display element layer DPL over the base layer BSL and/or the pixel circuit layer PCL. For example, in each emission area EMA of the display element layer DPL, the light source unit LSU of the corresponding pixel PXL may be disposed. A bank BNK for defining each emission area EMA may be disposed between adjacent emission areas EMA.

The light source unit LSU, which can have various configurations depending on embodiments, may be formed in the emission area EMA of each pixel PXL. For example, in each emission area EMA, the first and second partition walls PW1 and PW2, the first and second electrodes ELT1 and ELT2, the light emitting elements LD, the first and second contact electrodes CNE1 and CNE2, and the first to fourth insulating layer INS1 to INS4 that are shown in FIGS. 7 to 9 may be disposed.

In an embodiment, the first, second, and third color pixels PXL1, PXL2, and PXL3 may include light emitting elements LD to emit different colors of light. For example, each first color pixel PXL1 may include a first color light emitting element LD1, each second color pixel PXL2 may include a second color light emitting element LD2, and each third color pixel PXL3 may include a third color light emitting element LD3. In an embodiment, the first color light emitting element LD1, the second color light emitting element LD2, and the third color light emitting element LD3 may be respectively a red light emitting element, a green light emitting element, and a blue light emitting element, but the disclosure is not limited thereto.

The bank BNK may be a structure which defines the emission area EMA of each pixel PXL, and for example be a pixel defining layer. For example, the bank BNK may be disposed in a boundary area of first, second, and third color pixel areas PXA1, PXA2, and PXA3 in which the first, second, and third color pixels PXL1, PXL2, and PXL3 are respectively provided, such that the emission area EMA of each pixel PXL is enclosed by the bank BNK. The bank BNK may also be disposed on the perimeter of the display area DA to enclose the display area DA in which the pixels PXL are disposed. Hereinafter, the term "pixel area PXA" or "pixel areas PXA" will be used to designate any pixel area of the first, second, and the third pixel areas PXA1, PXA2, and PXA3 or collectively designate two or more kinds of pixel areas.

The bank BNK may include at least one light shielding and/or reflective material, thus preventing light leakage between adjacent pixels PXL from occurring. For example, the bank BNK may include at least one black matrix material (for example, at least one light shielding material) among different kinds of black matrix materials, and/or a color filter material having a specific or given color. For example, the bank BNK may be formed of a black opaque pattern to block transmission of light. In an embodiment, a reflective layer which is not shown may be formed on a surface (for example, a sidewall) of the bank BNK to increase the light efficiency of the pixel PXL.

In an embodiment, the bank BNK may be formed on a layer identical with that of the first and second partition walls PW1 and PW2 during a process of forming the first and second partition walls PW1 and PW2 of the pixels PXL. In an embodiment, the bank BNK may be formed on a layer identical with or different from that of the first and second partition walls PW1 and PW2 during a process separated from the process of forming the first and second partition walls PW1 and PW2. In other words, a position (for example, a position in layers in a schematic cross-sectional view) of the bank BNK, a forming step thereof, for example, may be changed in various ways depending on embodiments. Furthermore, the shape, size, and/or constituent material, for example, of the bank BNK may be changed various ways depending on design conditions or the like of the display panel PNL. For example, the bank BNK may be a single layer or multilayer pattern which can have various shapes including a trapezoidal shape, a semicircular shape, an elliptical shape, for example, and the size (for example, the width and/or height) or constituent material thereof may be changed in various ways.

In an embodiment, an upper substrate ENC may be disposed over the pixels PXL. For example, the upper substrate ENC (also referred to as "encapsulation substrate" or "color filter substrate") that encapsulates at least the display area DA may be disposed on one surface or a surface of the base layer BSL on which the pixels PXL are disposed.

In an embodiment, the upper substrate ENC may include a light conversion layer LCP which overlaps the pixels PXL. For example, the light conversion layer LCP may include a color filter layer CFL disposed on one surface or a surface of the upper substrate ENC to face the pixels PXL.

The color filter layer CFL may include a color filter corresponding to the color of each pixel PXL. For example, the color filter layer CFL may include a first color filter CF1 which is disposed over each first color pixel PXL1 and allows light generated from the first color pixel PXL1 to selectively pass therethrough, a second color filter CF2 which is disposed over each second color pixel PXL2 and allows light generated from the second color pixel PXL2 to selectively pass therethrough, and a third color filter CF3 which is disposed over each third color pixel PXL3 and allows light generated from the third color pixel PXL3 to selectively pass therethrough. In an embodiment, the first color filter CF1, the second color filter CF2, and the third color filter CF3 may be respectively a red color filter, a green color filter, and a blue color filter, but the disclosure is not limited thereto. Hereinafter, the term "color filter CF" or "color filters CF" will be used to designate any color filter of the first color filter CF1, the second color filter CF2, and the third color filter CF3, or comprehensively designate two or more kinds of color filters.

The first color filter CF1 may be disposed between each first color pixel PXL1 (for example, the light source unit LSU of the first color pixel PXL1) and the upper substrate ENC, and include color filter material which allows first color light generated from the first color pixel PXL1 to selectively pass therethrough. For example, in case that the first color pixel PXL1 is a red pixel, the first color filter CF1 may include red color filter material.

The second color filter CF2 may be disposed between each second color pixel PXL2 (for example, the light source unit LSU of the second color pixel PXL2) and the upper substrate ENC, and include color filter material which allows second color light generated from the second color pixel PXL2 to selectively pass therethrough. For example, in case that the second color pixel PXL2 is a green pixel, the second color filter CF2 may include green color filter material.

The third color filter CF3 may be disposed between each third color pixel PXL3 (for example, the light source unit LSU of the third color pixel PXL3) and the upper substrate ENC, and include color filter material which allows third color light generated from the third color pixel PXL3 to selectively pass therethrough. For example, in case that the third color pixel PXL3 is a blue pixel, the third color filter CF3 may include blue color filter material.

In an embodiment, a black matrix BM may be disposed between color filters CF. For example, the black matrix BM may be disposed on one surface or a surface of the upper substrate ENC to face the bank BNK. In an embodiment, the black matrix BM may be disposed in a boundary area of the pixel areas PXA not to cover e or overlap ach emission area EMA.

In an embodiment, the black matrix BM may include at least one black matrix material (for example, at least one light shielding material) among different kinds of black matrix materials, and/or a color filter material having a specific or given color. The black matrix BM may be formed of the same material or similar material as that of the bank BNK, but the disclosure is not limited thereto. In other words, the black matrix BM and the bank BNK may include the same material or similar material or different materials.

In an embodiment, the black matrix BM may be formed of a black light shielding pattern including black matrix material. In an embodiment, the black matrix BM may be formed of a blue light shielding pattern including blue color filter material. The number of masks for forming the color filter layer CFL may be reduced, and the process may be simplified.

In an embodiment, the black matrix BM may have a multilayer structure. For example, the black matrix BM may have a multilayer structure including a black light shielding pattern including black matrix material, and a blue light shielding pattern including blue color filter material.

For example, the black matrix BM may be a single layer or multilayer pattern which may have various shapes including a trapezoidal shape, a semicircular shape, an elliptical shape, for example, and the size (for example, the width and/or height) or constituent material thereof may be changed in various ways.

In an embodiment, space between a lower plate of the display panel PNL that may include the base layer BSL, the display element layer DPL, for example, and an upper plate of the display panel PNL that may include the upper substrate ENC, the light conversion layer LCP, for example, may form an air layer. In an embodiment, the space between the lower plate and the upper plate of the display panel PNL may be filled with a filler having a relatively low refractive index ranging from approximately 1 to approximately 1.5.

Figure 10:
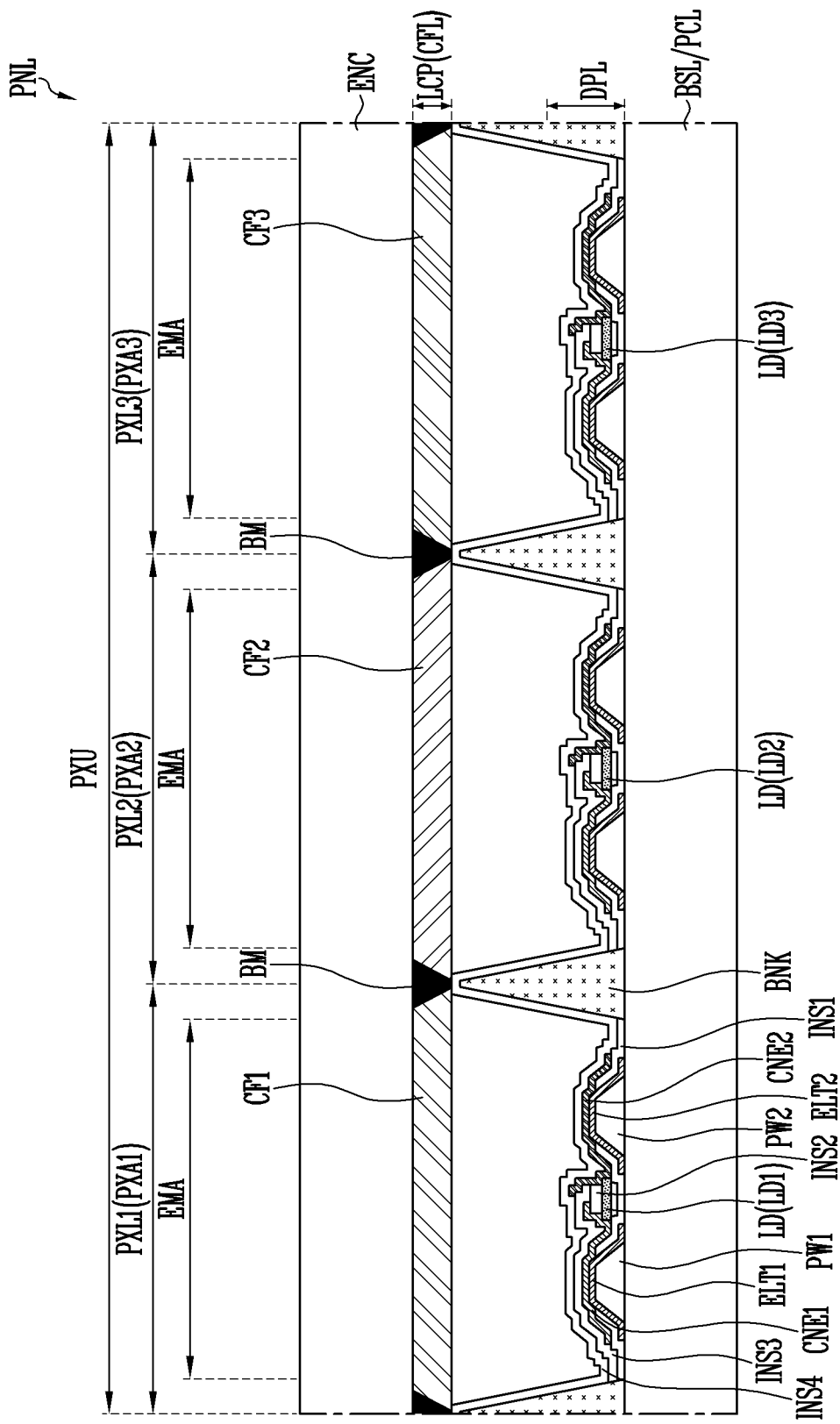
FIGS. 10 and 11A to 11C are schematic cross-sectional views each illustrating a display device in accordance with an embodiment.

Although FIG. 10 illustrates an embodiment in which the upper substrate ENC is disposed over the base layer BSL on which the pixels PXL are disposed, the disclosure is not limited thereto. For example, in the case where the fourth insulating layer INS4 may include a thin film encapsulation layer enough to protect the pixels PXL, the upper substrate ENC may be omitted. The color filters CF and/or the black matrix BM may be provided on a window (not shown) disposed over the display panel PNL.

Figure 11A:
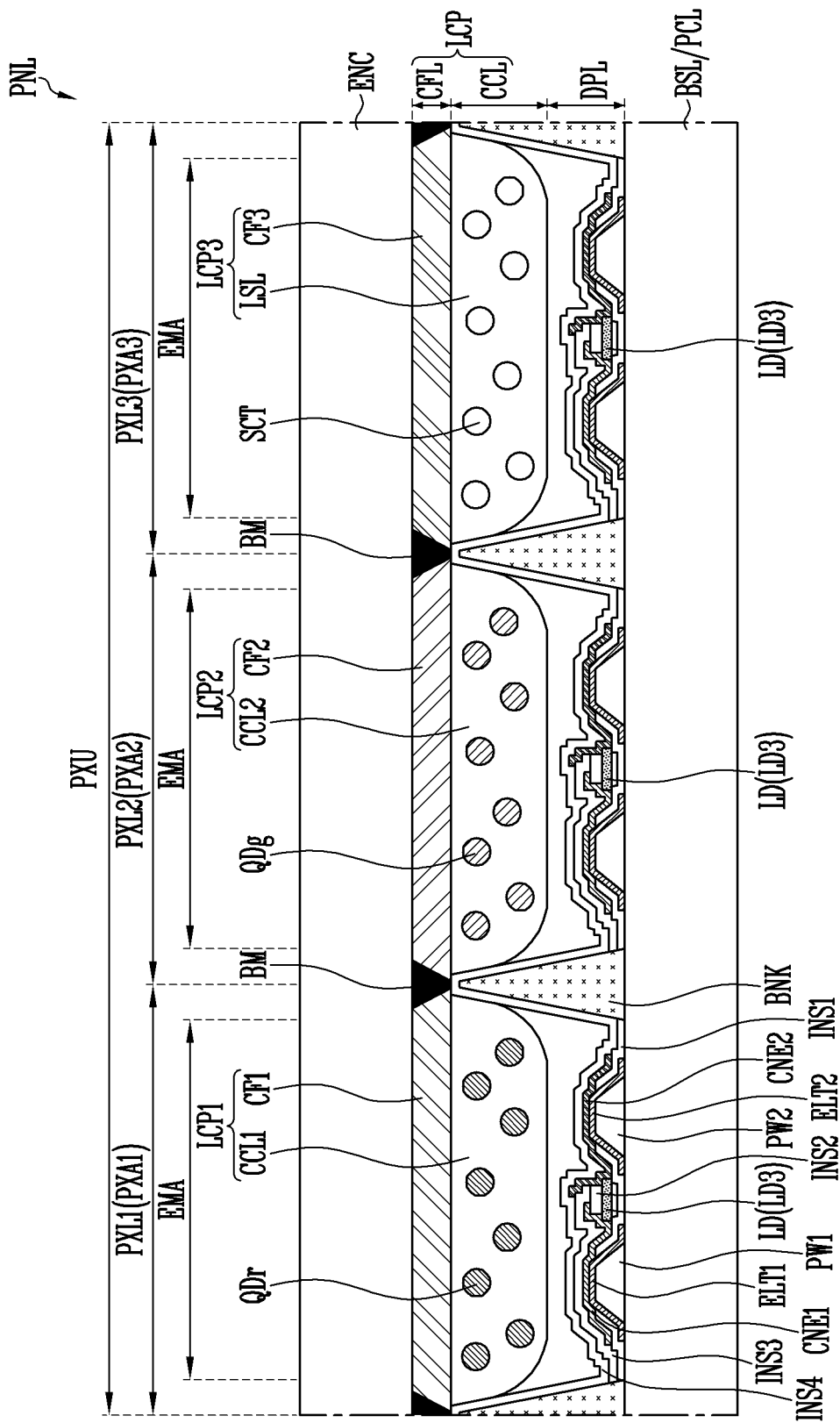

Referring to FIG. 11A, the upper substrate ENC may include a light conversion layer LCP which overlaps the pixels PXL. The light conversion layer LCP may include a color filter layer CFL disposed on the upper substrate ENC to face the pixels PXL, and a color conversion layer CCL which is disposed between the color filter layer CFL and the pixels PXL and includes color conversion particles.

Although FIG. 11A illustrates an embodiment in which a gap (for example, an air layer) is present between the color conversion layer CCL and the fourth insulating layer INS4, the disclosure is not limited thereto. For example, in an embodiment, the color conversion layer CCL may be formed such that the space between the color filter layer CFL and the fourth insulating layer INS4 is completely filled with the color conversion layer CCL.

The light conversion layer LCP may include a first light conversion layer LCP1 disposed over the first color pixel PXL1, a second light conversion layer LCP2 disposed over the second color pixel PXL2, and a third light conversion layer LCP3 disposed over the third color pixel PXL3. Hereinafter, the term "light conversion layer LCP" or "light conversion layers LCP" will be used to designate any one light conversion layer of the first light conversion layer LCP1, the second light conversion layer LCP2, and the third light conversion layer LCP3, or comprehensively designate two or more kinds of light conversion layers.

In an embodiment, at least some or a part of the first, second, and third light conversion layers LCP1, LCP2, and LCP3 may include a color conversion layer CCL and/or a color filter layer CFL which corresponds to a color. For example, the first light conversion layer LCP1 may include a first color conversion layer CCL1 including first color conversion particles corresponding to a first color, and a first color filter CF1 to allow the light of the first color to selectively pass therethrough. Likewise, the second light conversion layer LCP2 may include a second color conversion layer CCL2 including second color conversion particles corresponding to a second color, and a second color filter CF2 to allow the light of the second color to selectively pass therethrough. The third light conversion layer LCP3 may include at least one of a light scattering layer LSL including light scattering particles SCT, and a third color filter CF3 to allow the light of the third color to selectively pass therethrough.

In an embodiment, at least one insulating layer, which is not shown, may be disposed on a surface of each of the first color conversion layer CCL1, the second color conversion layer CCL2, and/or the light scattering layer LSL. Each insulating layer (for example, a capping layer, a buffer layer, and/or a barrier layer) may be disposed, to protect the first color conversion layer CCL1, the second color conversion layer CCL2, and/or the light scattering layer LSL, between the first color conversion layer CCL1, the second color conversion layer CCL2, and/or the light scattering layer LSL and each color filter CF, and on the surface of each of the first color conversion layer CCL1, the second color conversion layer CCL2 and/or the light scattering layer LSL. In an embodiment, the first, second, and third color pixels PXL1, PXL2, and PXL3 may include light emitting elements LD to emit the same color of light. For example, the first, second, and third color pixels PXL1, PXL2, and PXL3 may include third color light emitting elements LD3 to emit a third color of light, for example, blue light, which belongs to a wavelength band ranging approximately 400 nm to approximately 500 nm. A color conversion layer CCL including at least one kind of color conversion particles may be disposed on at least some or a part of pixels PXL of the first, second, and third color pixels PXL1, PXL2, and PXL3. The display device in accordance with an embodiment may display a full-color image.

The first color conversion layer CCL1 may be disposed on one surface or a surface of the upper substrate ENC to face the first color pixel PXL1, and include first color conversion particles which convert a third color of light emitted from the third color light emitting elements LD3 disposed in the first color pixel PXL1 to a first color of light. For example, in the case where the third color light emitting elements LD3 disposed in the first color pixel PXL1 are blue light emitting elements to emit blue light and the first color pixel PXL1 is a red pixel, the first color conversion layer CCL1 may include red quantum dots QDr which convert blue light emitted from the blue light emitting elements to red light.

For example, the first color conversion layer CCL1 may include red quantum dots QDr which are dispersed in matrix material such as transparent resin. The red quantum dot QDr may absorb blue light and shift the wavelength of light according to an energy transition, thus emitting red light having a wavelength band ranging from 620 nm to 780 nm. In the case where the first color pixel PXL1 is one of pixels having other colors, the first color conversion layer CCL1 may include first quantum dots corresponding to the color of the first color pixel PXL1.

In an embodiment, the second color conversion layer CCL2 may be disposed on one surface or a surface of the upper substrate ENC to face the second color pixel PXL2, and include second color conversion particles which convert a third color of light emitted from the third color light emitting elements LD3 disposed in the second color pixel PXL2 to a second color of light. For example, in the case where the third color light emitting elements LD3 disposed in the second color pixel PXL2 are blue light emitting elements to emit blue light and the second color pixel PXL2 is a green pixel, the second color conversion layer CCL2 may include green quantum dots QDg which convert blue light emitted from the blue light emitting elements to green light.

For example, the second color conversion layer CCL2 may include green quantum dots QDg which are distributed in matrix material such as transparent resin. The green quantum dot QDg may absorb blue light and shift the wavelength of light according to an energy transition, thus emitting green light having a wavelength band ranging from 500 nm to 570 nm. In the case where the second color pixel PXL2 is one of pixels having other colors, the second color conversion layer CCL2 may include second quantum dots corresponding to the color of the second color pixel PXL2.

Each of the first and second quantum dots (for example, red and green quantum dots QDr and QDg) may be selected from among a group II-VI compound, a group III-V compound, a group IV-VI compound, a group IV element, a group IV compound, and a combination thereof.

A group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

The first and second quantum dots may have a full width of half maximum (FWHM) of an emission wavelength spectrum of about 45 nm or less, and light emitted through the first and second quantum dots may be emitted in all directions. The viewing angle of the display device may be enhanced.

Each of the first and second quantum dots may be in the form of a nanoparticle, a nanotube, a nanowire, nanofiber, a planar nanoparticle having a spherical shape, a pyramid shape, a multi-arm shape, or a cubic shape, but it is not limited thereto. In other words, the shapes of the first and second quantum dots may be changed in various ways.

In an embodiment, in case that blue light having a comparatively short wavelength in a visible ray area is incident on each of the red and green quantum dots QDr and QDg, the absorption coefficient of the red and green quantum dots QDr and QDg may be increased. Thereby, eventually, the efficiency of light emitted from each of the first color pixels PXL1 and the second color pixels PXL2 may be enhanced, and satisfactory color reproducibility may be secured. Furthermore, since the same color light emitting elements LD are used to form the light source units LSU of the first, second, and third color pixels PXL1, PXL2, and PXL3, the efficiency at which the display device is manufactured may be enhanced.

In an embodiment, the light scattering layer LSL may be disposed on one surface or a surface of the upper substrate ENC to face the third color pixel PXL3. For example, the light scattering layer LSL may be disposed between the third color pixel PXL3 and the third color filter CF3.

In an embodiment, in case that the third color light emitting element LD3 disposed in the third color pixel PXL3 is a blue light emitting element to emit blue light and the third color pixel PXL3 is a blue pixel, the light scattering layer LSL may be selectively provided to efficiently use light emitted from the third color light emitting element LD3. The light scattering layer LSL may include at least one kind of light scattering particles SCT.

For example, the light scattering layer LSL may include light scattering particles SCT which are distributed in matrix material such as transparent resin. For example, the light scattering layer LSL may include light scattering particles SCT such as titanium dioxide ($TiO_2$) or silica. In the disclosure, the material of the light scattering particles SCT is not particularly limited, and the light scattering layer LSL may be formed of various materials. Here, the light scattering particles SCT may be disposed in areas other than the third pixel area PXA3 in which the third color pixel PXL3 is formed. For example, the light scattering particles SCT may also be selectively included in the first and/or second color conversion layer CCL1 and/or CCL2.

Figure 11B:
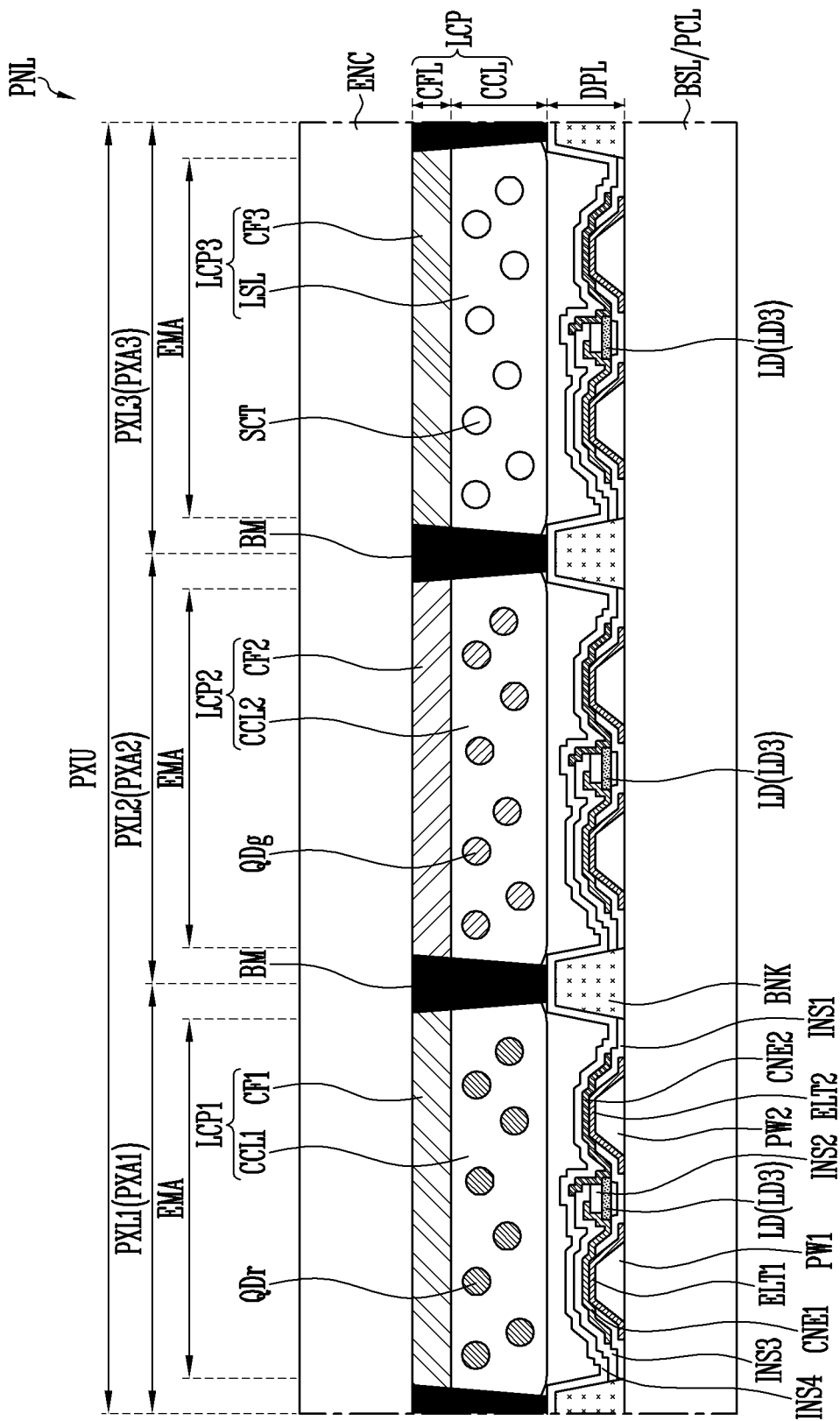

Referring to FIG. 11B, the black matrix BM may extend in at least the thickness (or height) direction so that the black matrix BM can also be disposed between the first color conversion layer CCL1, the second color conversion layer CCL2, and the light scattering layer LSL. For example, the black matrix BM may extend in at least the thickness direction to have a thickness (for example, a thickness substantially identical or similar to the entire thickness of the light conversion layer LCP) corresponding to the entire thickness of the light conversion layer LCP including the color filter layer CFL and the color conversion layer CCL.

In an embodiment, the black matrix BM may be disposed between the first color conversion layer CCL1, the second color conversion layer CCL2, and the light scattering layer LSL in such a way that the black matrix BM defines areas in which the first color conversion layer CCL1, the second color conversion layer CCL2, and the light scattering layer LSL are formed. The first color conversion layer CCL1, the second color conversion layer CCL2, and/or the light scattering layer LSL may be formed by an inkjet scheme or the like within the spirit and the scope of the disclosure. For example, the color conversion layer CCL may be formed by forming the black matrix BM on one surface or a surface of the upper substrate ENC before the first color conversion layer CCL1, the second color conversion layer CCL2, and the light scattering layer LSL are formed, and thereafter, applying the first color conversion layer CCL1, the second color conversion layer CCL2, and/or the light scattering layer LSL onto the one surface or a surface of the upper substrate ENC on which the black matrix BM is formed.

Figure 11C:
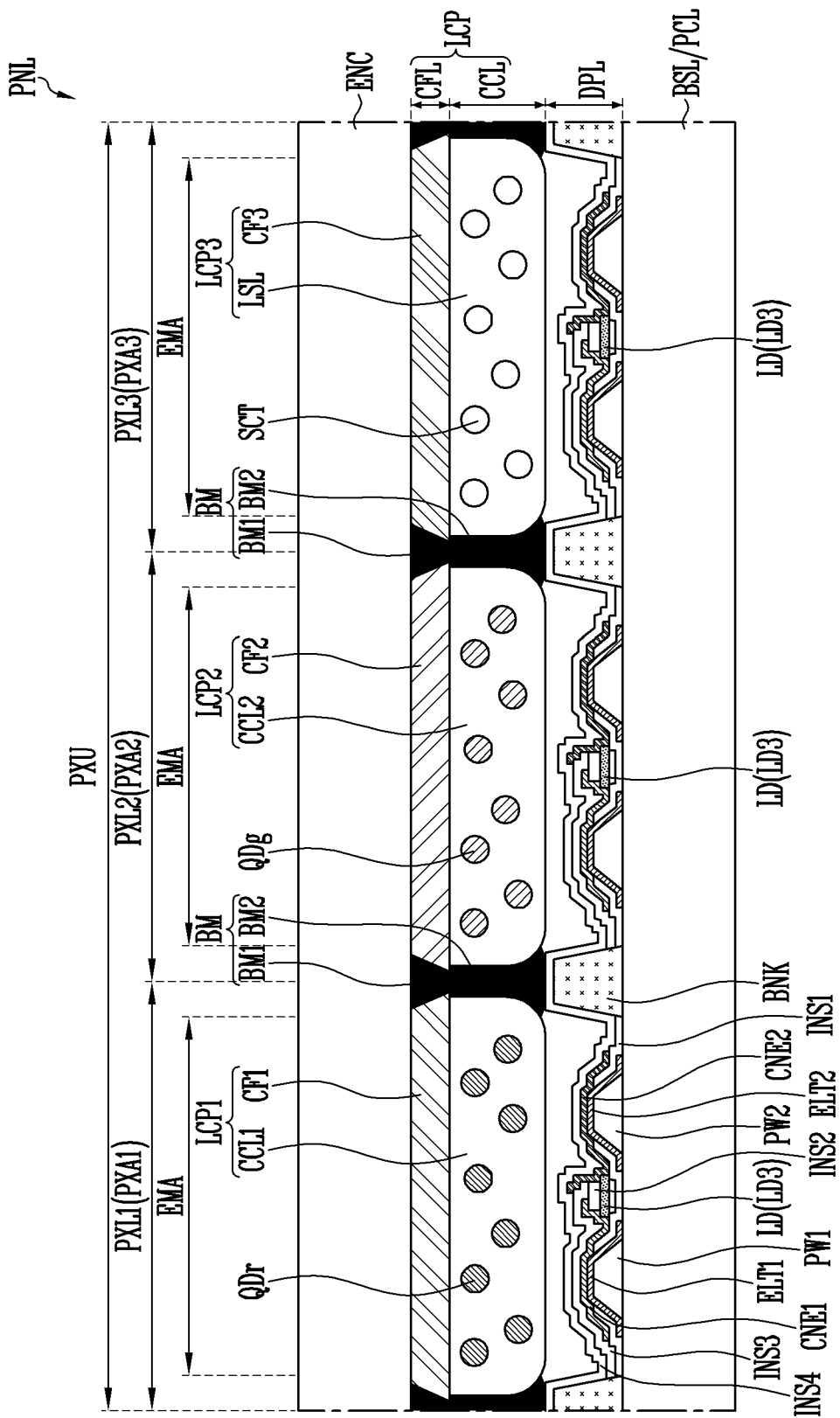

Referring to FIG. 11C, the black matrix BM may have a multilayer structure including a first black matrix BM1 disposed in the color filter layer CFL, and a second black matrix BM2 disposed in the color conversion layer CCL. In other words, in an embodiment, the black matrix BM may have an integrated or separated structure in the light conversion layer LCP.

In an embodiment, the second black matrix BM2 may be formed before or after the first color conversion layer CCL1, the second color conversion layer CCL2, and/or the light scattering layer LSL are formed. In an embodiment, in the case where the second black matrix BM2 is formed after the first color conversion layer CCL1, the second color conversion layer CCL2, and the light scattering layer LSL are formed on one surface or a surface of the upper substrate ENC, the second black matrix BM2 may have a shape corresponding to the first color conversion layer CCL1, the second color conversion layer CCL2, and the light scattering layer LSL, and be interposed between the first color conversion layer CCL1, the second color conversion layer CCL2, and the light scattering layer LSL.

In accordance with embodiments of FIGS. 11A to 11C, pixels PXL and a display device including the same may be readily fabricated using single-color light emitting elements LD (for example, the third color light emitting elements LD3). Furthermore, since the color conversion layer CCL is disposed on at least some or a part of pixels PXL, a full-color pixel unit PXU and a display device including the same may be fabricated.

Figure 12:
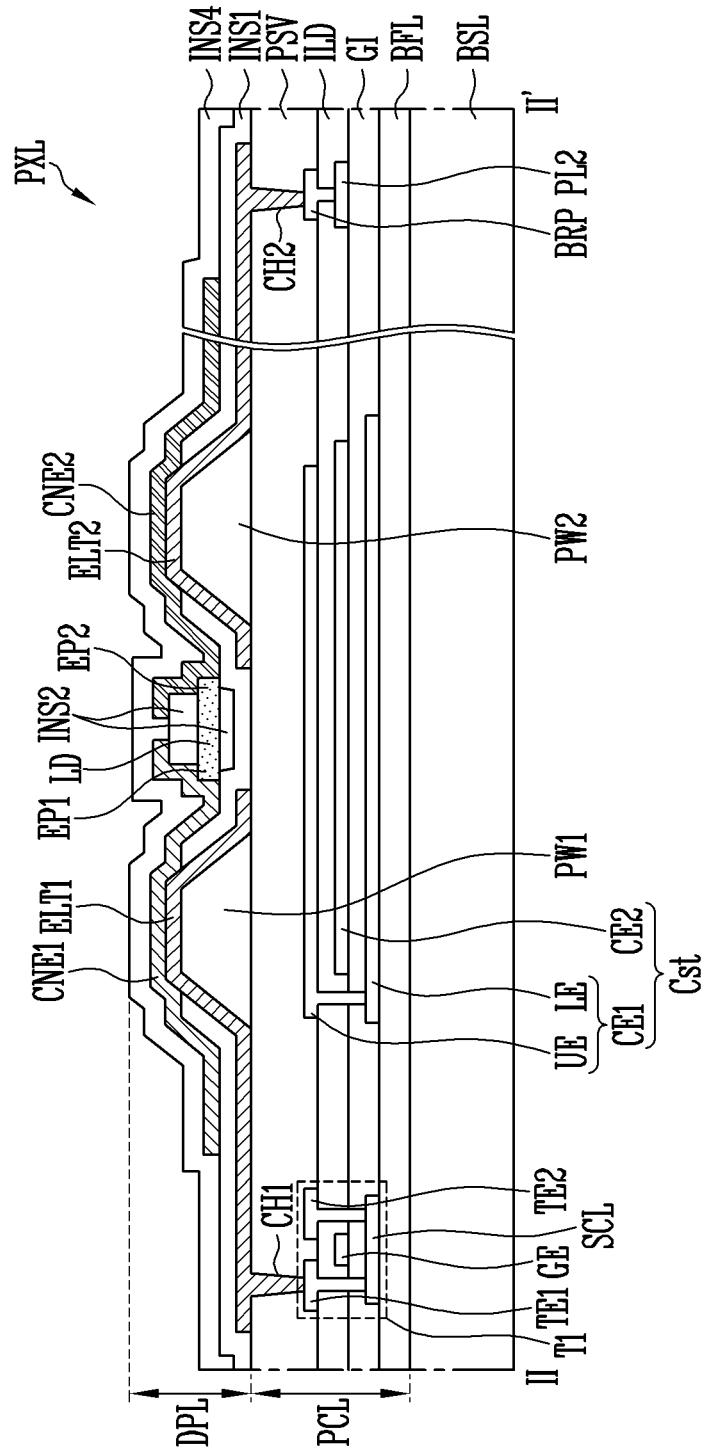
FIG. 12 is a schematic cross-sectional view illustrating a pixel in accordance with an embodiment.
Figure 13:
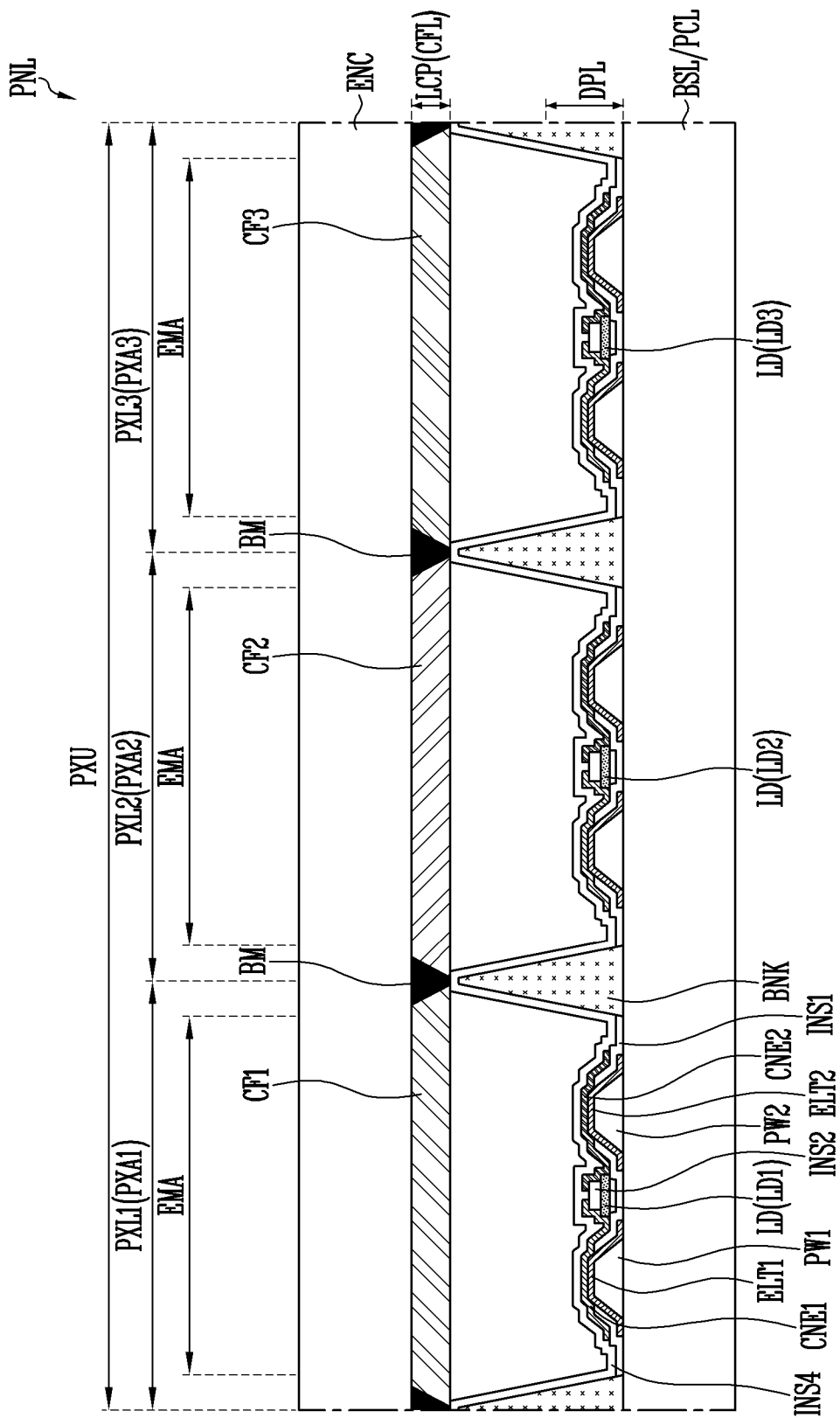
FIGS. 13 and 14 are schematic cross-sectional views each illustrating a display device in accordance with an embodiment.
Figure 14:
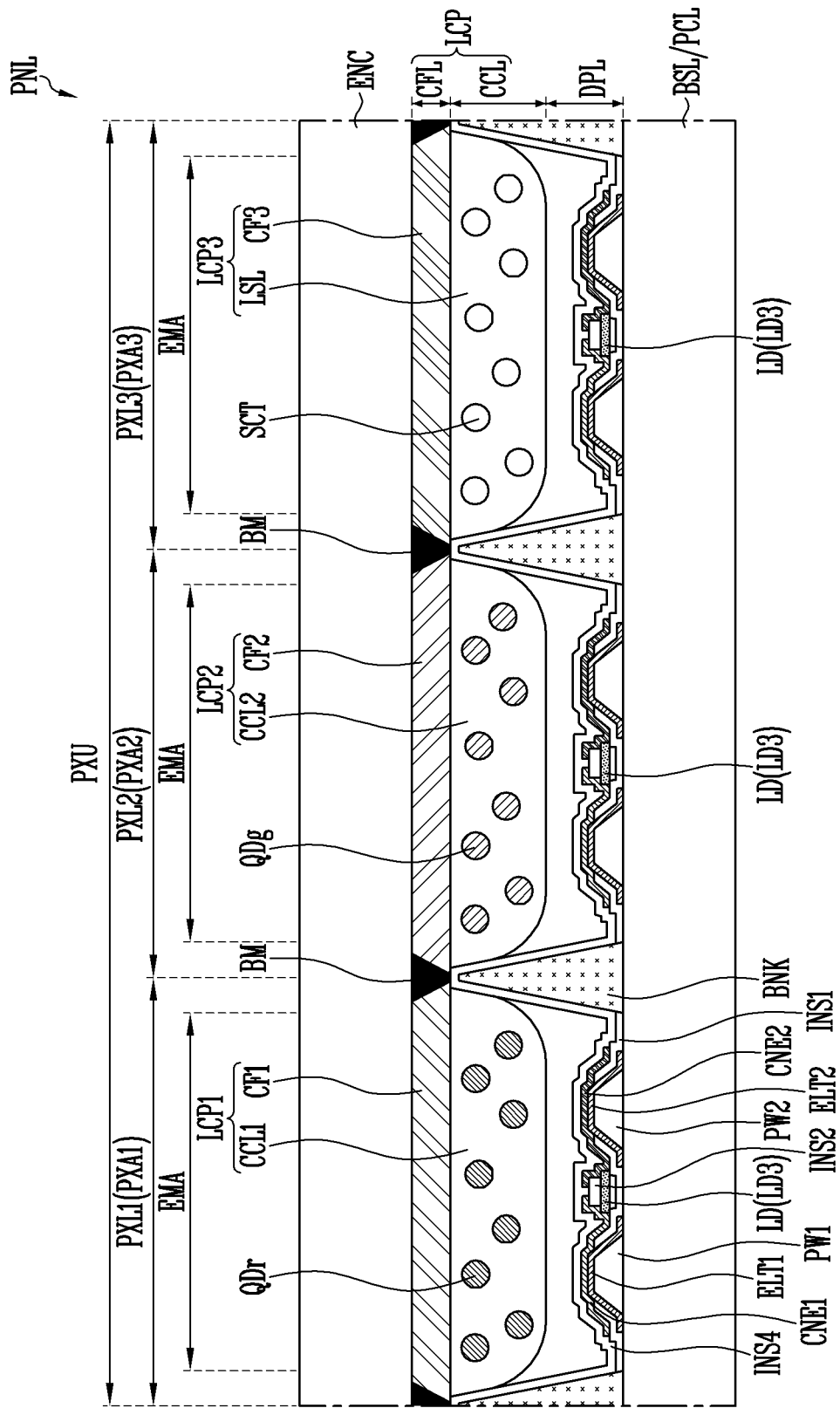

FIG. 12 is a schematic cross-sectional view illustrating a pixel PXL in accordance with an embodiment and for example illustrates an embodiment of a cross-section corresponding to line II-II' of FIG. 7. FIGS. 13 and 14 are schematic cross-sectional views each illustrating a display device in accordance with an embodiment, and for example illustrate different embodiments of a cross-section of one area or an area of the display panel PNL including the pixel PXL in accordance with the embodiment of FIG. 12. Although FIGS. 13 and 14 each illustrate an upper plate of the display panel PNL in accordance with the embodiment of FIGS. 10 and 11A, the structure of the upper plate may be changed in various ways. For example, the upper plate may include the black matrix BM disposed between the first color conversion layer CCL1, the second color conversion layer CCL2, and the light scattering layer LSL, as shown in the embodiment of FIG. 11B or 11C. In the description of the embodiments of FIGS. 12 to 14, like reference numerals are used to designate components similar or equal to those of the above-described embodiments (for example, the embodiments of FIGS. 8A to 11A to 11C), and detailed descriptions thereof will be omitted.

Referring to FIGS. 12 to 14, the third insulating layer INS3 shown in FIGS. 9 to 11A to 11C may be omitted depending on embodiments. For example, the first contact electrode CNE1 may be covered with or overlapped by or directly covered with or overlapped by the fourth insulating layer INS4 without forming the third insulating layer INS3 on the first contact electrode CNE1. Compared to the embodiments of FIGS. 8A to 11A to 11C, a mask process of forming the third insulating layer INS3 may be omitted so that the fabricating process may be further simplified. Furthermore, since the third insulating layer INS3 is not formed, the light efficiency of each pixel PXL may be enhanced. For example, in the case where the third insulating layer INS3 is not disposed on a path along which light generated from the light emitting elements LD is emitted out of each pixel PXL, the amount of light that is confined within an optical waveguide formed by the transparent electrodes and/or the insulating layers disposed in the pixels PXL and thus dissipates rather than being emitted out of the pixels PXL may be reduced. Hence, the amount of light that is emitted from each pixel PXL within a view angle (for example, a view angle ranging from about 0° to about ±180°) range having an angle including a frontal direction of the display panel PNL (for example, a direction belong to a view angle range from about 0° to about ±2° based on a normal direction perpendicular to the display panel PNL) is increased, so that the light efficiency of each pixel PXL can be enhanced compared to that of the structure including the third insulating layer INS3.

FIGS. 15A to 15I are schematic cross-sectional views illustrating a method of fabricating a display device in accordance with an embodiment and for example illustrate an embodiment of a method of fabricating a display device including the pixel PXL of FIG. 12.

Referring to FIGS. 12 to 15A, the pixel circuit layer PCL is formed in each pixel area PXA on the base layer BSL, and the first partition wall PW1 and the second partition wall PW2 that are spaced apart from each other may be formed in each pixel area PXA on the base layer BSL in which the pixel circuit layer PCL is formed. Here, in the case where the pixel circuit layer PCL is omitted, the first partition wall PW1 and the second partition wall PW2 may be formed on or directly formed on one surface or a surface of the base layer BSL (or the base layer BSL on which the buffer layer BFL is formed).

In an embodiment, the first and second partition walls PW1 and PW2 may be formed by a process of forming an insulating layer including an inorganic material and/or an organic material and/or a patterning process (for example, a photolithography process), and may be formed through various types of processes. In an embodiment, the first and second partition walls PW1 and PW2 may be simultaneously formed using identical material on an identical layer (or an identical plane) on the base layer BSL, but the disclosure is not limited thereto.

Furthermore, there are formed a first contact hole CH1 for connecting a circuit element (for example, a first transistor T1 of each pixel PXL) disposed in the pixel circuit layer PCL and any one electrode of the display element layer DPL (for example, the first electrode ELT1 of each pixel PXL), and/or a second contact hole CH2 for connecting a line (for example, the second power line PL2) disposed in the pixel circuit layer PCL and another electrode of the display element layer DPL (for example, the second electrode ELT2 of each pixel PXL). In an embodiment, the first and second contact holes CH1 and CH2 may be formed before or after the first and second partition walls PW1 and PW2 are formed, or may be formed during at least one etching process of forming the first and second partition walls PW1 and PW2.

Figure 15A:
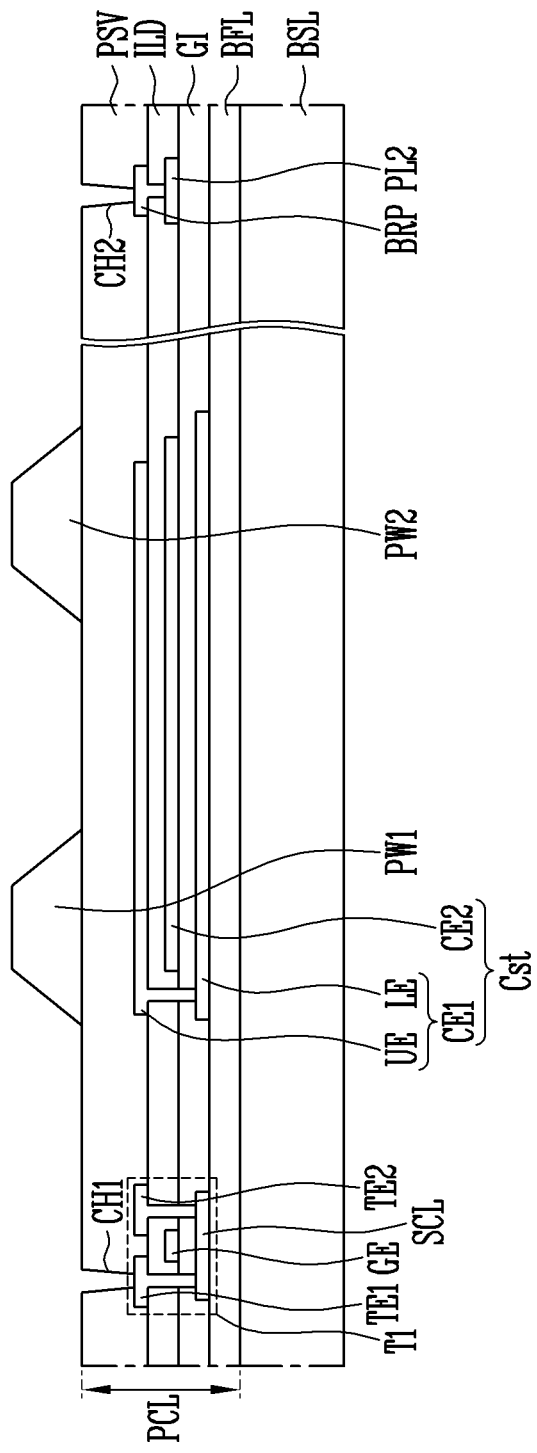
FIGS. 15A to 15I are schematic cross-sectional views illustrating a method of fabricating a display device in accordance with an embodiment.
Figure 15B:
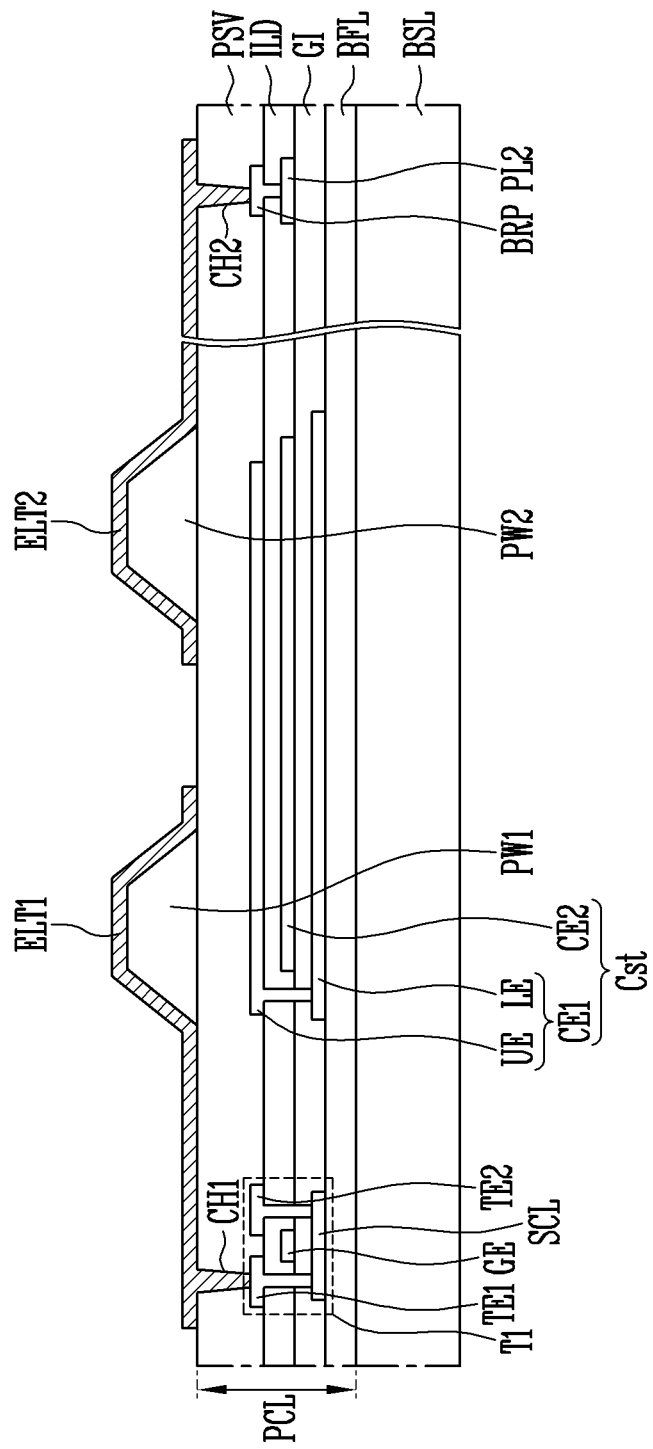

Referring to FIG. 15B, the first electrode ELT1 and the second electrode ELT2 are formed on the first partition wall PW1 and the second partition wall PW2. In an embodiment, the first and second electrodes ELT1 and ELT2 may be formed through a process of forming a conductive layer including at least one conductive material and/or a patterning process, and may be formed through various types of processes. Each of the first and second electrodes ELT1 and ELT2 may be formed of a single layer or multiple layers. For example, each of the first and second electrodes ELT1 and ELT2 may be formed of a conductive pattern having a single layer structure, or a conductive pattern having a multilayer structure including a corresponding reflective electrode and a corresponding conductive capping layer. In an embodiment, the first and second electrodes ELT1 and ELT2 may be simultaneously formed using identical material on an identical layer (or an identical plane) on the base layer BSL, but the disclosure is not limited thereto.

Figure 15C:
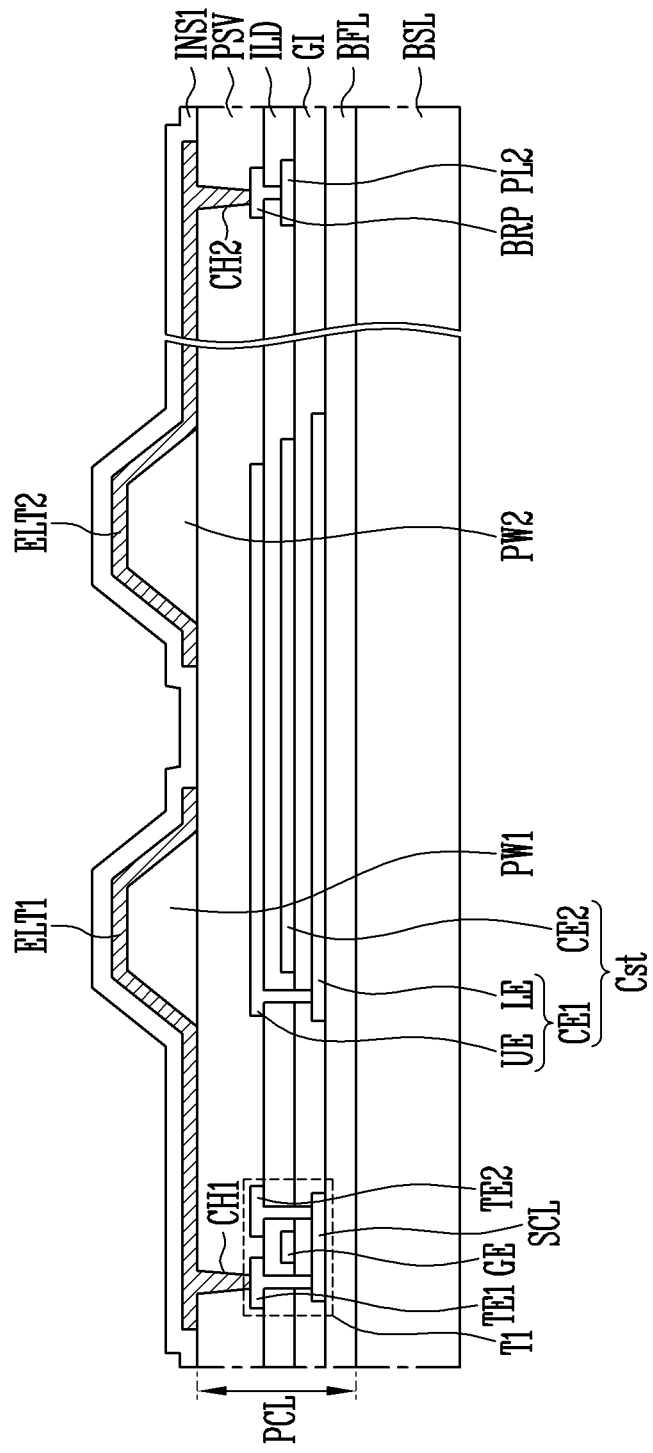

Referring to FIG. 15C, the first insulating layer INS1 is formed on the base layer BSL including the first and second electrodes ELT1 and ELT2. In an embodiment, the first insulating layer INS1 may be formed on one surface or a surface of the base layer BSL to cover or overlap at least the first and second electrodes ELT1 and ELT2.

In an embodiment, the first insulating layer INS1 may be formed through a deposition process of an insulating layer including an inorganic material and/or an organic material, and may be formed through various types of processes. In an embodiment, the pixels PXL may not include the first insulating layer INS1. A process of forming the first insulating layer INS1 may be omitted.

Figure 15D:
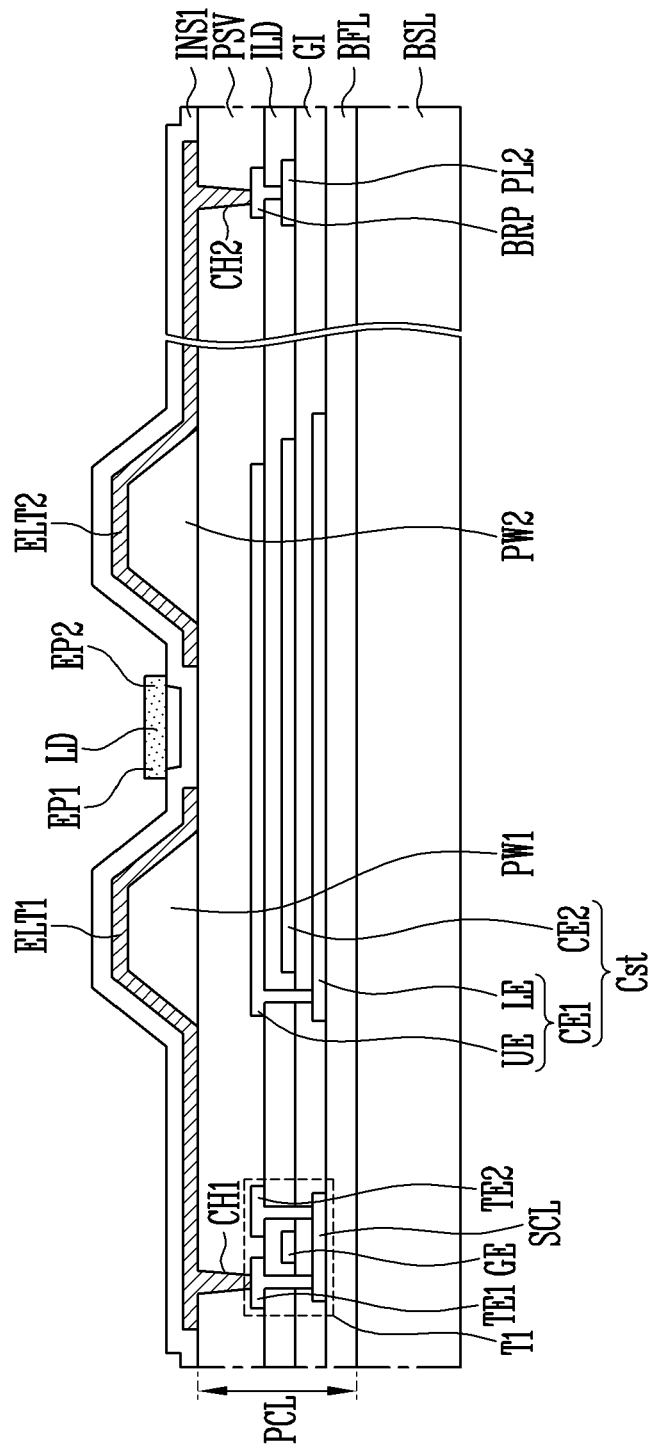

Referring to FIG. 15D, at least one light emitting element LD, for example, light emitting elements LD, may be supplied and aligned between the first electrode ELT1 and the second electrode ELT2 of each pixel PXL. For example, light emitting elements LD may be supplied to each pixel area PXA (for example, the emission area EMA of each pixel PXL) on the base layer BSL on which the first and second electrodes ELT1 and ELT2, the first insulating layer INS1, for example, are formed, and the light emitting elements LD may be aligned between the first and second electrodes ELT1 and ELT2 by applying alignment voltages to the first and second electrodes ELT1 and ELT2.

In an embodiment, the light emitting elements LD may be supplied to each pixel area PXA in such a way that a solution (also referred to as "light emitting element ink (LED ink)") in which light emitting elements LD are dispersed is applied to each emission area EMA of the base layer BSL through an inkjet printing scheme or a slit coating scheme, for example, within the spirit and the scope of the disclosure. However, the scheme of supplying the light emitting elements LD is not limited to the foregoing scheme, and the light emitting elements LD may be supplied to each pixel area PXA in various other ways.

In an embodiment, an electric field for self-alignment of the light emitting elements LD may be formed between the first and second electrodes ELT1 and ELT2 by supplying an AC alignment voltage or a constant voltage having a reference potential to each of the first and second electrodes ELT1 and ELT2. For example, the light emitting elements LD may be aligned between the first and second electrodes ELT1 and ELT2 of each pixel PXL by applying an AC alignment voltage to the second electrode ELT2 of each of the pixels PXL and supplying a constant voltage having a reference potential (for example, a ground potential) to the first electrode ELT1 of each of the pixels PXL.

In an embodiment, each light emitting element LD may be aligned between the first and second electrodes ELT1 and ELT2 of the corresponding pixel PXL in a horizontal direction. For example, the first end EP1 of each of the light emitting elements LD may be disposed to face the first electrode ELT1. The second end EP2 of each of the light emitting elements LD may be disposed to face the second electrode ELT2.

Figure 15E:
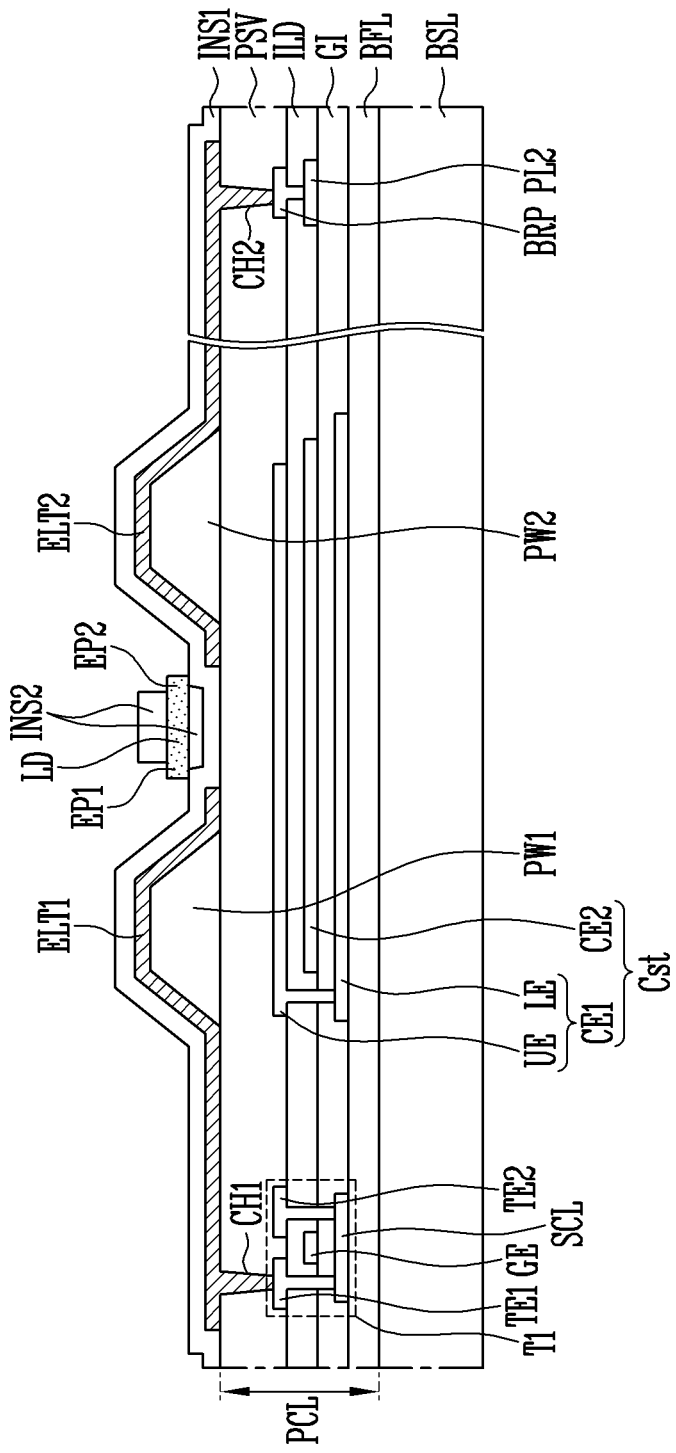

Referring to FIG. 15E, the second insulating layer INS2 is formed on the light emitting elements LD. In an embodiment, the second insulating layer INS2 may be formed through a deposition process of an insulating layer including an inorganic material and/or an organic material and a patterning process, and may be formed through various types of processes. For example, the second insulating layer INS2 may be formed over only an area other than the first and second ends EP1 and EP2 of the light emitting elements LD by depositing an insulating layer for forming the second insulating layer INS2 on the base layer BSL on which the light emitting elements LD are aligned, and patterning the insulating layer. As such, the second insulating layer INS2 may be formed so that the light emitting elements LD can be reliably fixed at the aligned positions. In an embodiment, the pixels PXL may not include the second insulating layer INS2. A process of forming the second insulating layer INS2 may be omitted.

Figure 15F:
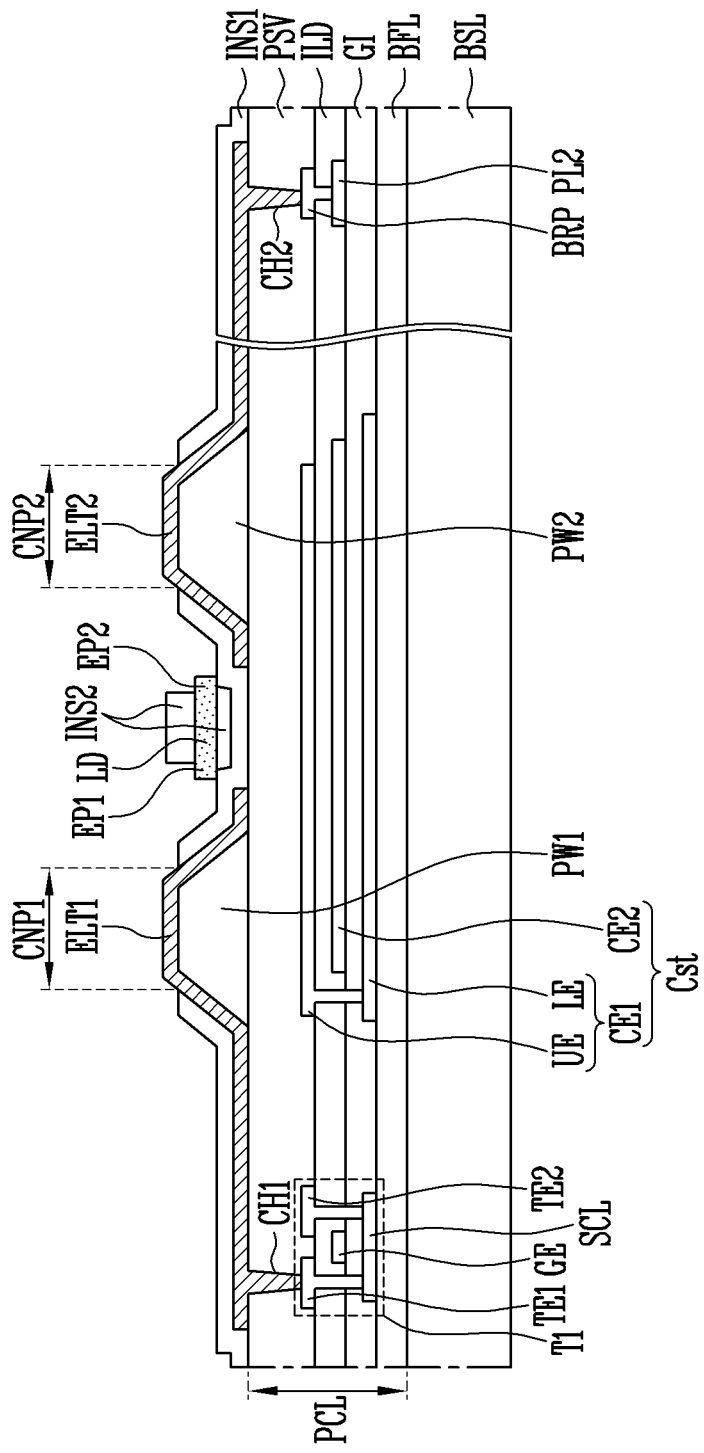

Referring to FIG. 15F, the first insulating layer INS1 is etched such that one area or an area of each of the first and second electrodes ELT1 and ELT2 is exposed. Thereby, the first contact portion CNP1 may be formed on the first electrode ELT1, and the second contact portion CNP2 may be formed on the second electrode ELT2. In an embodiment, the first contact portion CNP1 may refer to an area in which the first electrode ELT1 is exposed by partially removing the first insulating layer INS1, and refer to an area in which the first electrode ELT1 and the first contact electrode CNE1 to be formed through a subsequent process come into contact with each other. Likewise, the second contact portion CNP2 may refer to an area in which the second electrode ELT2 is exposed by partially removing the first insulating layer INS1, and refer to an area in which the second electrode ELT2 and the second contact electrode CNE2 to be formed through a subsequent process come into contact with each other.

Figure 15G:
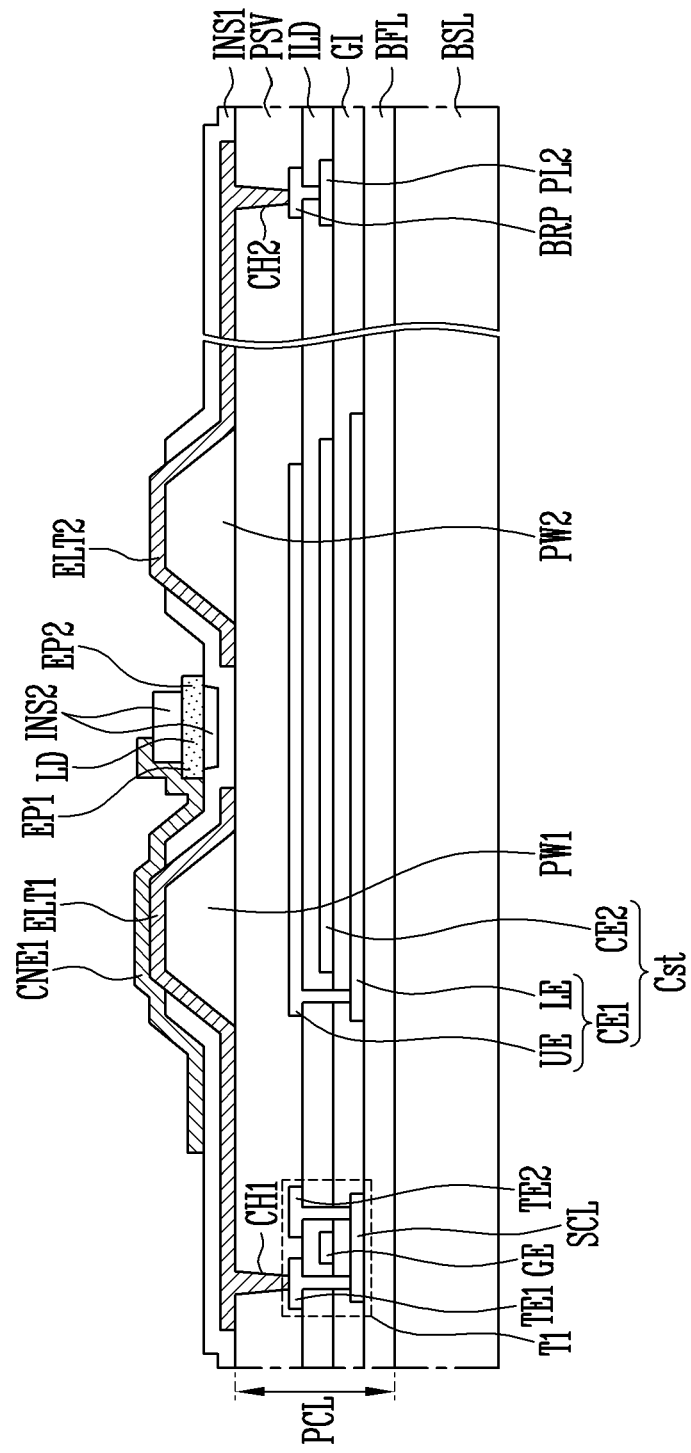
Figure 15H:
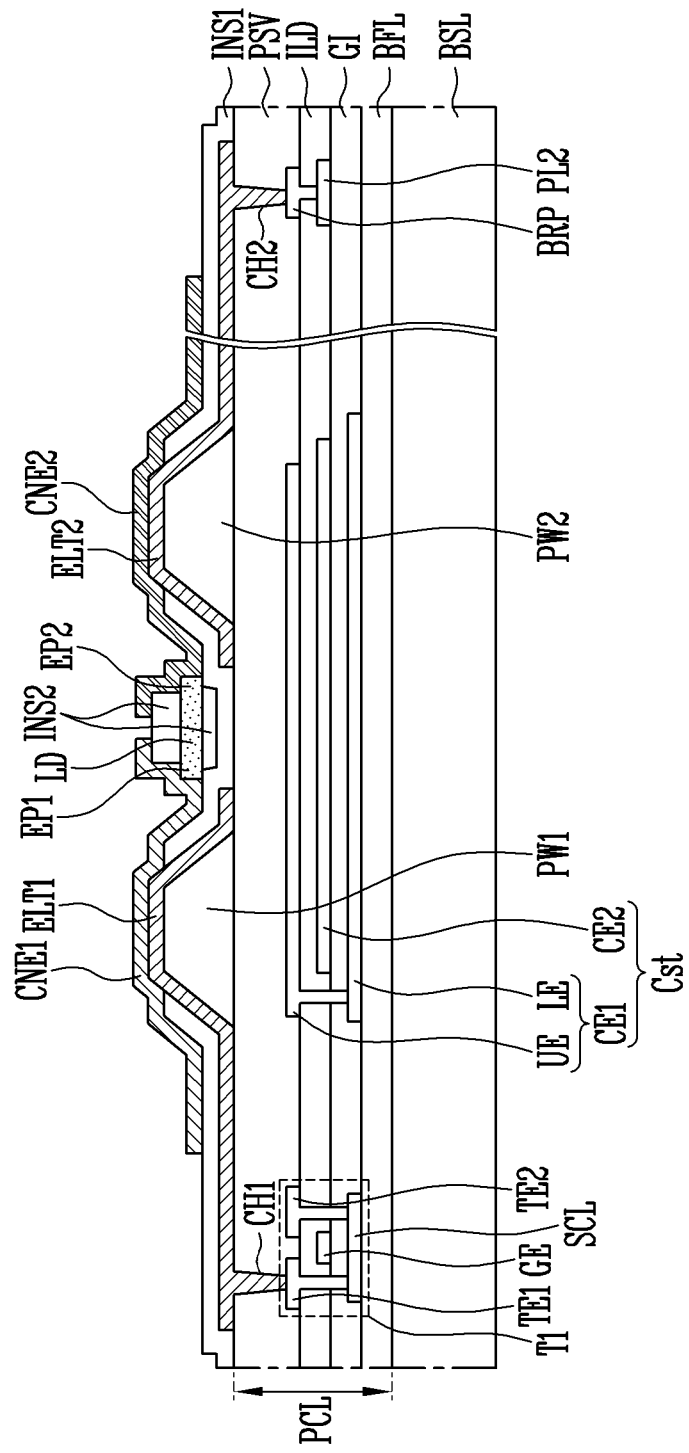

Referring to FIGS. 15G and 15H, the first contact electrode CNE1 is formed on the first ends EP1 of the light emitting elements LD and the first electrode ELT1, and the second contact electrode CNE2 is formed on the second ends EP2 of the light emitting elements LD and the second electrode ELT2. For example, the first contact electrode CNE1 may be formed to cover or overlap at least one area or an area of the first electrode ELT1 including the first contact portion CNP1 and the first ends EP1 of the light emitting elements LD. The second contact electrode CNE2 may be formed to cover or overlap at least one area or an area of the second electrode ELT2 including the second contact portion CNP2 and the second ends EP2 of the light emitting elements LD. Since the first and second contact electrodes CNE1 and CNE2 are formed, the first end EP1 of each of the light emitting elements LD may be connected to the first electrode ELT1, and the second end EP2 of each of the light emitting elements LD may be connected to the second electrode ELT2.

In an embodiment, the first and second contact electrodes CNE1 and CNE2 may be formed through different processes. However, the disclosure is not limited thereto. For example, in an embodiment, the first and second contact electrodes CNE1 and CNE2 may be simultaneously formed.

In an embodiment, the first and second contact electrodes CNE1 and CNE2 may be formed through a process of forming a conductive layer including at least one identical or different conductive materials and/or a patterning process, and may be formed through various types of processes. In an embodiment, each of the first and second contact electrodes CNE1 and CNE2 may be formed to be substantially transparent using at least one transparent electrode material. Hence, light emitted from the light emitting elements LD through the first and second ends EP1 and EP2 may pass through the first and second contact electrodes CNE1 and CNE2.

Figure 15I:
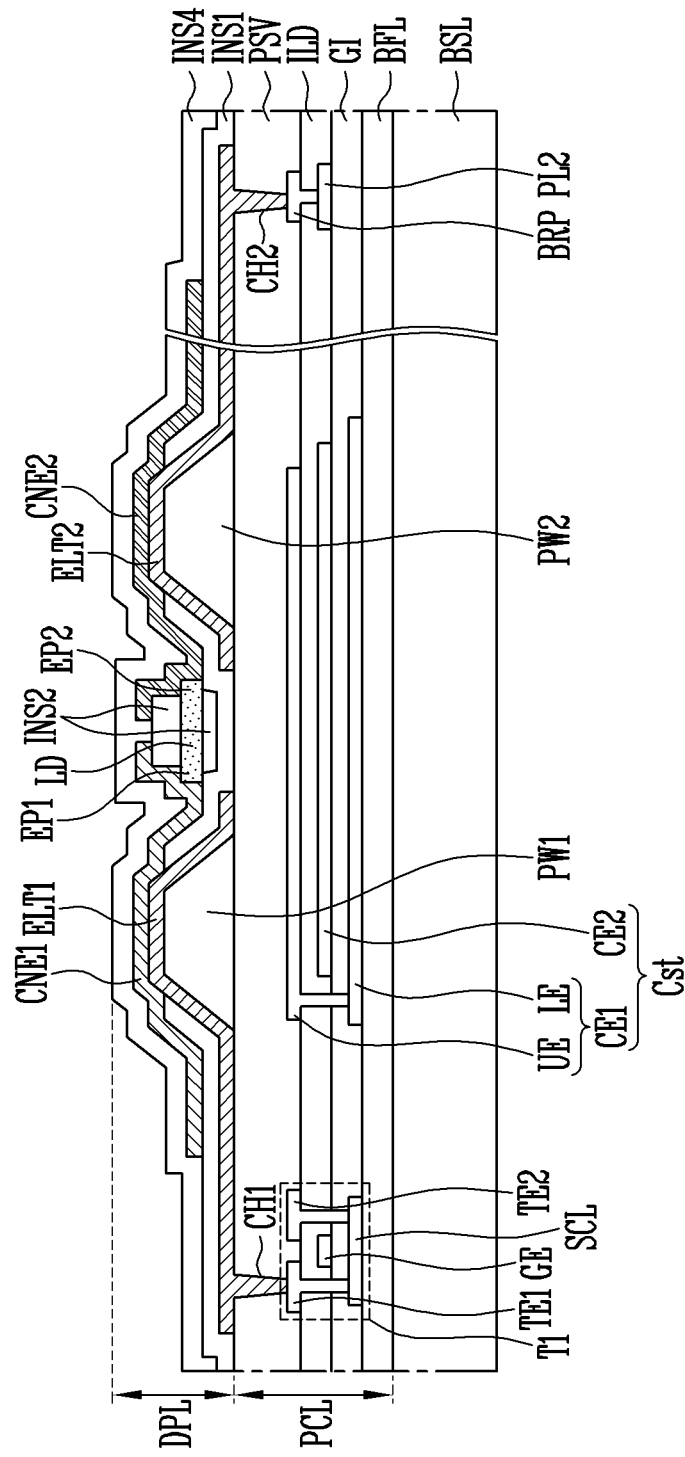

Referring to FIG. 15I, the fourth insulating layer INS4 is formed on one surface or a surface of the base layer BSL on which the first and second contact electrodes CNE1 and CNE2 are formed. Accordingly, the pixel PXL in accordance with the embodiment of FIG. 12 and the display device including the same (for example, the lower plate of the display panel PNL including the pixel PXL) may be fabricated. In an embodiment, the fourth insulating layer INS4 may be formed through a deposition process of at least one insulating layer including an inorganic material and/or an organic material, and may be formed through various types of processes.

After the pixels PXL are formed in the display area DA through the foregoing process, the upper plate of the display panel PNL in accordance with the embodiment of FIG. 13 or 14 may be selectively disposed on the pixels PXL.

Figure 16:
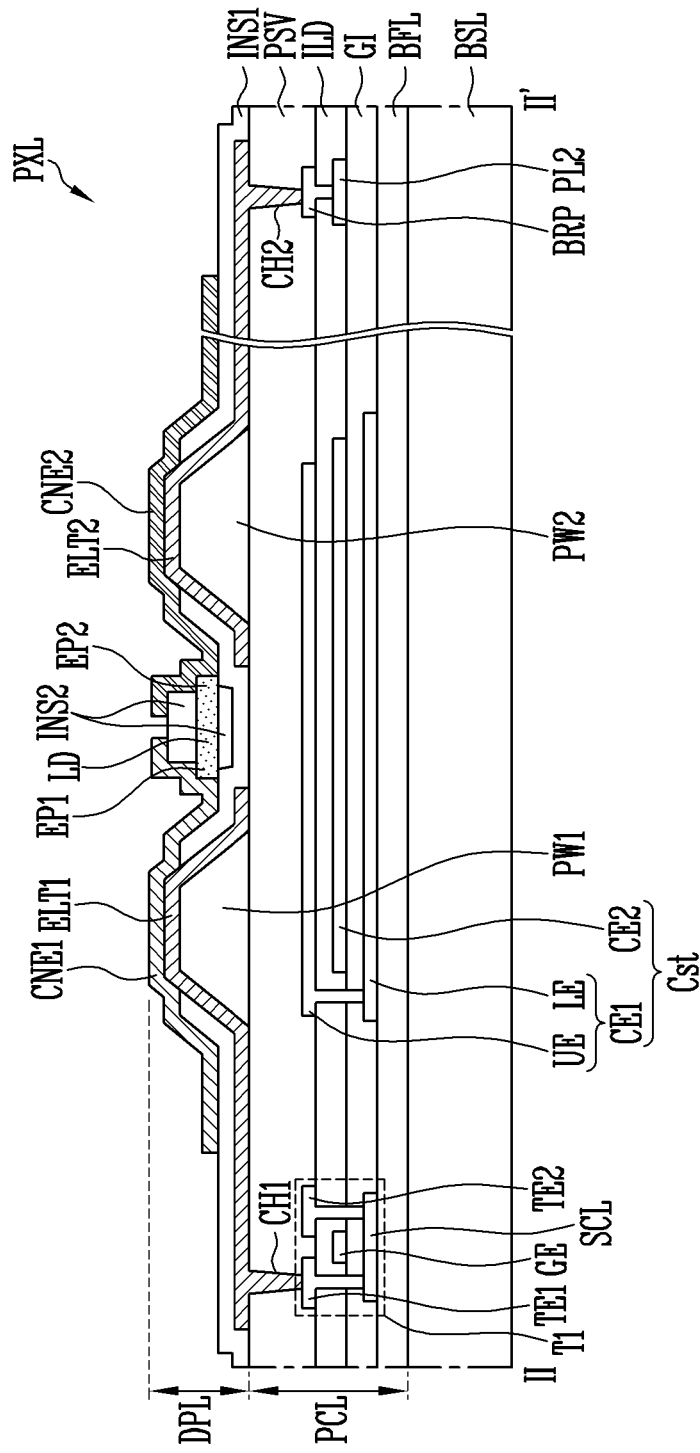
FIG. 16 is a schematic cross-sectional view illustrating a pixel in accordance with an embodiment.
Figure 17:
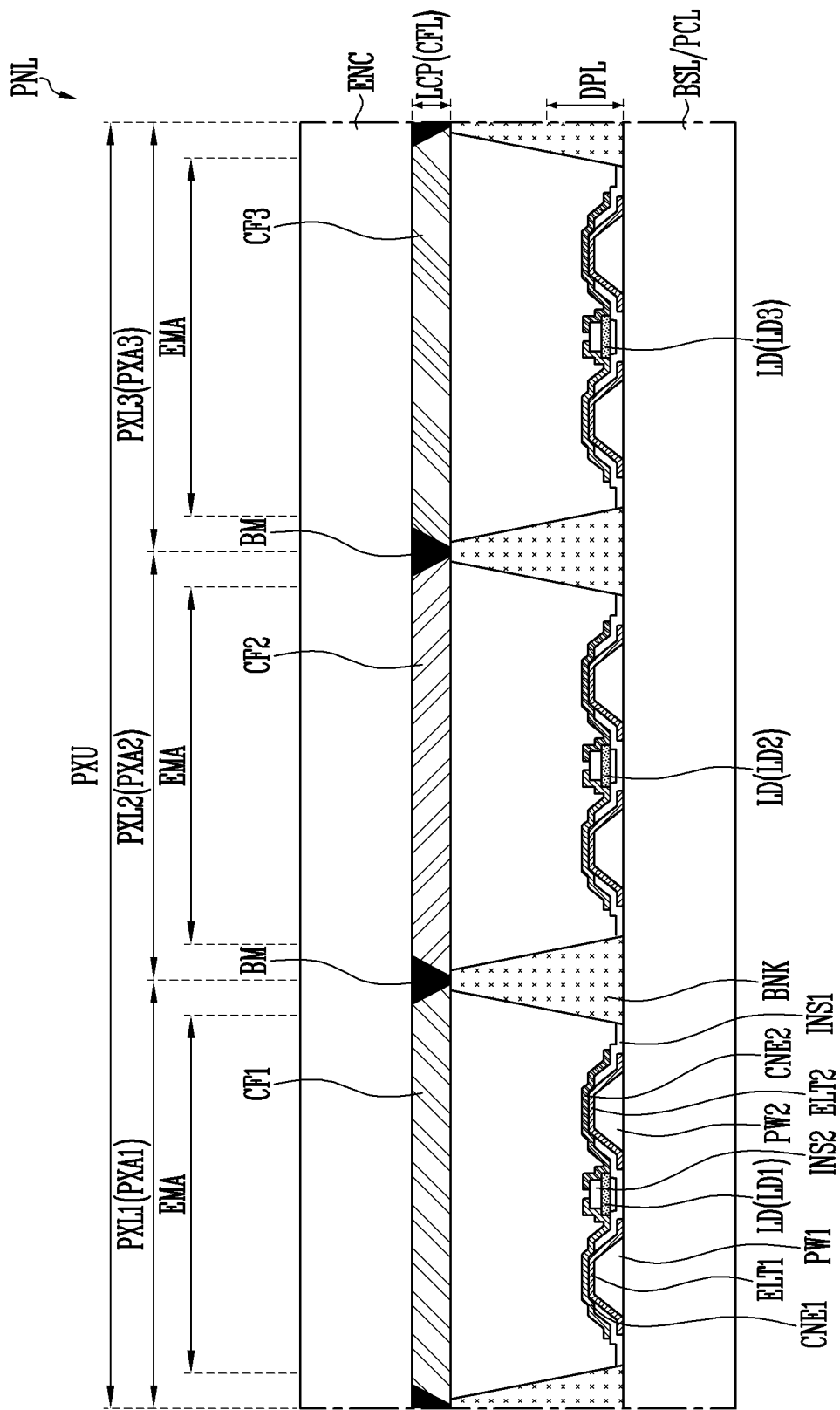
FIGS. 17 and 18 are schematic cross-sectional views each illustrating a display device in accordance with an embodiment.
Figure 18:
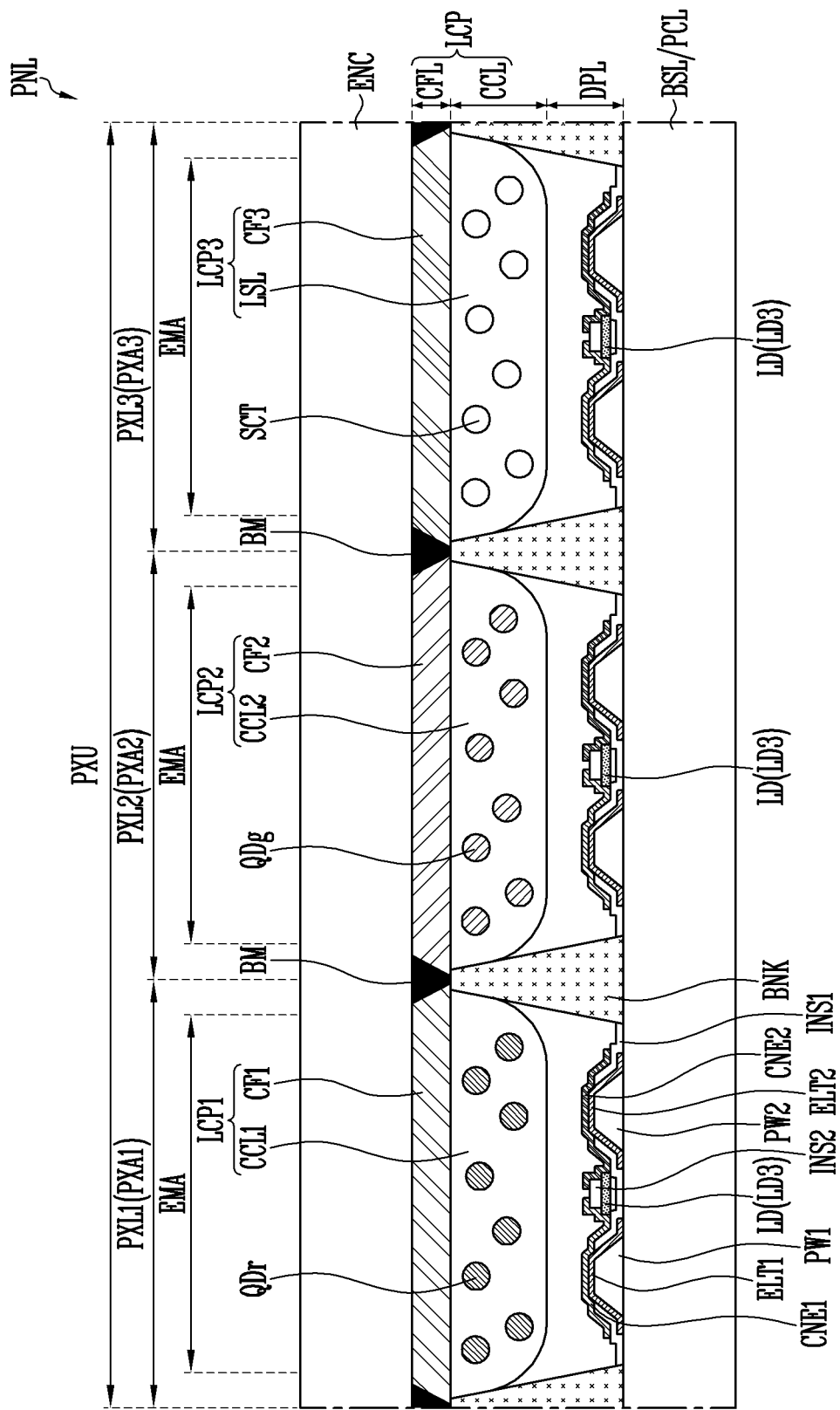

FIG. 16 is a schematic cross-sectional view illustrating a pixel PXL in accordance with an embodiment and for example illustrates an embodiment of a cross-section corresponding to line II-II' of FIG. 7. FIGS. 17 and 18 are schematic cross-sectional views each illustrating a display device in accordance with an embodiment, and for example illustrate different embodiments of a cross-section of one area or an area of the display panel PNL including the pixel PXL in accordance with the embodiment of FIG. 16. Although FIGS. 17 and 18 each illustrate an upper plate of the display panel PNL in accordance with the embodiment of FIGS. 10 and 11A, the structure of the upper plate may be changed in various ways. For example, the upper plate may include the black matrix BM disposed between the first color conversion layer CCL1, the second color conversion layer CCL2, and the light scattering layer LSL, as shown in the embodiment of FIG. 11B or 11C. In the description of the embodiments of FIGS. 16 to 18, like reference numerals will be used to designate components similar or equal to those of the previous embodiments, and detailed descriptions thereof will be omitted.

Referring to FIGS. 16 to 18, the fourth insulating layer INS4 shown in FIGS. 12 to 14 may also be omitted depending on embodiments. For example, the pixel PXL in accordance with the embodiments of FIGS. 16 to 18 and the display device including the pixel PXL may not include the fourth insulating layer INS4, unlike the pixel PXL in accordance with the embodiments of FIGS. 12 to 14 and the display device including the same, and may not include all of the third and fourth insulating layers INS3 and INS4, unlike the pixel PXL in accordance with the embodiments of FIGS. 8A to 11A to 11C and the display device including the same.

An additional mask process for forming the fourth insulating layer INS4 may be omitted, so that the fabricating process may be further simplified. Furthermore, since the fourth insulating layer INS4 is not formed, the light efficiency of each pixel PXL may be further enhanced. For example, in the case where all of the third and fourth insulating layers INS3 and INS4 are not disposed on a path along which light generated from the light emitting elements LD is emitted out of each pixel PXL, the amount of light that is confined within an optical waveguide formed by the transparent electrodes and/or the insulating layers disposed in the pixels PXL and thus dissipates rather than being emitted out of each pixel PXL may be further reduced. Hence, the amount of light that is emitted from each pixel PXL within a view angle (for example, a view angle ranging from about 0° to about ±180°) range having an angle including the frontal direction of the display panel PNL is increased, so that the light efficiency of each pixel PXL can be further enhanced compared to that of the structure including the third and/or fourth insulating layers INS3 and/or INS4.

In case that the fourth insulating layer INS4 is not provided, the upper substrate ENC or the like may be disposed over the pixels PXL so that the display area DA may be encapsulated. Hence, even in case that the fourth insulating layer INS4 is not included, the pixels PXL may be protected from external environment.

In an embodiment, the pixel PXL of FIG. 16 and the display device including the same (for example, the lower plate of the display panel PNL including the pixel PXL) may be fabricated through the process described with reference to FIGS. 15A to 15H. Therefore, detailed descriptions pertaining to this will be omitted.

Figure 19:
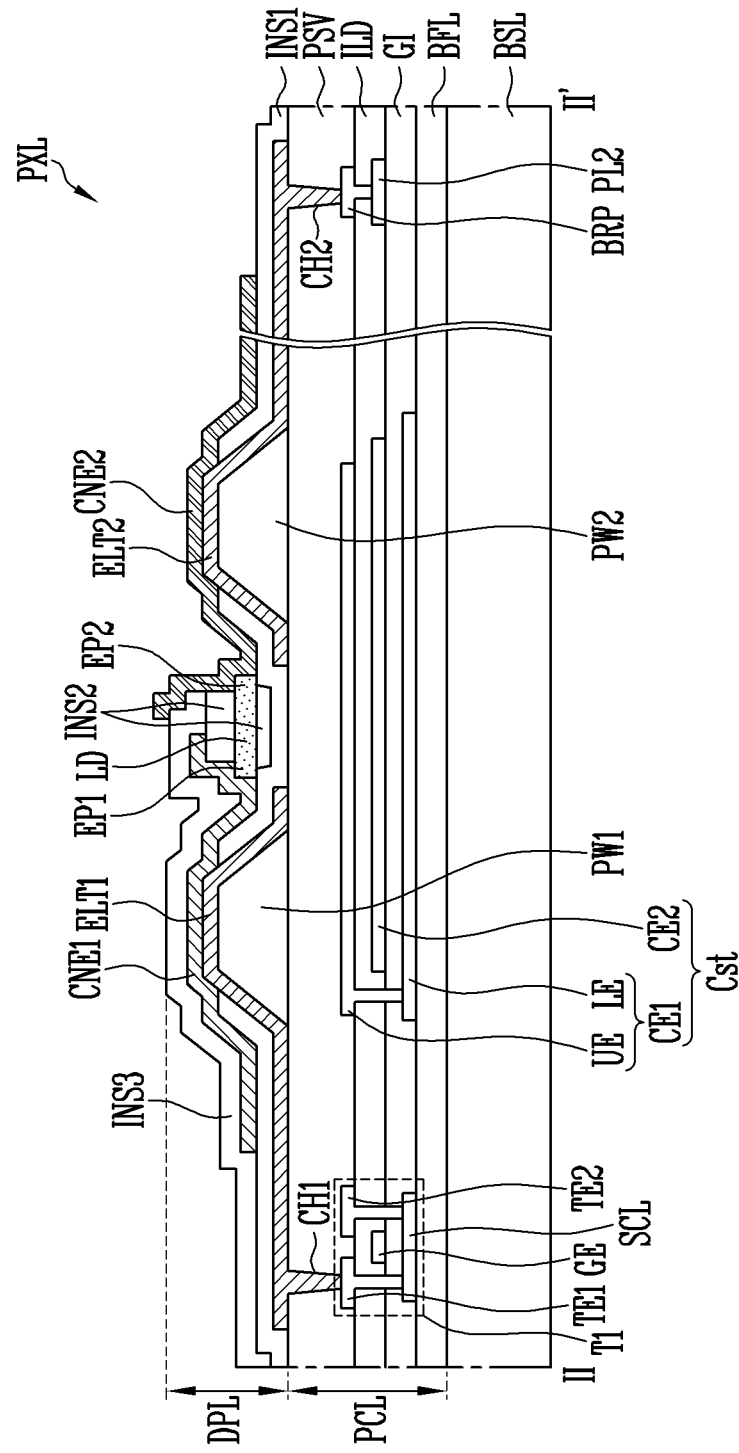
FIG. 19 is a schematic cross-sectional view illustrating a pixel in accordance with an embodiment.
Figure 20:
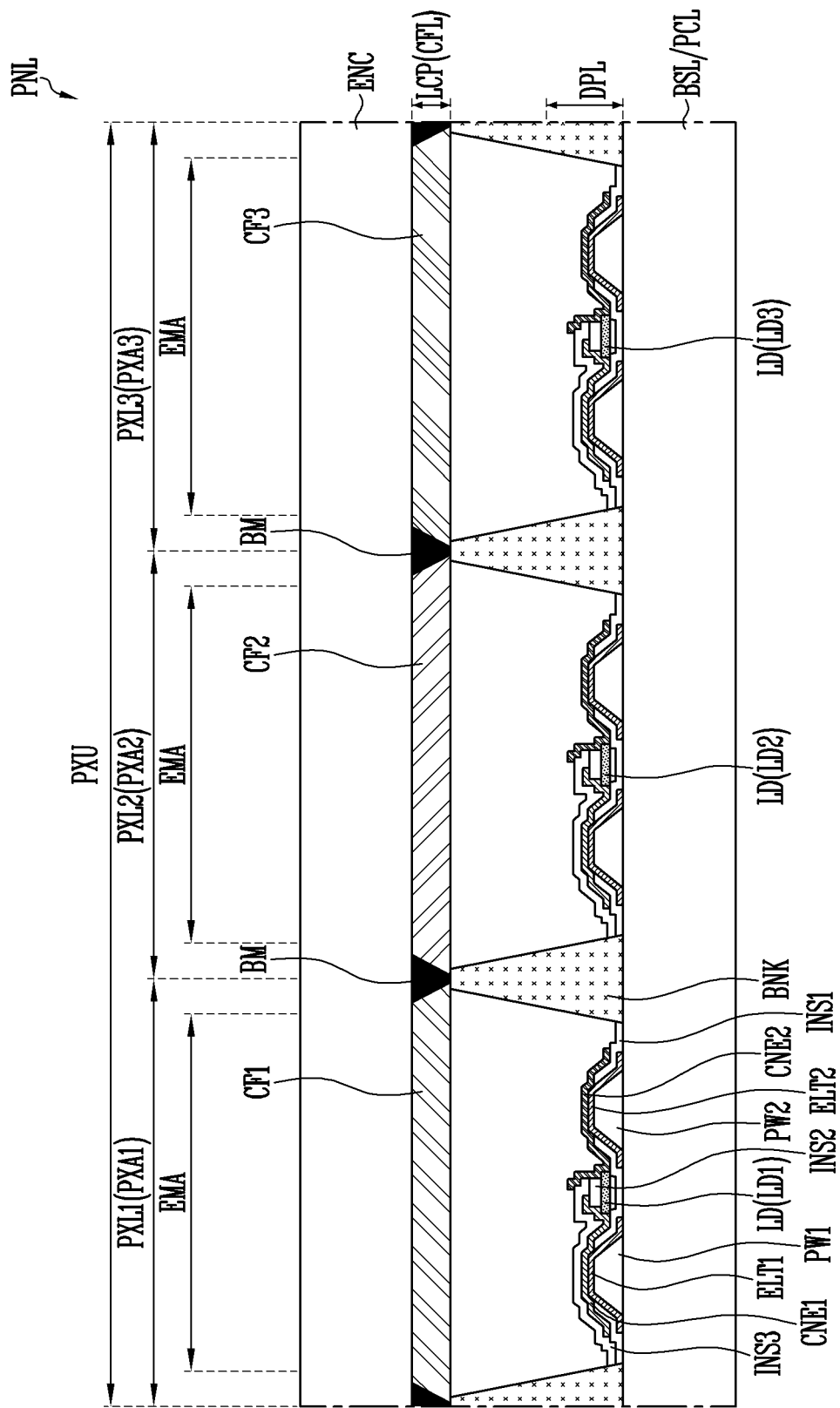
FIGS. 20 and 21 are schematic cross-sectional views each illustrating a display device in accordance with an embodiment.
Figure 21:
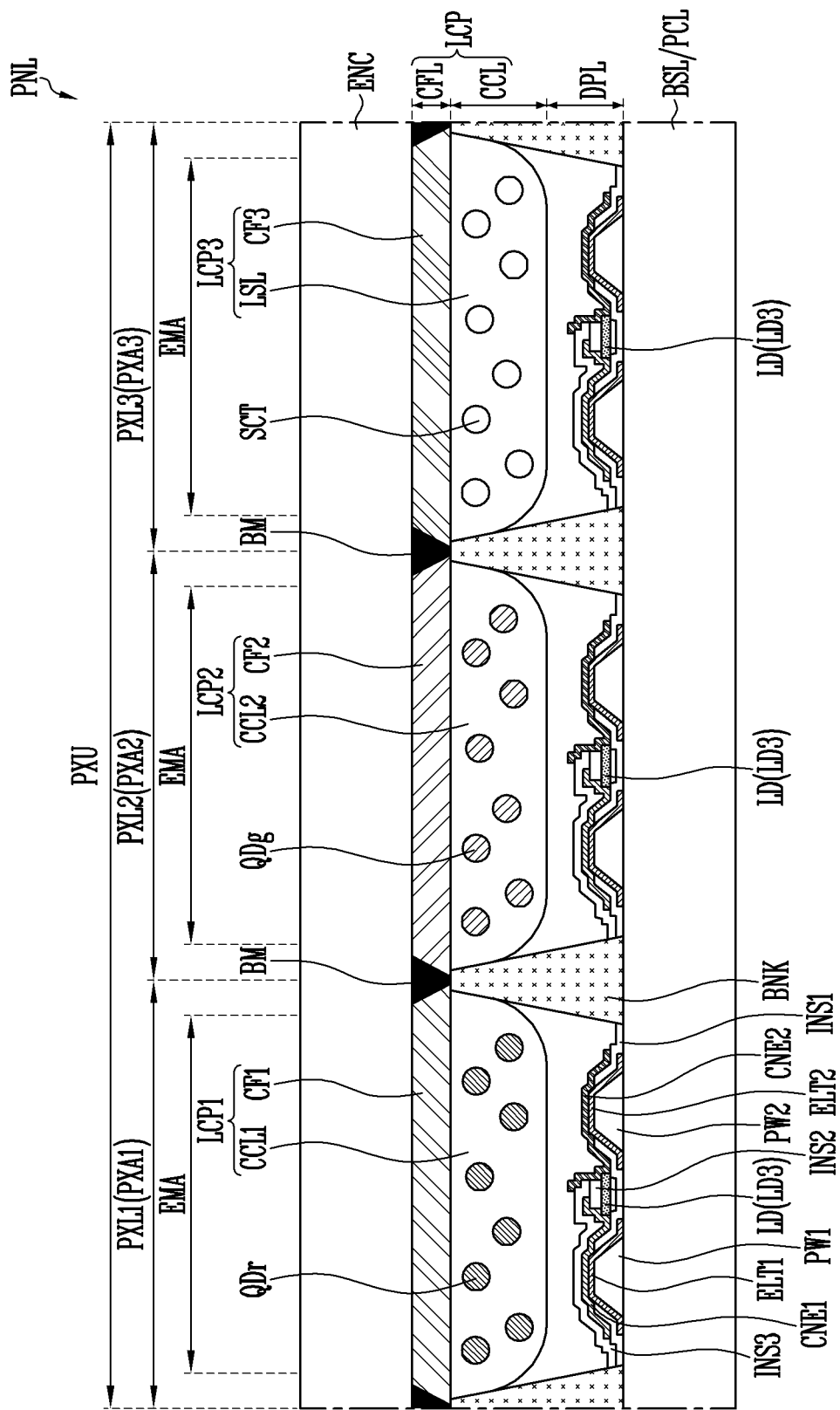

FIG. 19 is a schematic cross-sectional view illustrating a pixel PXL in accordance with an embodiment and for example illustrates an embodiment of a cross-section corresponding to line II-II' of FIG. 7. FIGS. 20 and 21 are schematic cross-sectional views each illustrating a display device in accordance with an embodiment, and for example illustrate different embodiments of a cross-section of one area or an area of the display panel PNL including the pixel PXL in accordance with the embodiment of FIG. 19. Although FIGS. 20 and 21 each illustrate an upper plate of the display panel PNL in accordance with the embodiment of FIGS. 10 and 11A, the structure of the upper plate may be changed in various ways. For example, the upper plate may include the black matrix BM disposed between the first color conversion layer CCL1, the second color conversion layer CCL2, and the light scattering layer LSL, as shown in the embodiment of FIG. 11B or 11C. In the description of the embodiments of FIGS. 19 to 21, like reference numerals will be used to designate components similar or equal to those of the previous embodiments, and detailed descriptions thereof will be omitted.

Referring to FIGS. 19 to 21, the fourth insulating layer INS4 shown in FIGS. 9 to 11A to 11C may be omitted depending on embodiments. For example, the display area DA may be encapsulated by disposing the upper substrate ENC or the like over the pixels PXL without forming the fourth insulating layer INS4 on the first and second contact electrodes CNE1 and CNE2. Hence, even in case that the fourth insulating layer INS4 is not included, the pixels PXL may be protected from external environment.

Compared to the embodiments of FIGS. 8A to 11A to 11C, a mask process of forming the fourth insulating layer INS4 may be omitted so that the fabricating process may be further simplified. Furthermore, since the fourth insulating layer INS4 is not formed, the light efficiency of each pixel PXL may be enhanced. For example, in the case where the fourth insulating layer INS4 is not disposed on a path along which light generated from the light emitting elements LD is emitted out of each pixel PXL, the amount of light that is confined within an optical waveguide formed by the transparent electrodes and/or the insulating layers disposed in each pixel PXL and thus dissipates rather than being emitted out of the pixels PXL may be reduced. Hence, the amount of light that is emitted from each pixel PXL within a view angle (for example, a view angle ranging from about 0° to about ±180°) range having an angle including the frontal direction of the display panel PNL is increased, so that the light efficiency of each pixel PXL can be enhanced compared to that of the structure including the fourth insulating layer INS4.

FIGS. 22A to 22G are schematic cross-sectional views illustrating a method of fabricating a display device in accordance with an embodiment and for example illustrate an embodiment of a method of fabricating a display device including the pixel PXL of FIG. 19. In the description of the embodiment of FIGS. 22A to 22G, like reference numerals are used to designate components similar or equal to those of the above-described embodiment (for example, the embodiment of FIGS. 15A to 15I), and detailed descriptions thereof will be omitted.

Referring to FIGS. 19 to 22A, the first and second partition walls PW1 and PW2, the first and second electrodes ELT1 and ELT2, and the first insulating layer INS1 are formed in each pixel area PXA on the base layer BSL on which the pixel circuit layer PCL is selectively formed. At least one light emitting element LD, for example, light emitting elements LD, may be supplied and aligned between the first electrode ELT1 and the second electrode ELT2.

In an embodiment, the first and second partition walls PW1 and PW2, the first and second electrodes ELT1 and ELT2, and the first insulating layer INS1 may be fabricated through the process described with reference to FIGS. 15A to 15C. The light emitting elements LD may be supplied to and aligned in each emission area EMA through the process described with reference to FIG. 15D. Therefore, detailed descriptions pertaining to this will be omitted.

Figure 22A:
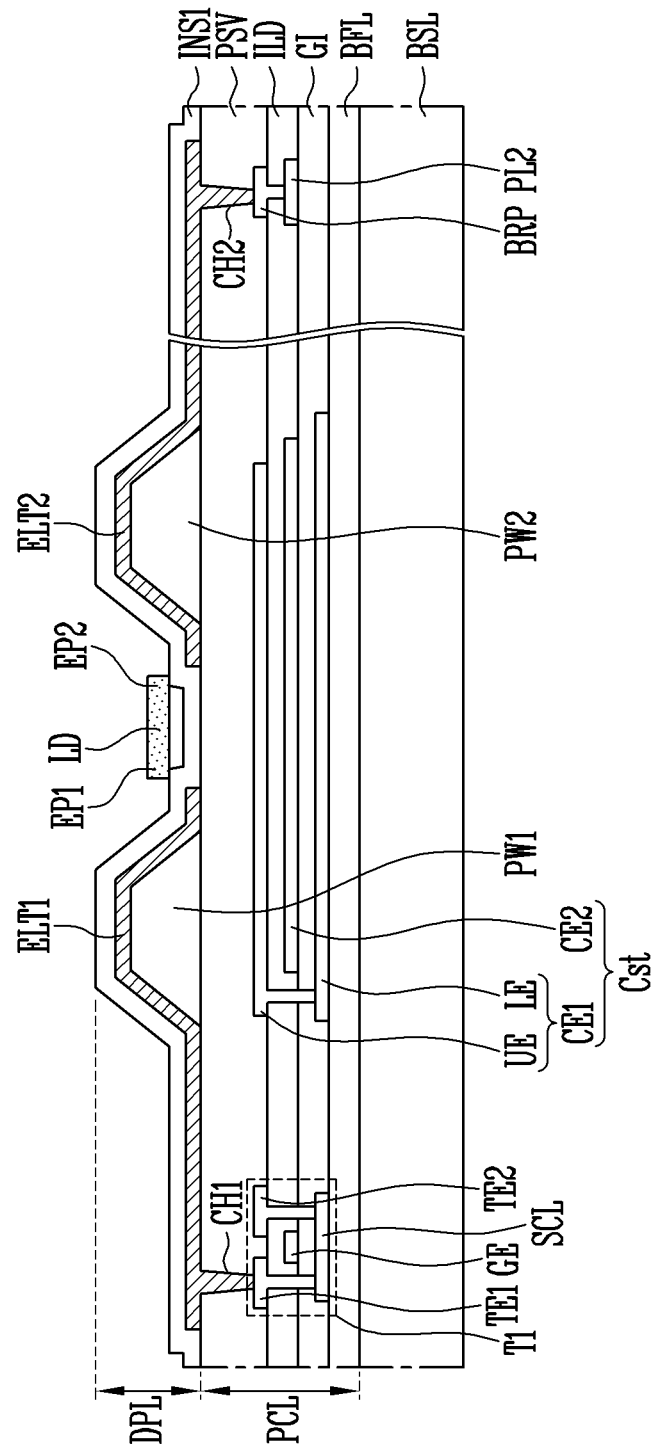
FIGS. 22A to 22G are schematic cross-sectional views illustrating a method of fabricating a display device in accordance with an embodiment.
Figure 22B:
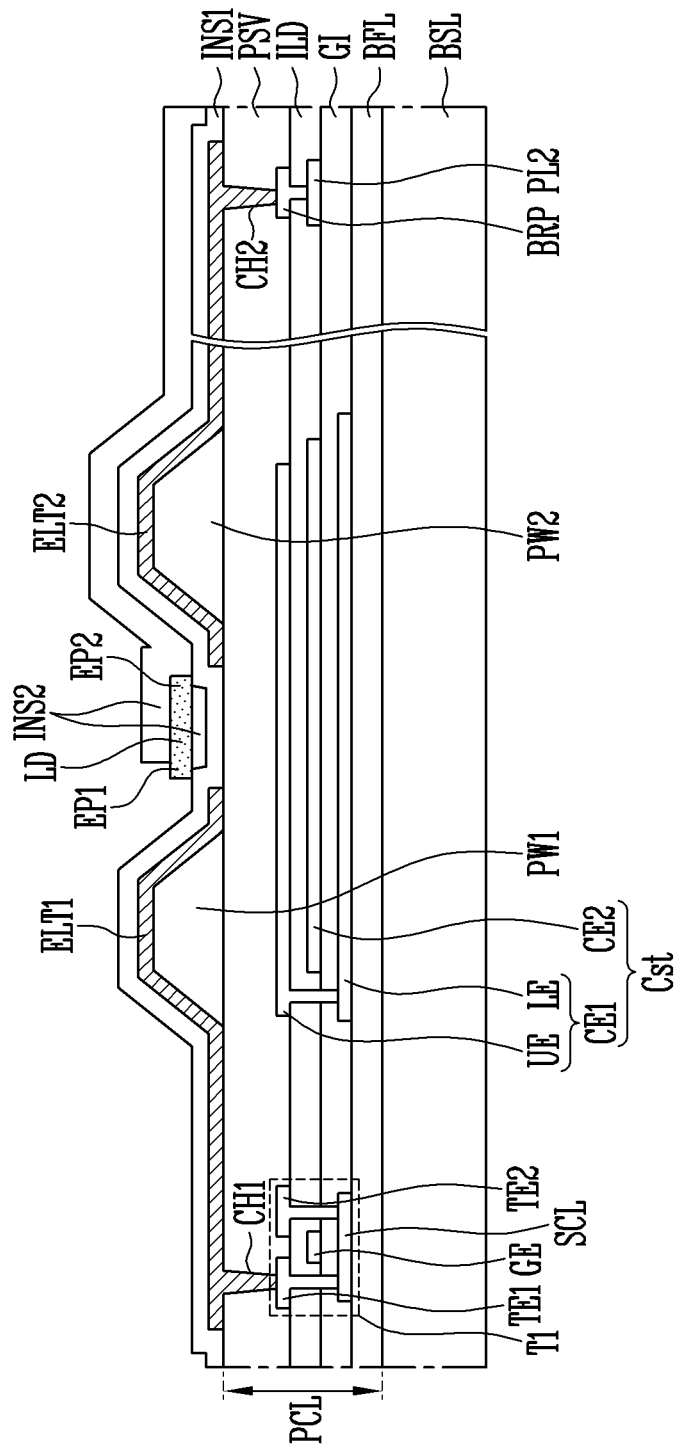

Referring to FIG. 22B, the second insulating layer INK is formed on the first insulating layer INS1 on the second electrode ELT2 and an area other than the first ends EP1 of the light emitting elements LD. In an embodiment, the second insulating layer INS2 may be formed through a deposition process of an insulating layer including inorganic material and/or organic material and a patterning process, and may be formed through various types of processes. The second insulating layer INS2 may be patterned such that the first electrode ELT1 and the first ends EP1 of the light emitting elements LD are not covered therewith or overlapped thereby.

Figure 22C:
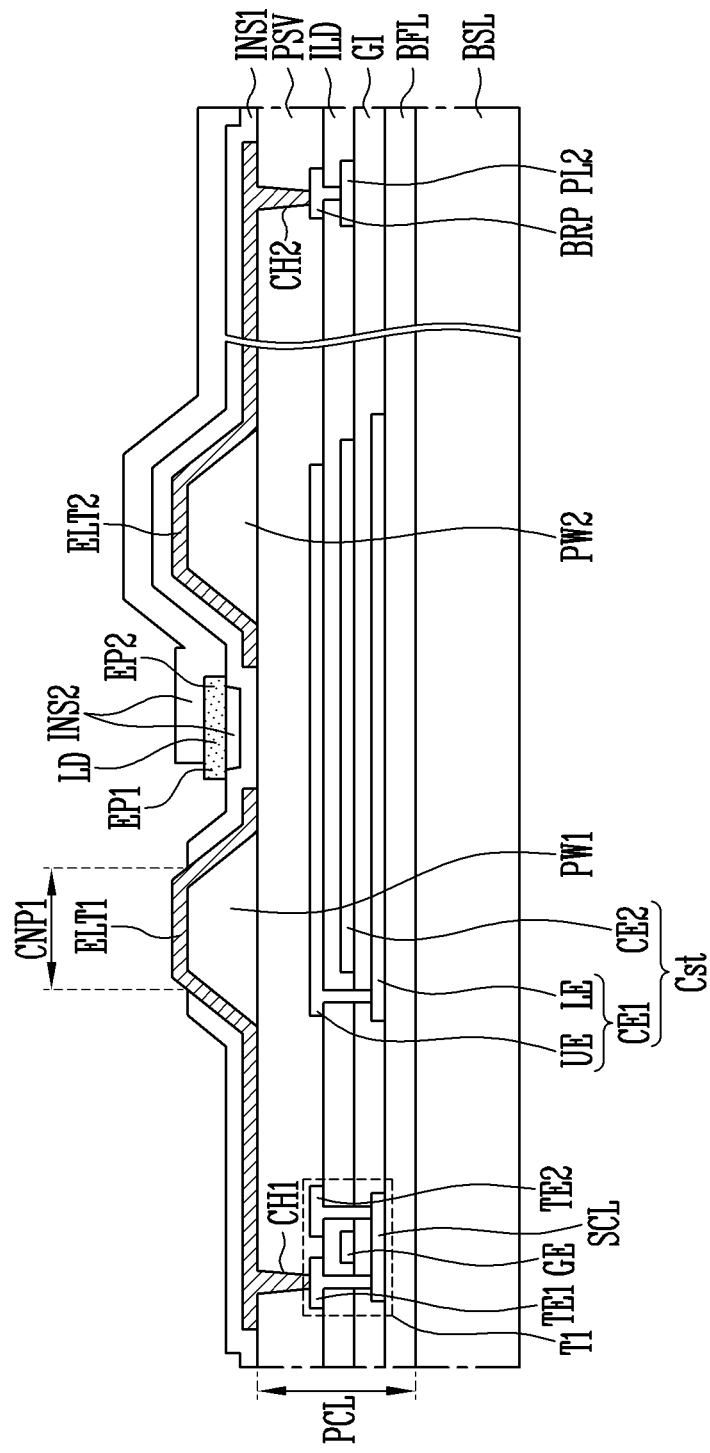

Referring to FIG. 22C, the first insulating layer INS1 is etched such that an area of the first electrode ELT1 is exposed. Thereby, the first contact portion CNP1 is formed on the first electrode ELT1.

Figure 22D:
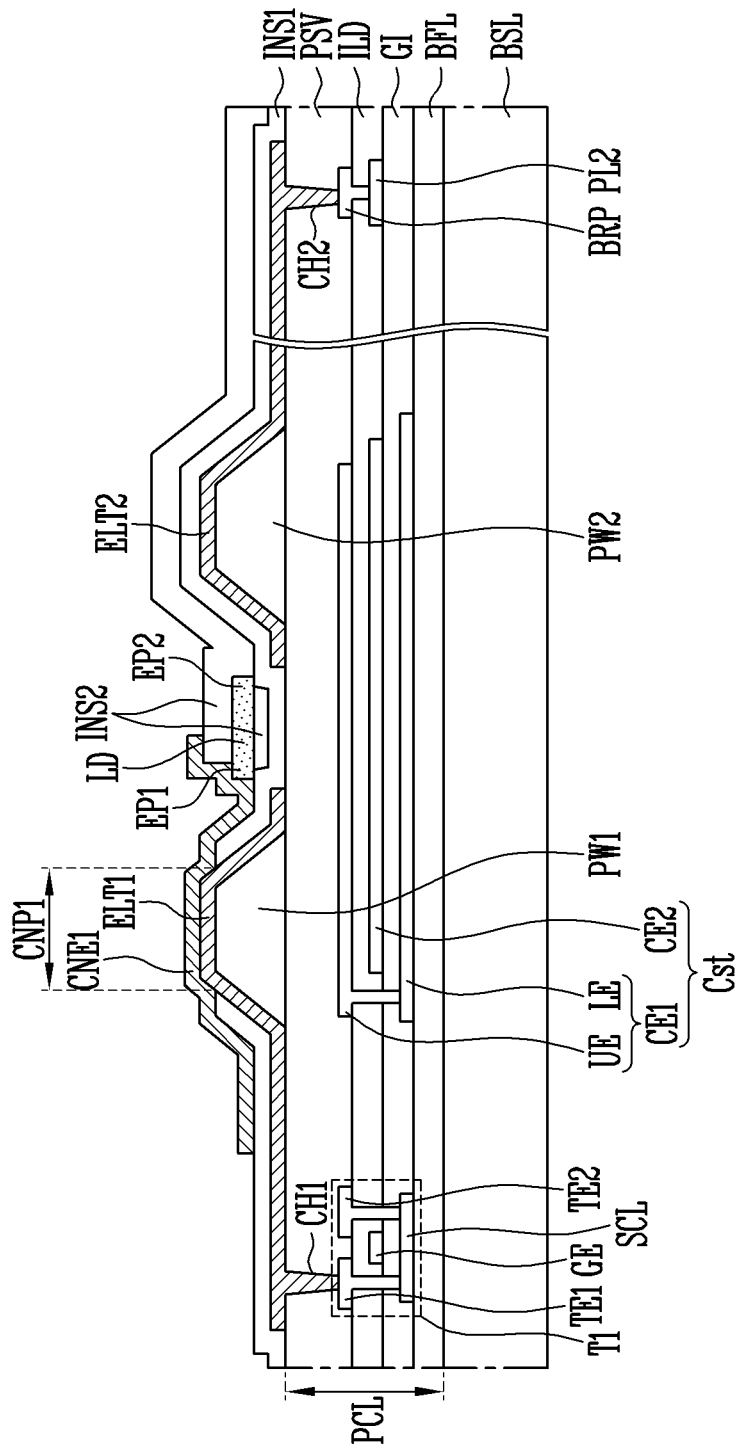

Referring to FIG. 22D, the first contact electrode CNE1 is formed on the first electrode ELT1 and the first ends EP1 of the light emitting elements LD. For example, the first contact electrode CNE1 may be formed to cover or overlap the first ends EP1 of the light emitting elements LD and at least one area or an area of the first electrode ELT1 including the first contact portion CNP1. Since the first contact electrode CNE1 is formed, the first end EP1 of each of the light emitting elements LD may be connected to the first electrode ELT1. In an embodiment, the first contact electrode CNE1 may be formed through a process of forming a conductive layer including at least one conductive material and/or a patterning process, and may be formed through various types of processes. In an embodiment, the first contact electrode CNE1 may be formed to be substantially transparent using at least one transparent electrode material.

Figure 22E:
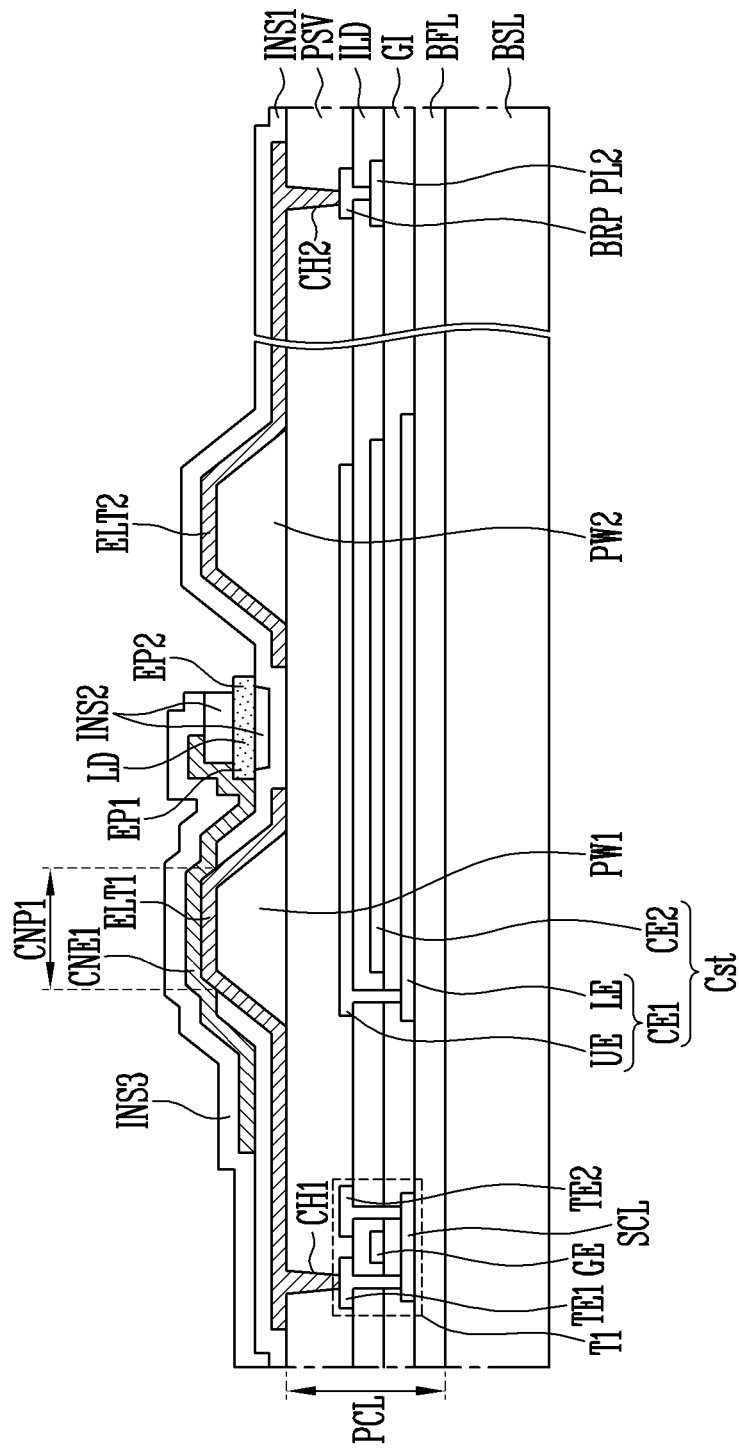

Referring to FIG. 22E, the third insulating layer INS3 may be disposed on the first contact electrode CNE1 and the light emitting elements LD to cover or overlap the first contact electrode CNE1 and an area of the light emitting elements LD including the first ends EP1. Furthermore, the second insulating layer INS2 is etched and removed on the second electrode ELT2 and the second ends EP2 of the light emitting elements LD. Hence, the second insulating layer INS2 may be disposed on only an area other than the first and second ends EP1 and EP2 of the light emitting elements LD.

Figure 22F:
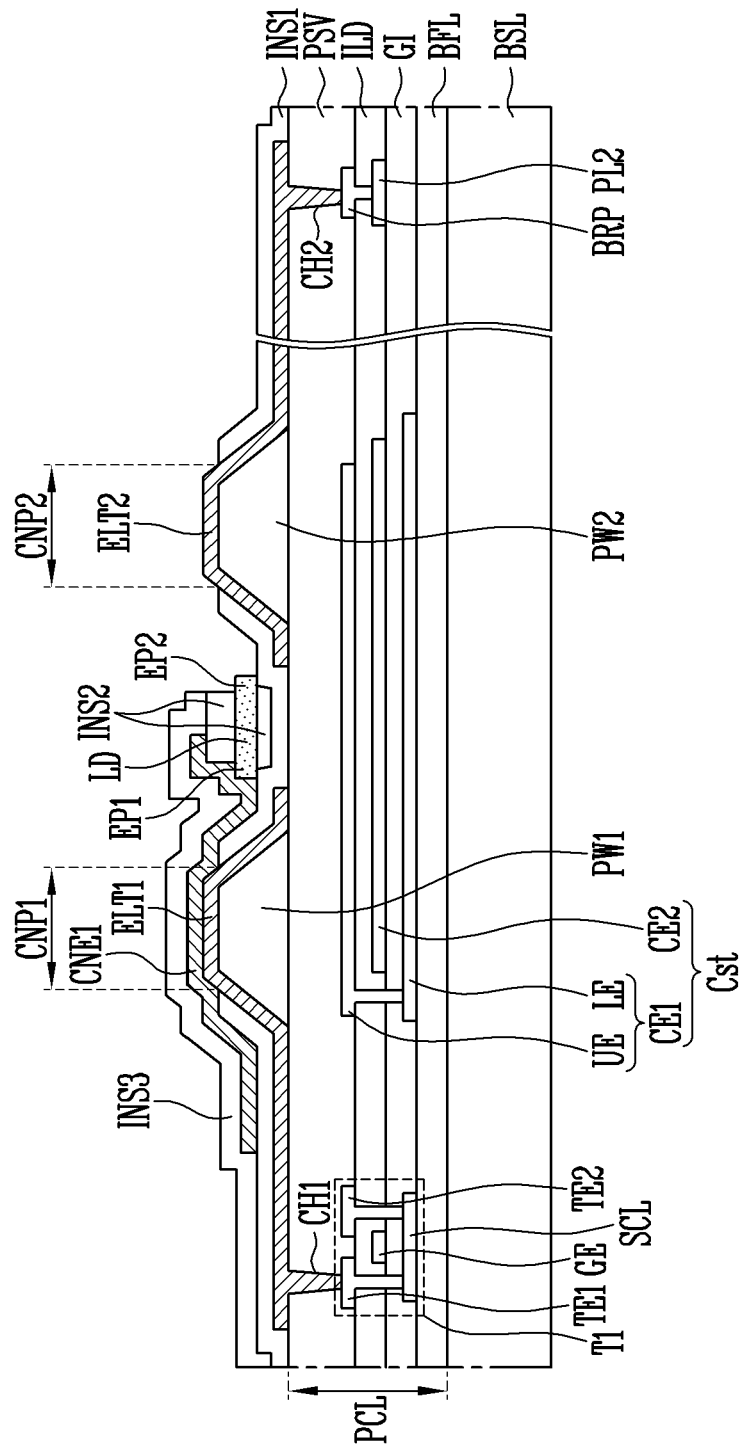

Referring to FIG. 22F, the first insulating layer INS1 is etched such that an area of the second electrode ELT2 is exposed. Thereby, the second contact portion CNP2 is formed on the second electrode ELT2.

Figure 22G:
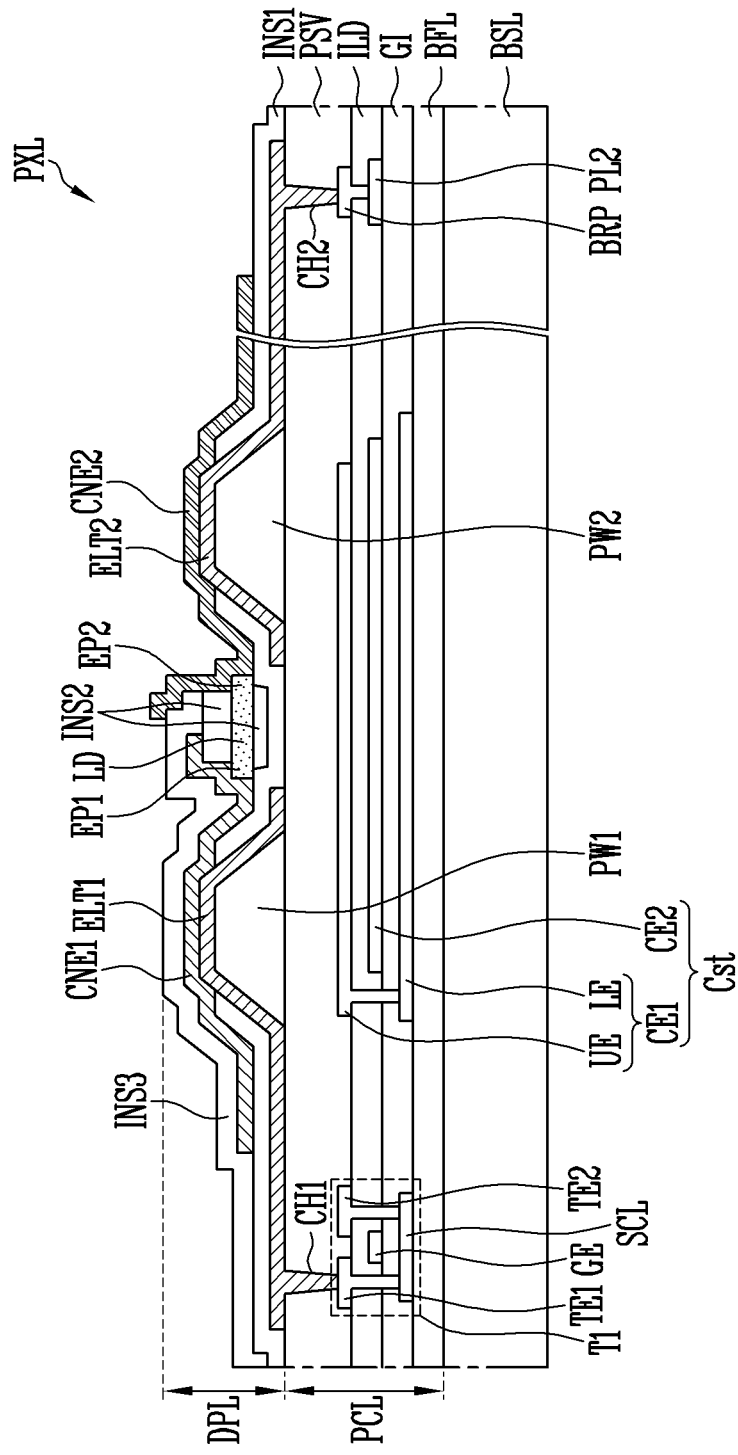

Referring to FIG. 22G, the second contact electrode CNE2 is formed on the second electrode ELT2 and the second ends EP2 of the light emitting elements LD. For example, the second contact electrode CNE2 may be formed to cover or overlap the second ends EP2 of the light emitting elements LD and at least one area or an area of the second electrode ELT2 including the second contact portion CNP2. Since the second contact electrode CNE2 is formed, the second end EP2 of each of the light emitting elements LD may be connected to the second electrode ELT2. In an embodiment, the second contact electrode CNE2 may be formed through a process of forming a conductive layer including at least one conductive material and/or a patterning process, and may be formed through various types of processes. In an embodiment, the second contact electrode CNE2 may be formed to be substantially transparent using at least one transparent electrode material.

After the pixels PXL are formed in the display area DA through the foregoing process, the upper plate of the display panel PNL in accordance with the embodiment of FIG. 20 or 21 may be disposed on the pixels PXL, whereby the pixels PXL may be encapsulated.

Figure 23:
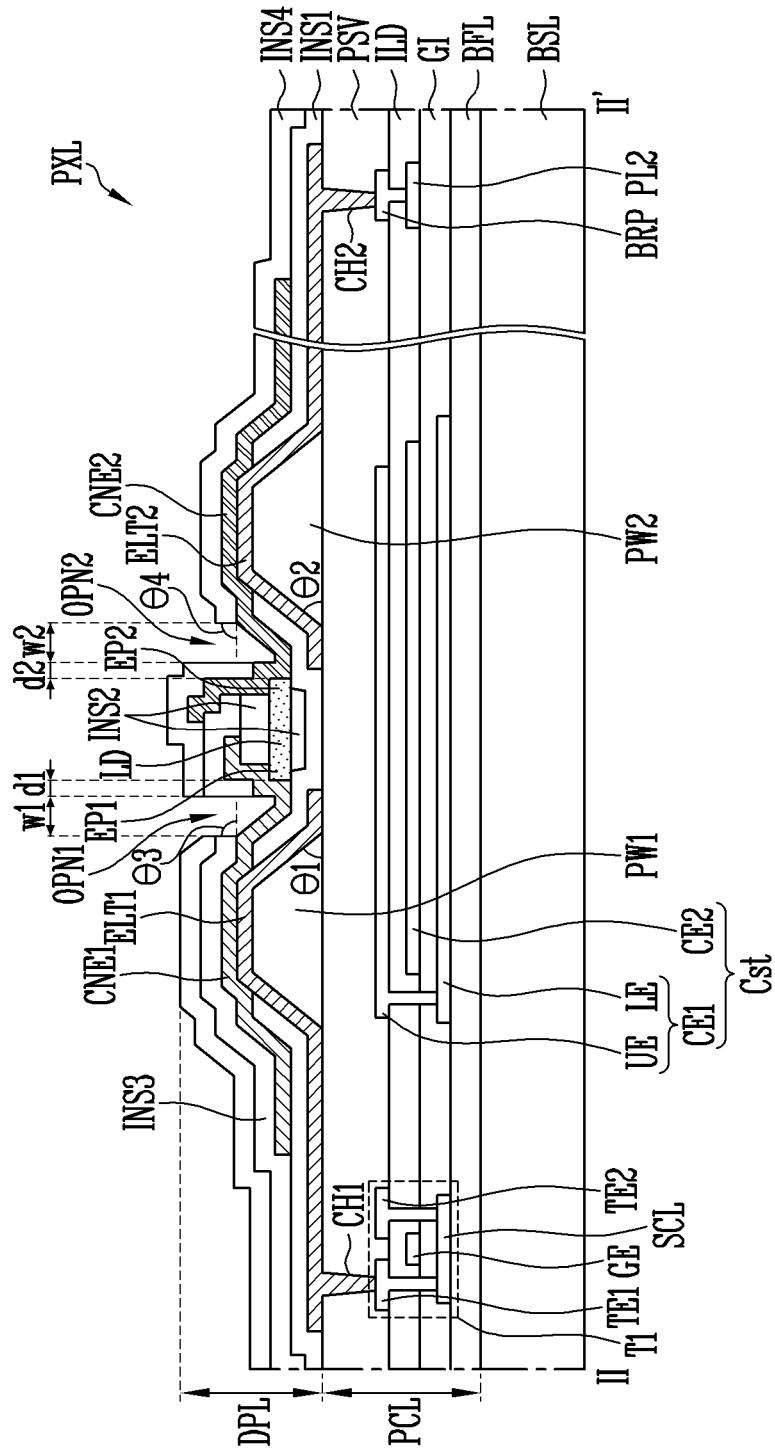
FIG. 23 is a schematic cross-sectional view illustrating a pixel in accordance with an embodiment.
Figure 24:
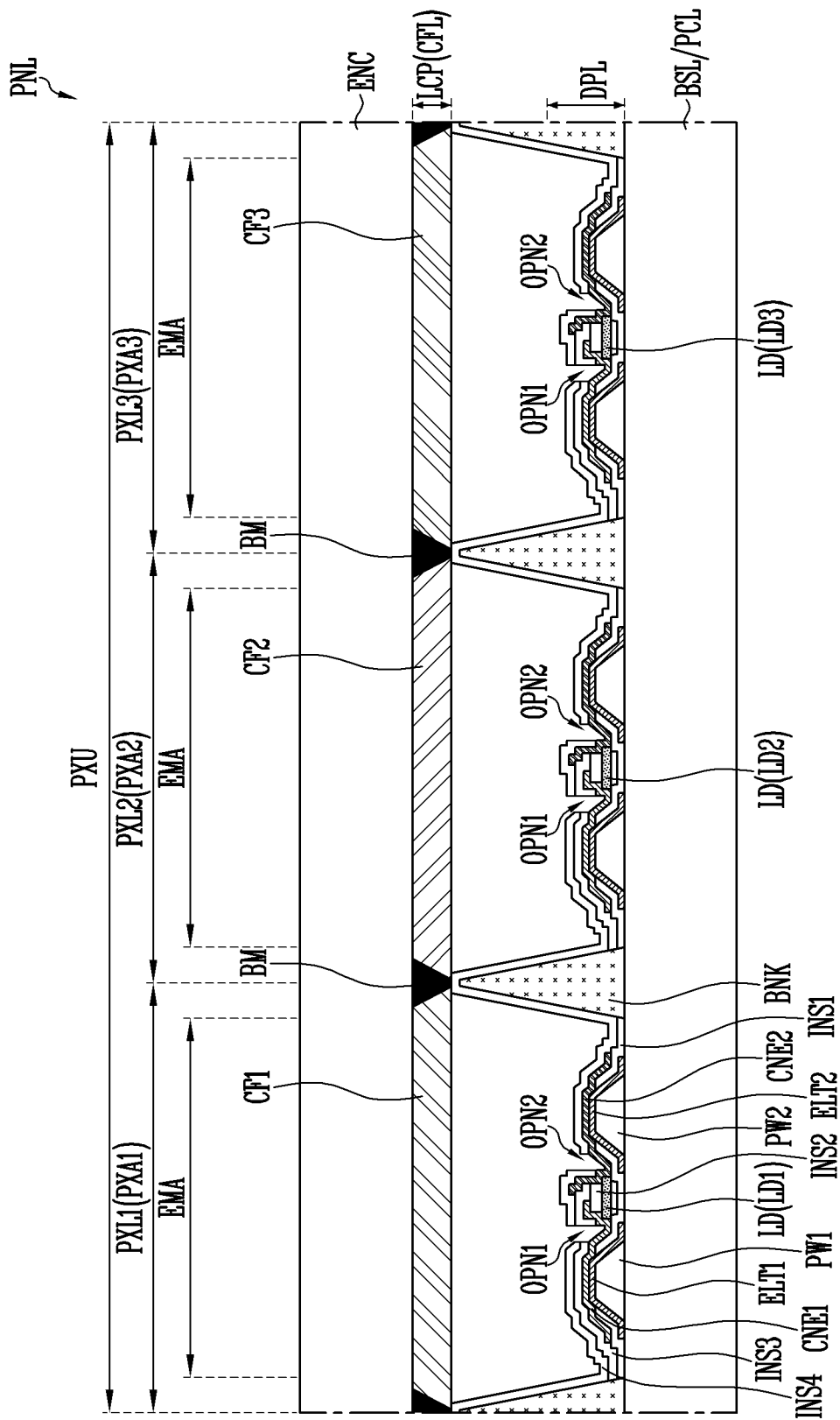
FIGS. 24 and 25 are schematic cross-sectional views each illustrating a display device in accordance with an embodiment.
Figure 25:
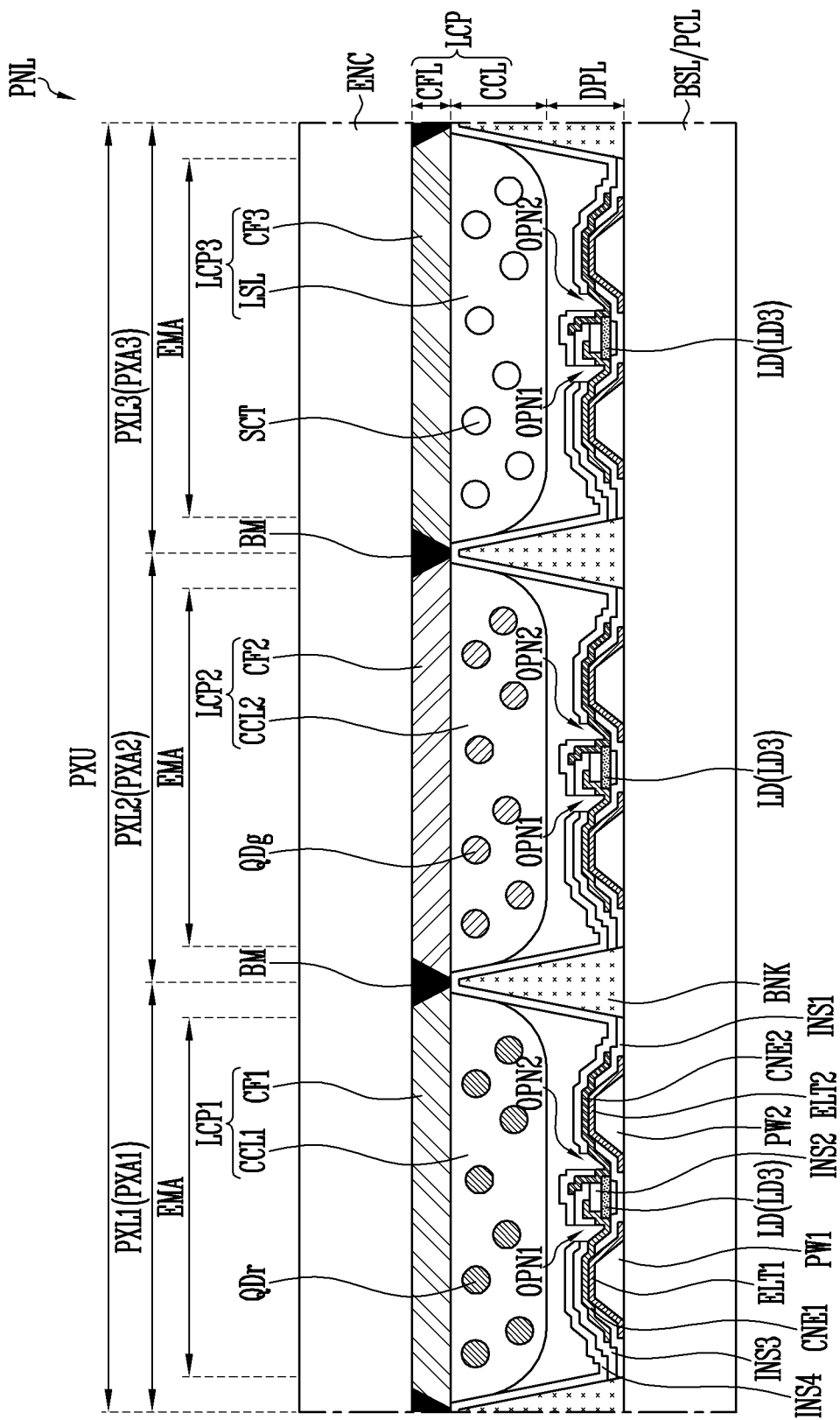

FIG. 23 is a schematic cross-sectional view illustrating a pixel PXL in accordance with an embodiment and for example illustrates an embodiment of a cross-section corresponding to line II-II' of FIG. 7. FIGS. 24 and 25 are schematic cross-sectional views each illustrating a display device in accordance with an embodiment, and for example illustrate different embodiments of a cross-section of one area or an area of the display panel PNL including the pixel PXL in accordance with the embodiment of FIG. 23. Although FIGS. 24 and 25 each illustrate an upper plate of the display panel PNL in accordance with the embodiment of FIGS. 10 and 11A, the structure of the upper plate may be changed in various ways. For example, the upper plate may include the black matrix BM disposed between the first color conversion layer CCL1, the second color conversion layer CCL2, and the light scattering layer LSL, as shown in the embodiment of FIG. 11B or 11C. In the description of the embodiments of FIGS. 23 to 25, like reference numerals will be used to designate components similar or equal to those of the previous embodiments, and detailed descriptions thereof will be omitted.

Referring to FIGS. 23 to 25, all of the third and fourth insulating layers INS3 and INS4 are formed, as shown in the embodiments of FIGS. 9 to 11A to 11C, respective areas of the third and fourth insulating layers INS3 and INS4 around the light emitting elements LD may be open, so that the light efficiency of each pixel PXL may be enhanced. For example, a first opening OPN1 (also referred to as "first light transmitting hole") may be formed by opening respective areas of the third and fourth insulating layers INS3 and INS4 in an area adjacent to the first ends EP1 of the light emitting elements LD. A second opening OPN2 (also referred to as "second light transmitting hole") may be formed by opening an area of the fourth insulating layer INS4 in an area adjacent to the second ends EP2 of the light emitting elements LD.

In an embodiment, the first opening OPN1 may be disposed in an area corresponding to space between the first ends EP1 of the light emitting elements LD and the first partition wall PW1 adjacent thereto. Likewise, the second opening OPN2 may be disposed in an area corresponding to space between the second ends EP2 of the light emitting elements LD and the second partition wall PW2 adjacent thereto. In an embodiment, the first and second openings OPN1 and OPN2 may be disposed not to respectively overlap the first and second partition walls PW1 and PW2, but the disclosure is not limited thereto. For example, in an embodiment, the first and/or second openings OPN1 and/or OPN2 may at least partially overlap respective areas (for example, inclined surfaces adjacent to the light emitting elements LD) of the first and/or second partition walls PW1 and/or PW2.

In an embodiment, the first and second openings OPN1 and OPN2 may be respectively spaced apart from the first and second ends EP1 and EP2 of the light emitting elements LD by horizontal distances d1 and d2 substantially identical with each other, and may have horizontal widths w1 and w2 substantially identical with each other, but the disclosure is not limited thereto. Light output characteristics of each pixel PXL may be further uniformalized. In the description of the embodiments, the words "substantially identical" may refer to the words "completely identical" and also comprehensively refer to the words "similar within an allowable error margin", taking into account processing conditions, for example, within the spirit and the scope of the disclosure.

Furthermore, the first and second openings OPN1 and OPN2 may have thicknesses and/or depths corresponding to the thicknesses of the third and fourth insulating layers INS3 and INS4. For example, the first opening OPN1 may have a thickness corresponding to the sum of the thicknesses of the third and fourth insulating layers INS3 and INS4 (for example, a thickness identical with the sum of the thicknesses of the third and fourth insulating layers INS3 and INS4), or may have a depth corresponding to a profile of a peripheral conductive layer and/or insulating layer that encloses the first opening OPN1. The second opening OPN2 may have a thickness corresponding to the thickness of the fourth insulating layer INS4 (for example, a thickness identical with the thickness of the fourth insulating layer INS4), or may have a depth corresponding to a profile of a conductive layer and/or insulating layer that encloses the second opening OPN2.

In an embodiment, the first and second openings OPN1 and OPN2 are fabricated through a dry etching scheme capable of performing a vertical etching operation, so that the first and second openings OPN1 and OPN2 can pass through the third and fourth insulating layers INS3 and INS4 in a direction substantially perpendicular to a plane on which the light emitting elements LD are disposed (for example, a plane parallel to the base layer BSL). For example, each of the first and second openings OPN1 and OPN2 may perpendicularly pass through the third and/or fourth insulating layers INS3 and/or INS4 such that the first and second openings OPN1 and OPN2 have angles θ3 and θ4 (for example, an angle of substantially 90° within an allowable error margin) ranging from approximately 80° to approximately 100° with respect to the plane on which the light emitting elements LD are disposed. The amount of light that dissipates in each pixel PXL may be reduced, and the light efficiency thereof may be enhanced.

In an embodiment, the first and second openings OPN1 and OPN2 may completely pass through the third and/or fourth insulating layers INS3 and/or INS4 in a corresponding area. For example, the first opening OPN1 may pass through the third and fourth insulating layers INS3 and INS4 so that an area of the first contact electrode CNE1 is exposed. Likewise, the second opening OPN2 may pass through the fourth insulating layer INS4 so that an area of the second contact electrode CNE2 is exposed.

However, the disclosure is not limited thereto. For example, in an embodiment, each of the first and second openings OPN1 and OPN2 may be formed in a shape in which the third and/or fourth insulating layers INS3 and/or INS4 are partially etched in a thickness direction, in other words, in the form of a groove formed in the third and/or fourth insulating layers INS3 and/or INS4. As an example, in an embodiment, the depths of the first and second openings OPN1 and OPN2 may be increased by partially etching the first and/or second contact electrodes CNE1 and/or CNE2 disposed under or below the third and/or fourth insulating layers INS3 and/or INS4. As a further alternative, in an embodiment, the first opening OPN1 may be formed in only the fourth insulating layer INS4 without being formed in the third insulating layer INS3.

In an embodiment, a horizontal width (for example, a width with respect to the first direction DR1 of FIG. 7) of each of the first and second partition walls PW1 and PW2 may range from about 3 μm to about 12 the height thereof may range from about 0.5 μm to about 3.5 and the inclined angle θ1, θ2 thereof may range from about 15° to about 80°. The thickness of each of the first and second electrodes ELT1 and ELT2, the thickness of the first insulating layer INS1, the thickness of the second insulating layer INS2, the thickness of the first contact electrode CNE1, the thickness of the third insulating layer INS3, the thickness of the second contact electrode CNE2, and the thickness of the fourth insulating layer INS4 may respectively range from about 0.01 m to about from about 0.01 μm to about 2 from about 0.05 μm to about 1 from about 0.005 to about 2 from about 0.05 μm to about 3 from about 0.005 μm to about 2 and about 0.05 μm to about 3 The horizontal width w1, w2 of each of the first and second openings OPN1 and OPN2 may range from about 0.005 μm to about 3 and the thickness thereof may range from about 0.005 μm to about 6 μm.

Here, the size (for example, the horizontal width w1, w2, the thickness, and/or the depth) and the position (for example, a horizontal distance d1, d2 from the light emitting elements LD), for example, of each of the first and second openings OPN1 and OPN2 may be changed in various ways depending on embodiments. For example, the size and/or position of each of the first and second openings OPN1 and OPN2 may be experimentally determined depending on light output characteristics of the pixels PXL.

In an embodiment, the first and second openings OPN1 and OPN2 may have different horizontal widths w1 and w2 or may be spaced apart from the first and second ends EP1 and EP2 of the light emitting elements LD by different horizontal distances d1 and d2. Furthermore, the size of each of the first and second openings OPN1 and OPN2 may be changed in various ways, depending on the size of space that can be secured at a position at which the first and second openings OPN1 and OPN2 are to be disposed (for example, space between the light emitting elements LD and the inclined surfaces of the first and second partition walls PW1 and PW2 adjacent thereto), and the thickness or profile, for example, of a peripheral insulating layer and/or conductive layer including the third and fourth insulating layers INS3 and INS4 and/or the first and second contact electrodes CNE1 and CNE2, for example, within the spirit and the scope of the disclosure.

In accordance with the above-mentioned embodiments, as the third and fourth insulating layers INS3 and INS4 are partially removed in an intermediate portion of an optical waveguide formed by the transparent electrodes (for example, the first and/or second contact electrodes CNE1 and/or CNE2) and/or the insulating layers (for example, the third and/or fourth insulating layers INS3 and/or INS4) that are disposed in each pixel PXL, a difference in refractive index between the first and second openings OPN1 and OPN2 and peripheral areas thereof may be given. Hence, in the pixel PXL in accordance with the embodiments of FIGS. 9 to 11A to 11C, at least some of light that is confined within the optical waveguide and dissipates may be guided to travel through an optical path changed by the first and second openings OPN1 and OPN2 in accordance with the embodiments of FIGS. 23 to 25. Hence, the amount of light which is emitted out of the pixel PXL may be increased, so that the light efficiency of each pixel PXL can be enhanced.

Figure 26A:
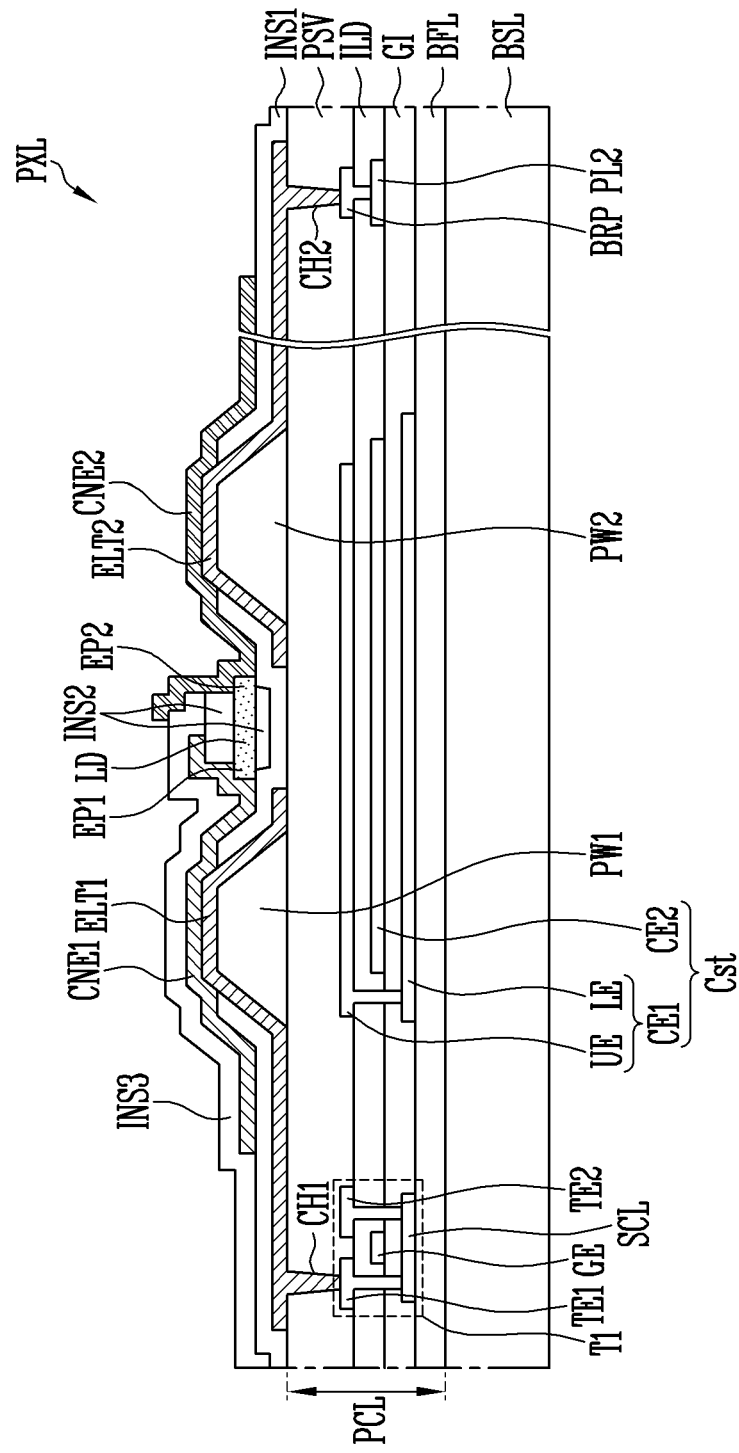
FIGS. 26A to 26C are schematic cross-sectional views illustrating a method of fabricating a display device in accordance with an embodiment.
Figure 26B:
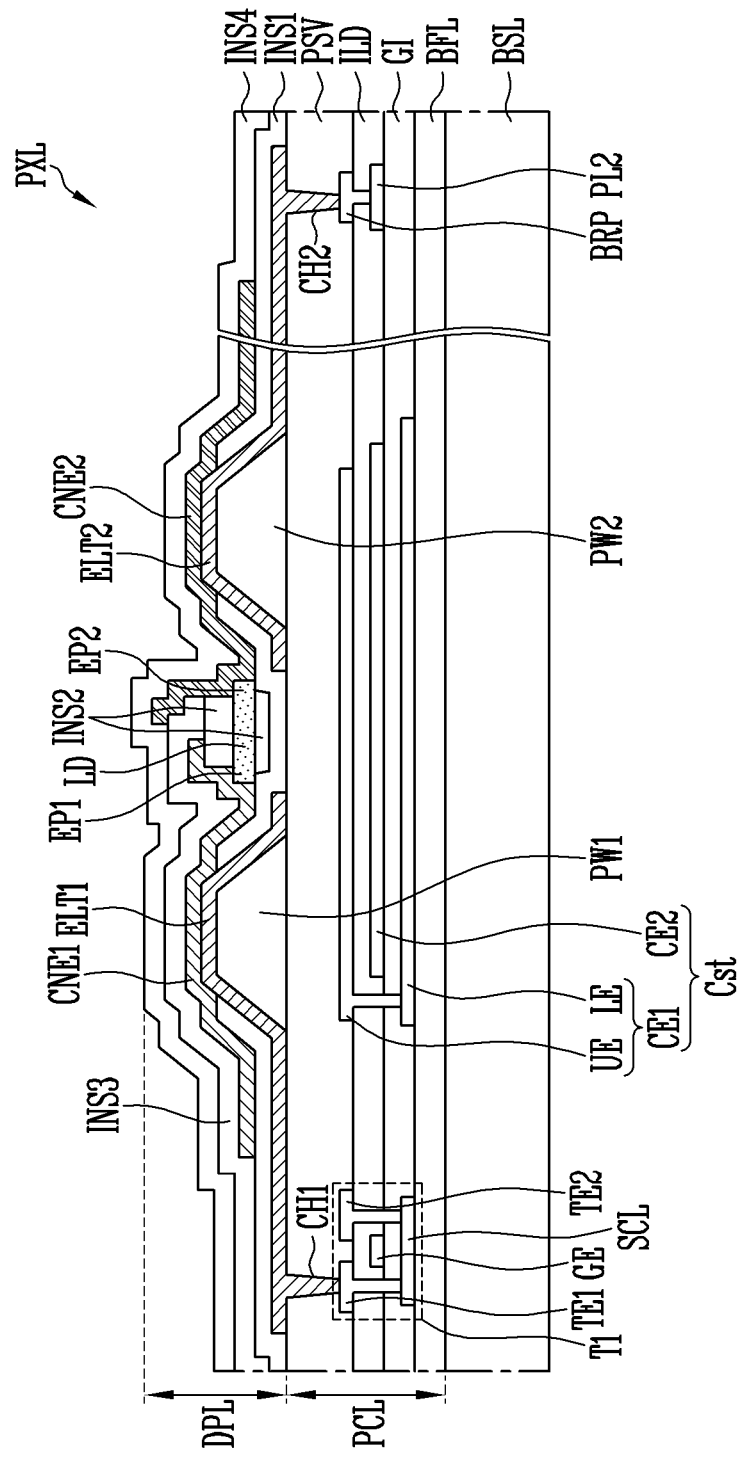
Figure 26C:
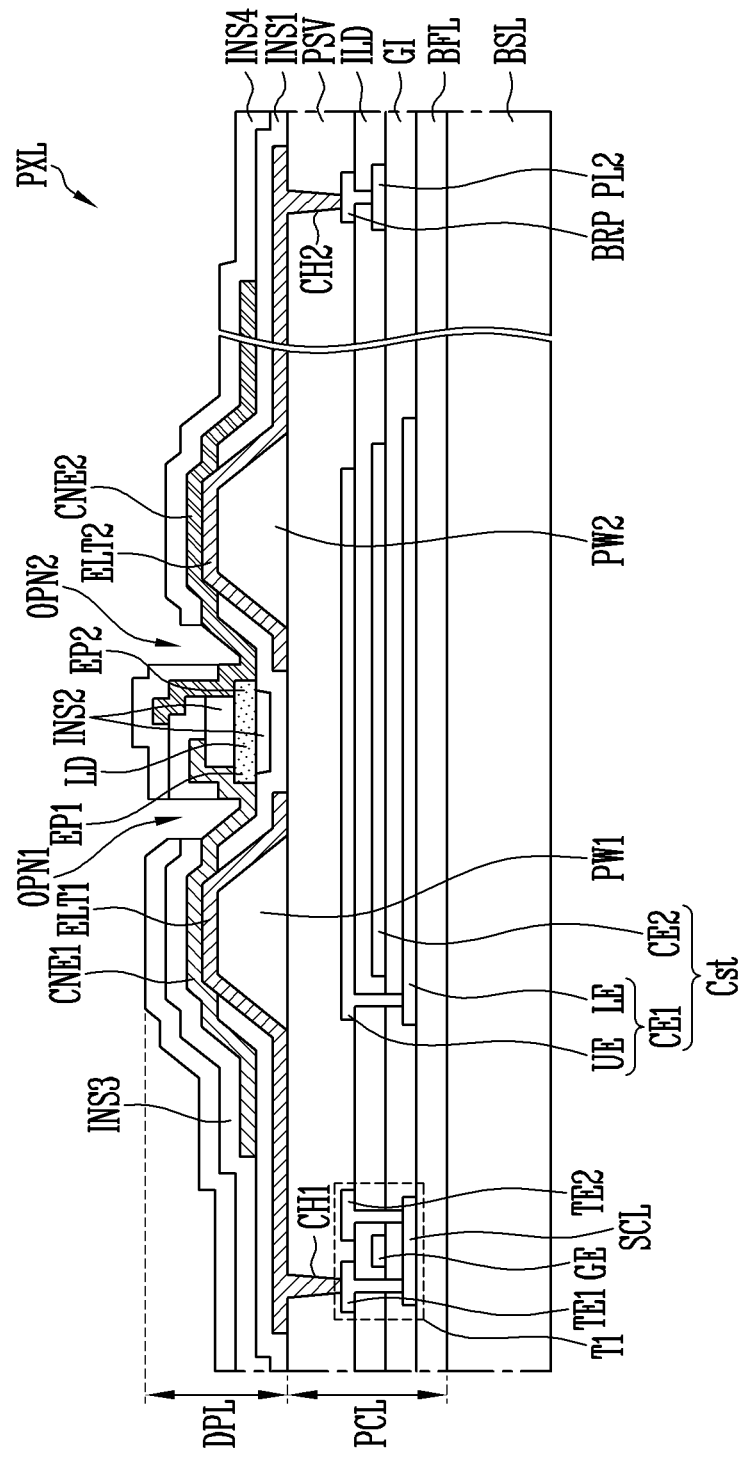

FIGS. 26A to 26C are schematic cross-sectional views illustrating a method of fabricating a display device in accordance with an embodiment and for example illustrate an embodiment of a method of fabricating a display device including the pixel PXL of FIG. 23. In the description of the embodiment of FIGS. 26A to 26C, like reference numerals will be used to designate components similar or equal to those of the previous embodiments, and detailed descriptions thereof will be omitted.

Referring to FIGS. 23 to 26A, the first and second partition walls PW1 and PW2, the first and second electrodes ELT1 and ELT2, the first insulating layer INS1, the light emitting elements LD, the second insulating layer INS2, the first contact electrode CNE1, the third insulating layer INS3, and the second contact electrode CNE2 are formed and/or disposed in each pixel area PXA on the base layer BSL on which the pixel circuit layer PCL is selectively formed. In an embodiment, the first and second partition walls PW1 and PW2, the first and second electrodes ELT1 and ELT2, the first insulating layer INS1, the light emitting elements LD, the second insulating layer INS2, the first contact electrode CNE1, the third insulating layer INS3, and the second contact electrode CNE2 may be formed and/or disposed through the process described with reference to FIGS. 22A to 22G.

Referring to FIG. 26B, the fourth insulating layer INS4 is formed on one surface or a surface of the base layer BSL on which the first and second contact electrodes CNE1 and CNE2 are formed. For example, the fourth insulating layer INS4 for covering or overlapping the entire surface of the display area DA including each pixel area PXA may be formed on one surface or a surface of the base layer BSL on which the first and second partition walls PW1 and PW2, the first and second electrodes ELT1 and ELT2, the first insulating layer INS1, the light emitting elements LD, the second insulating layer INS2, the first contact electrode CNE1, the third insulating layer INS3, and the second contact electrode CNE2 of each pixel PXL are formed.

Referring to FIG. 26C, the first and second openings OPN1 and OPN2 may be formed by etching the third and fourth insulating layers INS3 and INS4 in an area adjacent to the first ends EP1 and the second ends EP2 of the light emitting elements LD. For example, the first opening OPN1 passing through the third and fourth insulating layers INS3 and INS4 may be formed by etching the third and fourth insulating layers INS3 and INS4 in an area corresponding to space between the first ends EP1 of the light emitting elements LD and the first partition wall PW1 adjacent thereto. The second opening OPN2 passing through the fourth insulating layer INS4 may be formed by etching the fourth insulating layer INS4 in an area corresponding to space between the second ends EP2 of the light emitting elements LD and the second partition wall PW2 adjacent thereto.

In an embodiment, the first and second openings OPN1 and OPN2 may be formed by vertically dry-etching the third and fourth insulating layers INS3 and INS4. Hence, the first and second openings OPN1 and OPN2 may be formed such that the first and second openings OPN1 and OPN2 vertically pass through the third and fourth insulating layers INS3 and INS4 at angles θ3 and θ4 (for example, an angle of approximately 90°) ranging from approximately 80° to approximately 100° with respect to the plane on which the light emitting elements LD are disposed.

Through the above-mentioned process, the pixel PXL in accordance with the embodiment of FIG. 23 and the display device including the same (for example, the lower plate of the display panel PNL including the pixel PXL) may be fabricated. Furthermore, in an embodiment, after the pixels PXL are formed in the display area DA, the upper plate of the display panel PNL in accordance with the embodiment of FIG. 24 or 25 may be selectively disposed on the pixels PXL.

Figure 27:
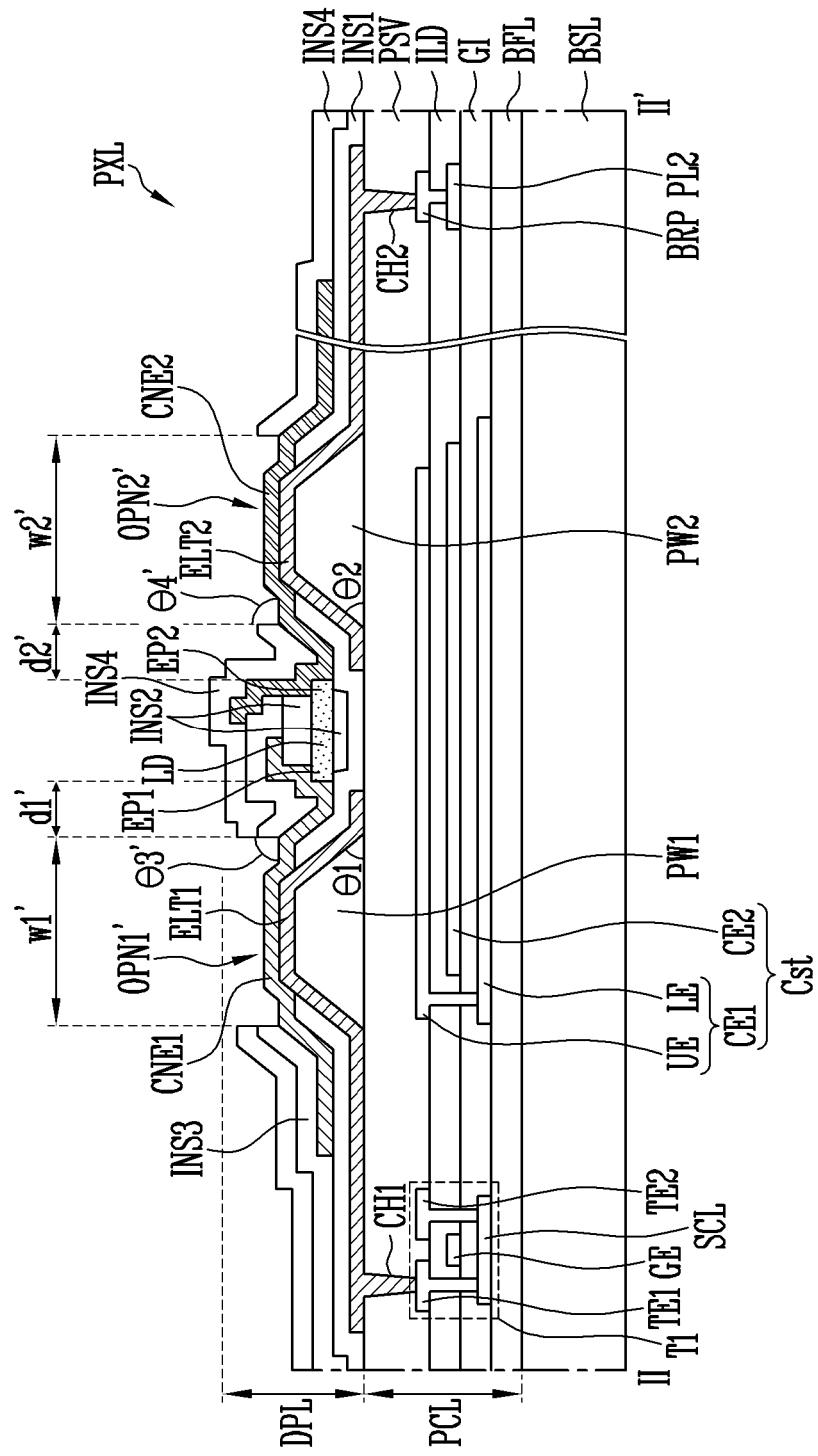
FIG. 27 is a schematic cross-sectional view illustrating a pixel in accordance with an embodiment.
Figure 28:
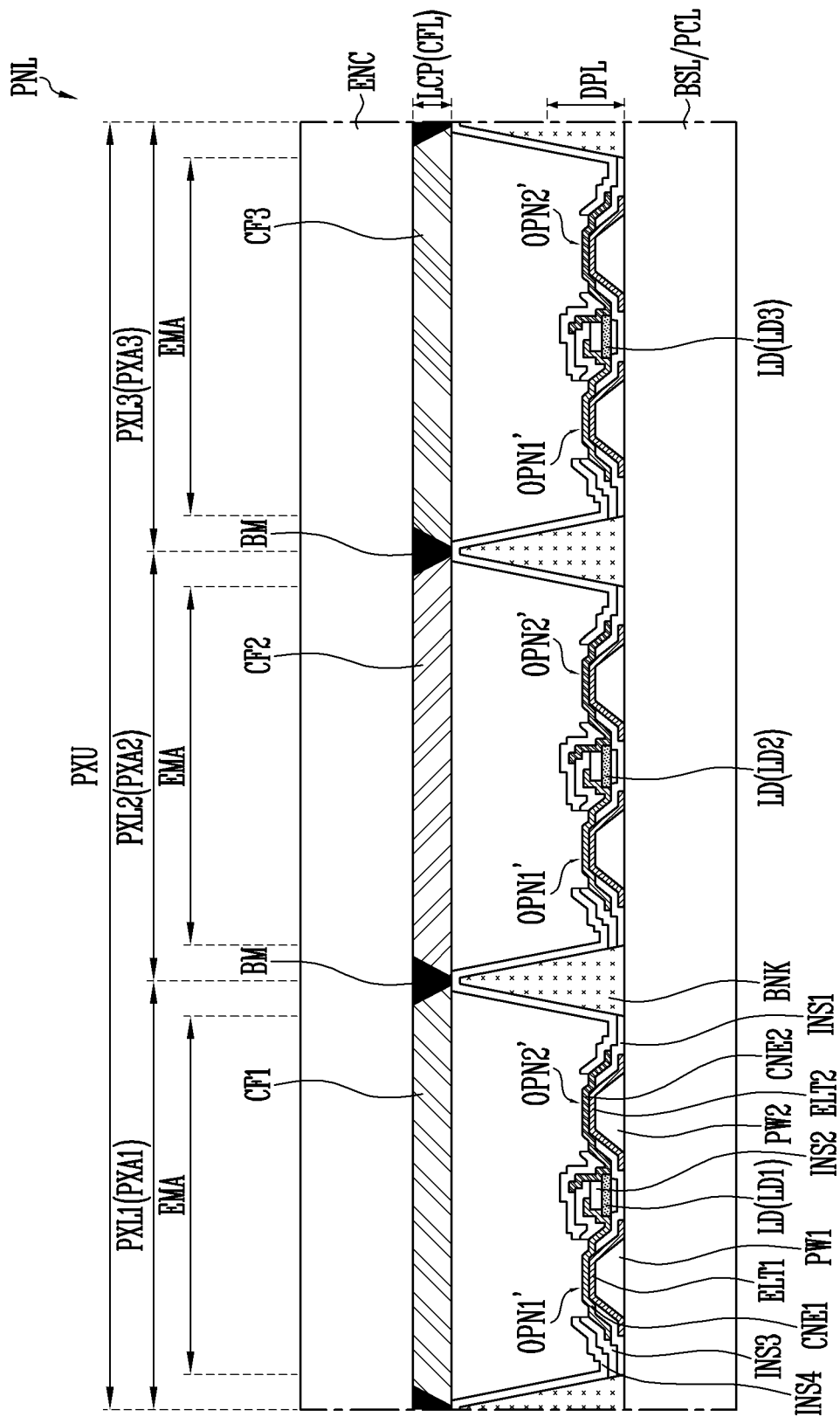
FIGS. 28 and 29 are schematic cross-sectional views each illustrating a display device in accordance with an embodiment.
Figure 29:
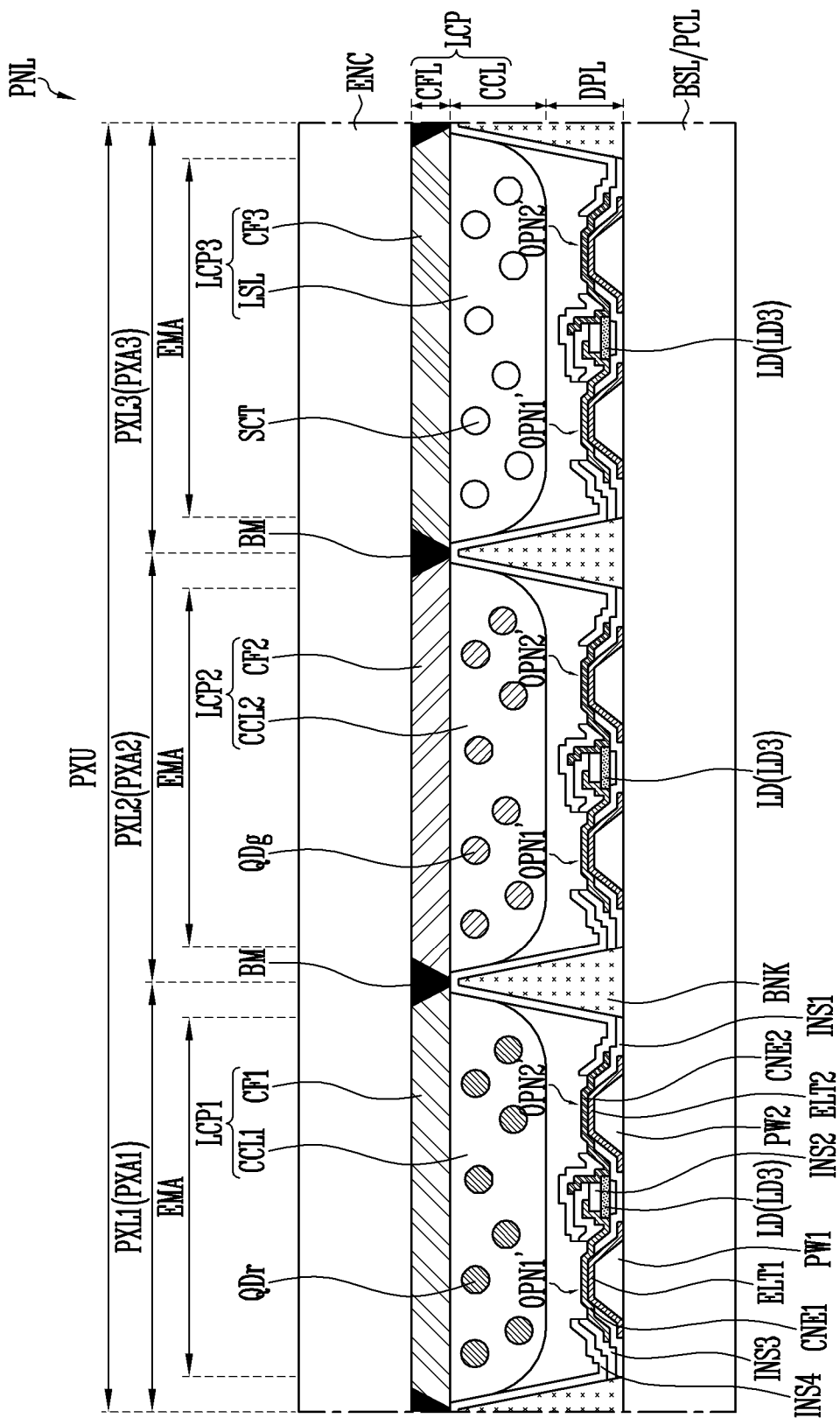

FIG. 27 is a schematic cross-sectional view illustrating a pixel PXL in accordance with an embodiment and for example illustrates an embodiment of a cross-section corresponding to line II-II' of FIG. 7. FIGS. 28 and 29 are schematic cross-sectional views each illustrating a display device in accordance with an embodiment, and for example illustrate different embodiments of a cross-section of one area or an area of the display panel PNL including the pixel PXL in accordance with the embodiment of FIG. 27. Although FIGS. 28 and 29 each illustrate an upper plate of the display panel PNL in accordance with the embodiment of FIGS. 10 and 11A, the structure of the upper plate may be changed in various ways. For example, the upper plate may include the black matrix BM disposed between the first color conversion layer CCL1, the second color conversion layer CCL2, and the light scattering layer LSL, as shown in the embodiment of FIG. 11B or 11C. In the description of the embodiments of FIGS. 27 to 29, like reference numerals will be used to designate components similar or equal to those of the previous embodiments, and detailed descriptions thereof will be omitted.

Referring to FIGS. 27 to 29, all of the third and fourth insulating layers INS3 and INS4 are formed, as shown in the embodiments of FIGS. 23 to 25, respective areas of the third and fourth insulating layers INS3 and INS4 around the light emitting elements LD may be open, so that the light efficiency of each pixel PXL may be enhanced. Here, in the embodiments of FIGS. 27 to 29, first and second openings OPN1' and OPN2' may be formed at positions different from that of the first and second openings OPN1 and OPN2 in accordance with the embodiments of FIGS. 23 to 25.

For example, the first opening OPN1' may be disposed on the first partition wall PW1 adjacent to the first ends EP1 of the light emitting elements LD, and the second opening OPN2' may be disposed on the second partition wall PW2 adjacent to the second ends EP2 of the light emitting elements LD. For example, the first opening OPN1' may have a horizontal width w1' less than the width of the first partition wall PW1 and be disposed to overlap the first partition wall PW1. The second opening OPN2' may have a horizontal width w2' less than the width of the second partition wall PW2 and be disposed to overlap the second partition wall PW2.

In an embodiment, the first and second openings OPN1' and OPN2' may be respectively spaced apart from the first and second ends EP1 and EP2 of the light emitting elements LD by horizontal distances d1' and d2' substantially identical with each other, and may have horizontal widths w1' and w2' substantially identical with each other. Hence, light output characteristics of each pixel PXL may be further uniformalized. However, the disclosure is not limited thereto. For example, in an embodiment, the first and second openings OPN1' and OPN2' may have different horizontal widths w1' and w2', or may be spaced apart from the light emitting elements LD by different horizontal distances d1' and d2'.

Furthermore, the first and second openings OPN1' and OPN2' may have thicknesses and/or depths corresponding to the thicknesses of the third and fourth insulating layers INS3 and INS4. For example, the first opening OPN1' may have a thickness and/or depth corresponding to the sum of the thicknesses of the third and fourth insulating layers INS3 and INS4 (for example, a thickness identical with the sum of the thicknesses of the third and fourth insulating layers INS3 and INS4). The second opening OPN2 may have a thickness and/or depth corresponding to the thickness of the fourth insulating layer INS4 (for example, a thickness identical with the thickness of the fourth insulating layer INS4).

In an embodiment, the first and second openings OPN1' and OPN2' are fabricated through a dry etching scheme capable of performing a vertical etching operation, so that the first and second openings OPN1' and OPN2' can pass through the third and fourth insulating layers INS3 and INS4 in a direction substantially perpendicular to a plane on which the light emitting elements LD are disposed (for example, a plane parallel to the base layer BSL). For example, each of the first and second openings OPN1' and OPN2' may perpendicularly pass through the third and/or fourth insulating layers INS3 and/or INS4 such that the first and second openings OPN1' and OPN2' have angles θ3' and θ4' (for example, an angle of substantially 90° within an allowable error margin) ranging from approximately 80° to approximately 100° with respect to the plane on which the light emitting elements LD are disposed. Hence, light emitted from each pixel PXL may be guided to more reliably travel in the frontal direction of the display panel PNL.

In an embodiment, the first and second openings OPN1' and OPN2' may completely pass through the third and fourth insulating layers INS3 and INS4. For example, the first opening OPN1' may pass through the third and fourth insulating layers INS3 and INS4 so that an area of the first contact electrode CNE1 over the first partition wall PW1 is exposed. Likewise, the second opening OPN2' may pass through the fourth insulating layer INS4 so that an area of the second contact electrode CNE2 over the second partition wall PW2 is exposed.

However, the disclosure is not limited thereto. For example, in an embodiment, each of the first and second openings OPN1' and OPN2' may be formed in a shape in which the third and/or fourth insulating layers INS3 and/or INS4 are partially etched in a thickness direction, in other words, in the form of a groove formed in the third and/or fourth insulating layers INS3 and/or INS4. As an example, in an embodiment, the depths of the first and second openings OPN1' and OPN2' may be increased by partially etching the first and/or second contact electrodes CNE1 and/or CNE2 disposed under or below the third and/or fourth insulating layers INS3 and/or INS4. As a further alternative, in an embodiment, the first opening OPN1' may be formed in only the fourth insulating layer INS4 without being formed in the third insulating layer INS3.

In an embodiment, a horizontal width (for example, a width with respect to the first direction DR1 of FIG. 7) of each of the first and second partition walls PW1 and PW2 may range from about 3 μm to about 12 the height thereof may range from about 0.5 μm to about 3.5 and the inclined angle θ1, θ2 thereof may range from about 15° to about 80°. The thickness of each of the first and second electrodes ELT1 and ELT2, the thickness of the first insulating layer INS1, the thickness of the second insulating layer INS2, the thickness of the first contact electrode CNE1, the thickness of the third insulating layer INS3, the thickness of the second contact electrode CNE2, and the thickness of the fourth insulating layer INS4 may respectively range from about 0.01 m to about from about 0.01 μm to about 2 from about 0.05 μm to about 1 from about 0.005 to about 2 from about 0.05 μm to about 1 from about 0.005 μm to about 2 and about 0.05 μm to about 1 The horizontal width w1', w2' of each of the first and second openings OPN1' and OPN2' may range from about 2 μm to about 8 and the thickness thereof may range from about 0.005 m to about 6 μm.

Here, the size (for example, the horizontal width w1', w2', the thickness, and/or the depth) and the position (for example, a horizontal distance d1', d2' from the light emitting elements LD), for example, of each of the first and second openings OPN1' and OPN2' may be changed in various ways depending on embodiments. For example, the size and/or position of each of the first and second openings OPN1' and OPN2' may be experimentally determined depending on light output characteristics of the pixels PXL.

In an embodiment, the first and second openings OPN1' and OPN2' may have different horizontal widths w1' and w2' or may be spaced apart from the first and second ends EP1 and EP2 of the light emitting elements LD by different horizontal distances d1' and d2'. Furthermore, the size of each of the first and second openings OPN1' and OPN2' may be changed in various ways, depending on the size of space that can be secured at a position at which the first and second openings OPN1' and OPN2' are to be disposed (for example, space formed over the first and second partition walls PW1 and PW2), and the thickness or profile, for example, of a peripheral insulating layer and/or conductive layer including the third and fourth insulating layers INS3 and INS4 and/or the first and second contact electrodes CNE1 and CNE2, for example, within the spirit and the scope of the disclosure.

In accordance with the above-mentioned embodiments, as the third and fourth insulating layers INS3 and INS4 are partially removed in an intermediate portion of an optical waveguide formed by the transparent electrodes (for example, the first and/or second contact electrodes CNE1 and/or CNE2) and/or the insulating layers (for example, the third and/or fourth insulating layers INS3 and/or INS4) that are disposed in each pixel PXL, a difference in refractive index between the first and second openings OPN1' and OPN2' and peripheral areas thereof may be given. Hence, in the pixel PXL in accordance with the embodiments of FIGS. 9 to 11A to 11C, at least some of the light that is confined within the optical waveguide and dissipates may travel through an optical path changed by the first and second openings OPN1' and OPN2' in accordance with the embodiments of FIGS. 27 to 29. Hence, the amount of light which is emitted out of the pixel PXL may be increased, so that the light efficiency of each pixel PXL can be enhanced.

Figure 30A:
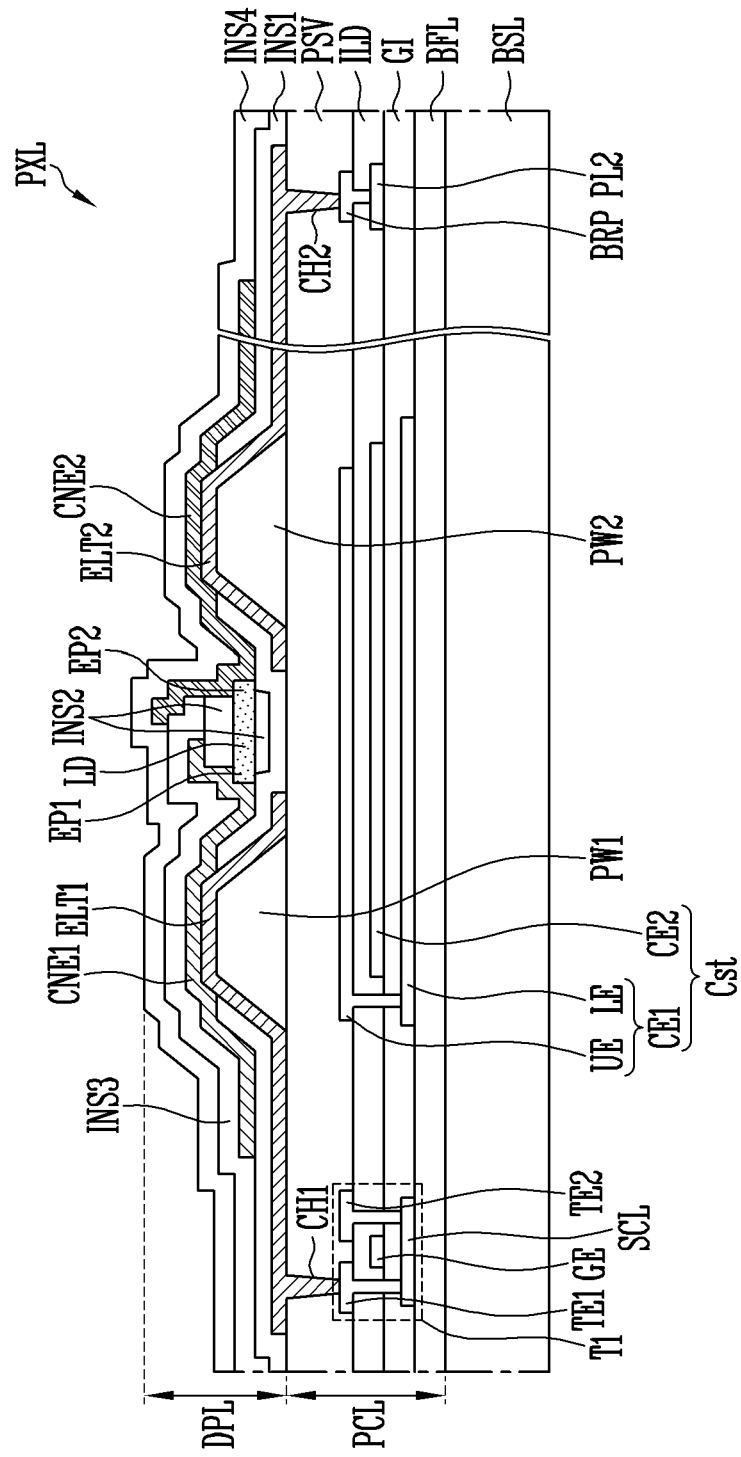
FIGS. 30A and 30B are schematic cross-sectional views illustrating a method of fabricating a display device in accordance with an embodiment.
Figure 30B:
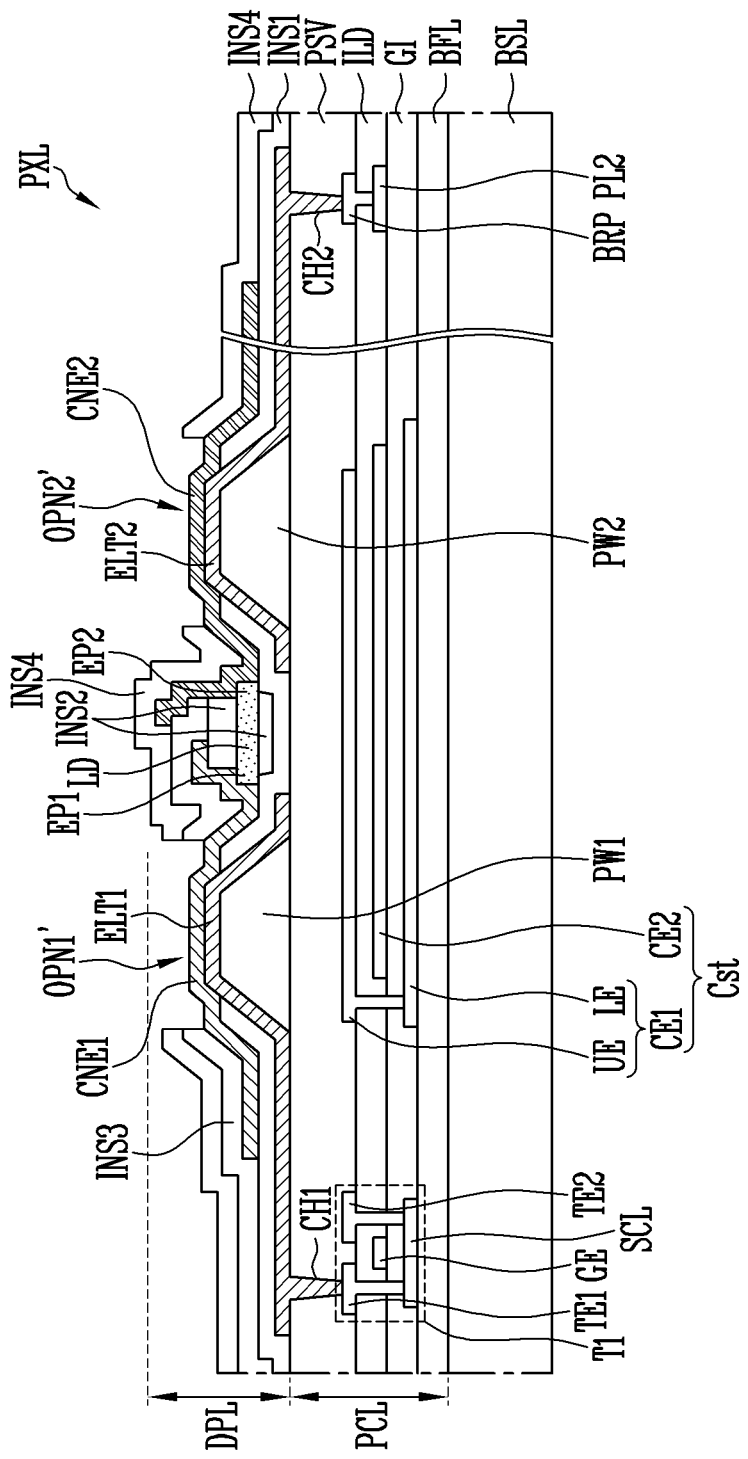

FIGS. 30A and 30B are schematic cross-sectional views illustrating a method of fabricating a display device in accordance with an embodiment and for example illustrate an embodiment of a method of fabricating a display device including the pixel PXL of FIG. 27. In the description of the embodiment of FIGS. 30A to 30B, like reference numerals will be used to designate components similar or equal to those of the previous embodiments, and detailed descriptions thereof will be omitted.

Referring to FIGS. 27 to 30A, the first and second partition walls PW1 and PW2, the first and second electrodes ELT1 and ELT2, the first insulating layer INS1, the light emitting elements LD, the second insulating layer INS2, the first contact electrode CNE1, the third insulating layer INS3, the second contact electrode CNE2, and the fourth insulating layer INS4 are formed and/or disposed in each pixel area PXA on the base layer BSL on which the pixel circuit layer PCL is selectively formed. In an embodiment, the first and second partition walls PW1 and PW2, the first and second electrodes ELT1 and ELT2, the first insulating layer INS1, the light emitting elements LD, the second insulating layer INS2, the first contact electrode CNE1, the third insulating layer INS3, the second contact electrode CNE2, and the fourth insulating layer INS4 may be formed and/or disposed through the process described with reference to FIGS. 26A to 26B.

Referring to FIG. 30B, first and second openings OPN1' and OPN2' passing through the third and fourth insulating layers INS3 and INS4 may be formed over the first partition wall PW1 adjacent to the first ends EP1 of the light emitting elements LD and over the second partition wall PW2 adjacent to the second ends EP2 of the light emitting elements LD. For example, the first opening OPN1' may be formed by etching the third and fourth insulating layers INS3 and INS4 over the first partition wall PW1 adjacent to the first ends EP1 of the light emitting elements LD. The second opening OPN2' may be formed by etching the fourth insulating layer INS4 over the second partition wall PW2 adjacent to the second ends EP2 of the light emitting elements LD.

In an embodiment, the first and second openings OPN1' and OPN2' may be formed by vertically dry-etching the third and fourth insulating layers INS3 and INS4. Hence, the first and second openings OPN1' and OPN2' may be formed such that the first and second openings OPN1' and OPN2' vertically pass through the third and fourth insulating layers INS3 and INS4 at angles θ3' and θ4' (for example, an angle of approximately 90°) ranging from approximately 80° to approximately 100° with respect to the plane on which the light emitting elements LD are disposed.

Through the above-mentioned process, the pixel PXL in accordance with the embodiment of FIG. 27 and the display device including the same (for example, the lower plate of the display panel PNL including the pixel PXL) may be fabricated. Furthermore, in an embodiment, after the pixels PXL are formed in the display area DA, the upper plate of the display panel PNL in accordance with the embodiment of FIG. 28 or 29 may be selectively disposed on the pixels PXL.

FIGS. 31 to 34 each are a schematic cross-sectional view illustrating a pixel PXL in accordance with an embodiment, and for example illustrate different embodiments of a cross-section corresponding to line II-IF of FIG. 7. In the description of the embodiments of FIGS. 31 to 34, like reference numerals will be used to designate components similar or equal to those of the previous embodiments, and detailed descriptions thereof will be omitted.

Figure 31:
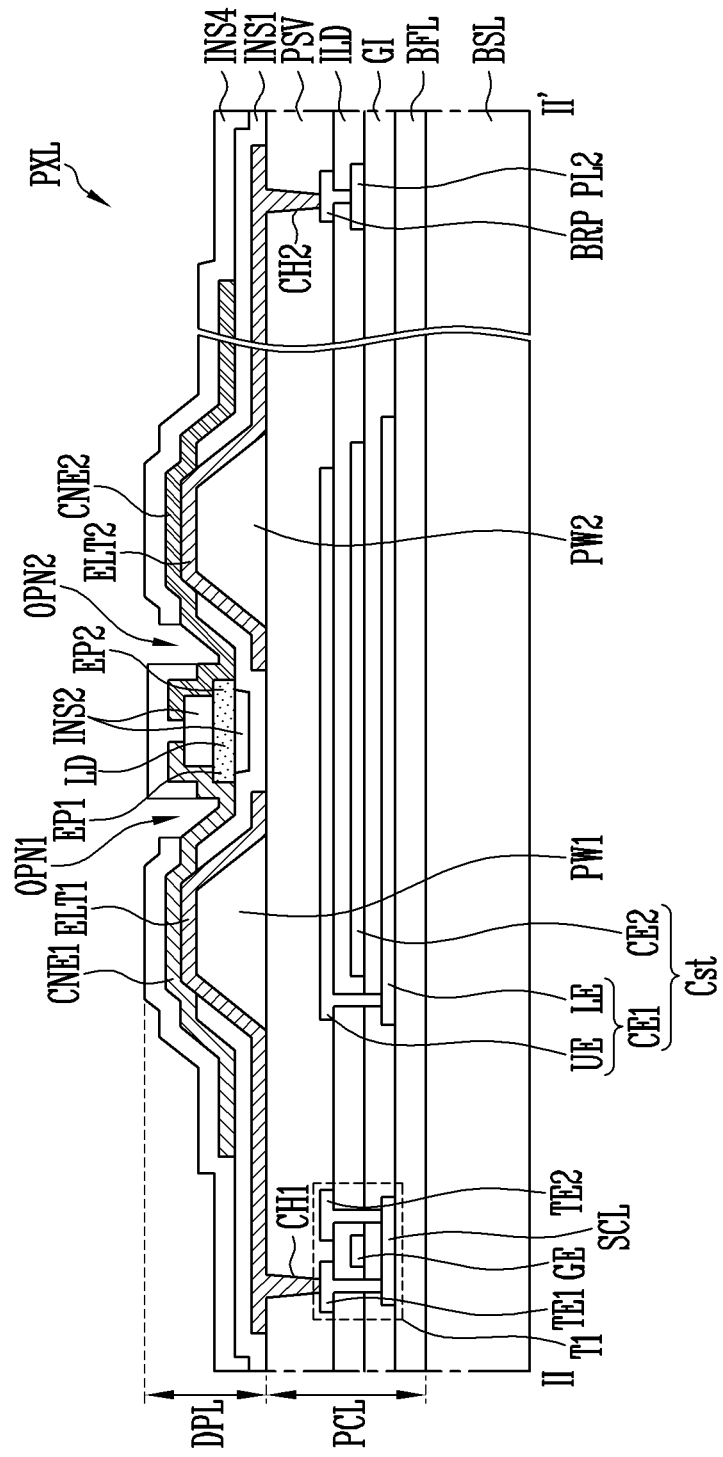
FIGS. 31 to 34 are schematic cross-sectional views each illustrating a pixel in accordance with an embodiment.

Referring to FIG. 31, each pixel PXL may not include the third insulating layer INS3 compared to the pixel PXL of FIG. 23. For example, the pixel PXL may include only the fourth insulating layer INS4 of the third and fourth insulating layers INS3 and INS4 provided in the pixel PXL of FIG. 23. Furthermore, the fourth insulating layer INS4 may include a first opening OPN1 disposed in an area corresponding to space between the first ends EP1 of the light emitting elements LD and the first partition wall PW1 adjacent thereto, and a second opening OPN2 disposed in an area corresponding to space between the second ends EP2 of the light emitting elements LD and the second partition wall PW2 adjacent thereto.

Figure 32:
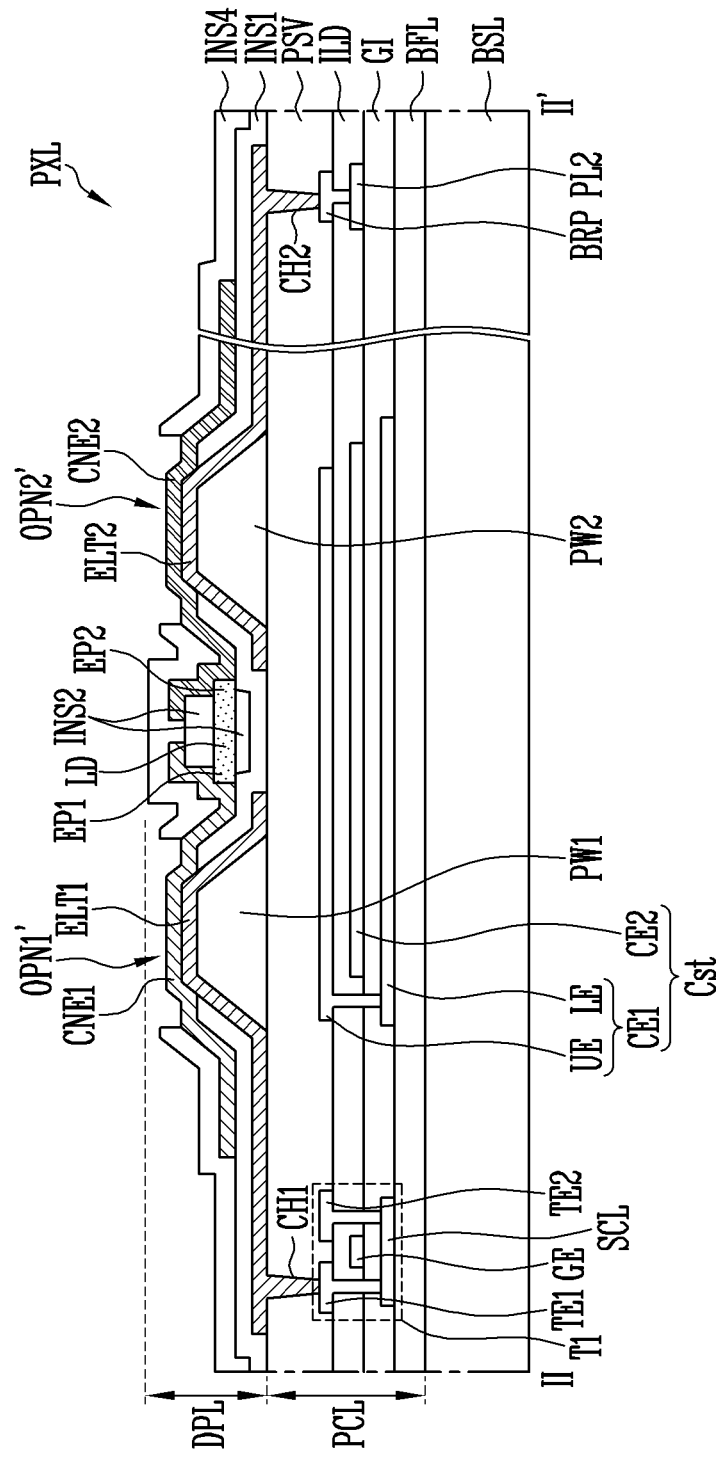

Referring to FIG. 32, each pixel PXL may not include the third insulating layer INS3 in a similar manner as that of the pixel PXL of FIG. 31, and may include first and second openings OPN1' and OPN2' formed at positions different from that of the pixel PXL of FIG. 31. For example, the pixel PXL may include only the fourth insulating layer INS4 of the third and fourth insulating layers INS3 and INS4 provided in the pixel PXL of FIG. 27. Furthermore, the fourth insulating layer INS4 may include a first opening OPN1' disposed over the first partition wall PW1 and a second opening OPN2' disposed over the second partition wall PW2.

Figure 33:
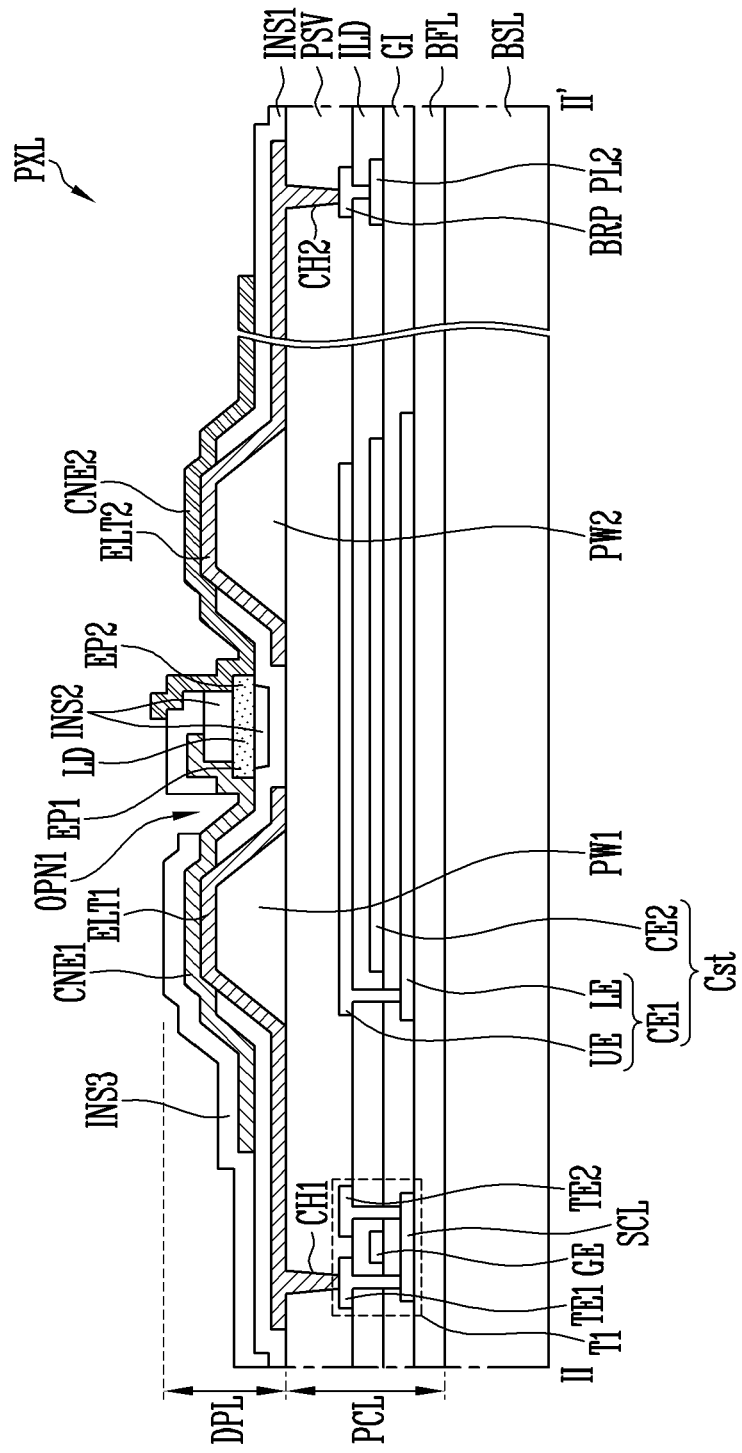

Referring to FIG. 33, each pixel PXL may not include the fourth insulating layer INS4 compared to the pixel PXL of FIG. 23. For example, the pixel PXL may include only the third insulating layer INS3 of the third and fourth insulating layers INS3 and INS4 provided in the pixel PXL of FIG. 23. In an embodiment, the third insulating layer INS3 may include a first opening OPN1 disposed in an area corresponding to space between the first ends EP1 of the light emitting elements LD and the first partition wall PW1 adjacent thereto.

Figure 34:
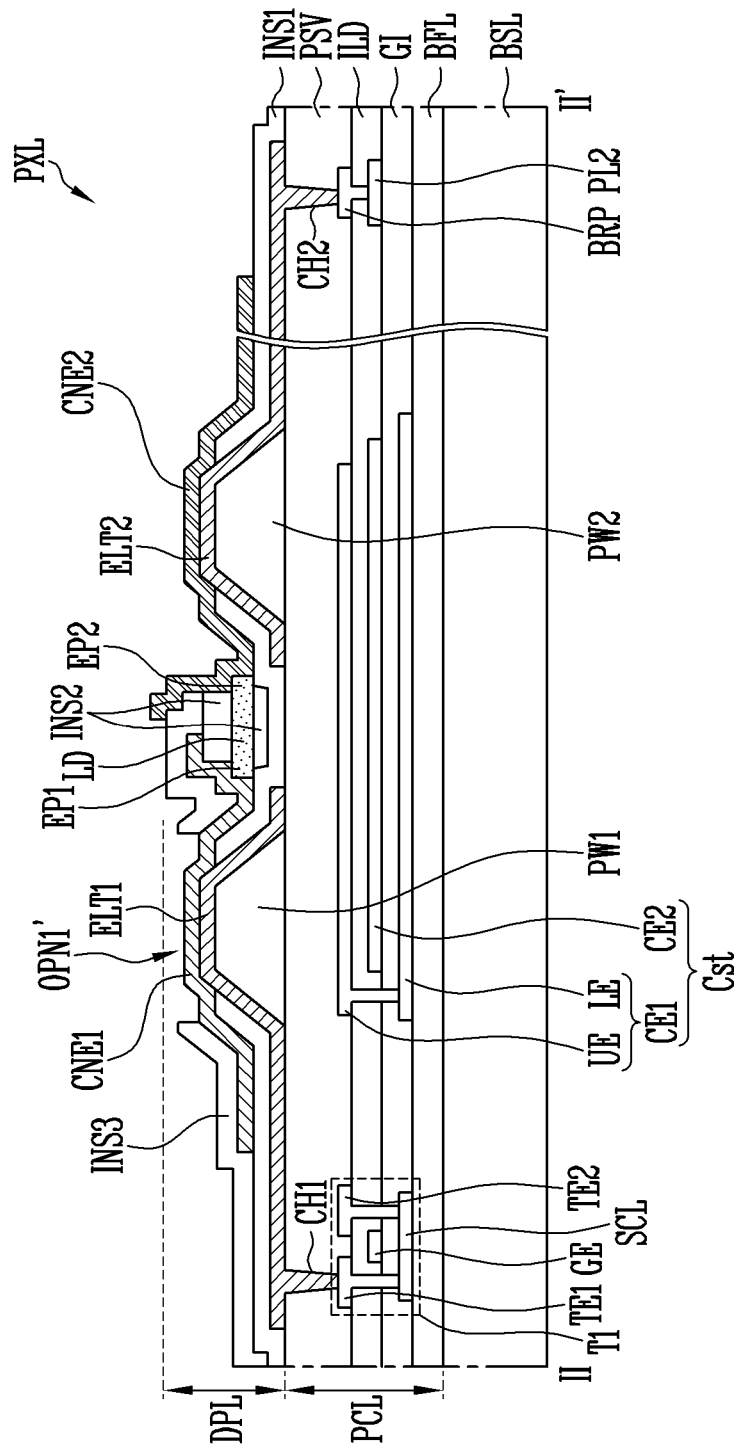

Referring to FIG. 34, each pixel PXL may not include the fourth insulating layer INS4 in a similar manner as that of the pixel PXL of FIG. 33, and may include a first opening OPN1' formed at a position different from that of the pixel PXL of FIG. 33. For example, the pixel PXL may include only the third insulating layer INS3 of the third and fourth insulating layers INS3 and INS4 provided in the pixel PXL of FIG. 27. The third insulating layer INS3 may include the first opening OPN1' disposed over the first partition wall PW1.

As shown in the above-mentioned embodiments, the pixel PXL in accordance with an embodiment and the display device including the same may have various structures. For example, at least one pixel PXL disposed in the display area DA may have a structure to which only any one embodiment of the embodiments of FIGS. 7 to 34 is applied, or a structure to which a combination of at least two embodiments of the foregoing embodiments is applied.

In an embodiment, as shown in the embodiments of FIGS. 7 to 11A to 11C, each pixel PXL and the display device including the same may include a third insulating layer INS3 which covers or overlaps the first ends EP1 of the light emitting elements LD and the first contact electrode CNE1, and a fourth insulating layer INS4 which covers or overlaps space over the light emitting elements LD and the first and second contact electrodes CNE1 and CNE2 and each pixel area PXA and/or the display area DA including the pixel area PXA.

In an embodiment, as shown in the embodiments of FIGS. 7, and 12 to 22G, each pixel PXL and the display device including the pixel PXL may not include at least one insulating layer of the third and fourth insulating layers INS3 and INS4, so that the light output characteristics may be enhanced compared to that of the embodiments of FIGS. 8A to 11A to 11C.

In an embodiment, as shown in the embodiments of FIGS. 7 and 23 to 30B, each pixel PXL and the display device including the pixel PXL may include all of the third and fourth insulating layers INS3 and INS4, and include the first and second openings OPN1, OPN1', OPN2, and OPN2' formed in the third and fourth insulating layers INS3 and INS4 on opposite sides of the light emitting elements LD, so that the light output characteristics may be enhanced (or improved) compared to that of the embodiments of FIGS. 8A to 11A to 11C. For example, each pixel PXL and the display device including the pixel PXL may include each first opening OPN1, OPN1' disposed in an area corresponding to space between the first ends EP1 of the light emitting elements LD and the first partition wall PW1 adjacent thereto or over the first partition wall PW1, and each second opening OPN2, OPN2' disposed in an area corresponding to space between the second ends EP2 of the light emitting elements LD and the second partition wall PW2 adjacent thereto or over the second partition wall PW2.

In an embodiment, as shown in the embodiments of FIGS. 31 to 34, each pixel PXL and the display device including the pixel PXL may have a combination structure of at least one embodiment of the embodiments of FIGS. 7, and 12 to 22G and at least one embodiment of the embodiments of FIGS. 7, and 23 to 30B, so that the light output characteristics may be enhanced (or improved) compared to that of the embodiments of FIGS. 8A to 11A to 11C. For example, each pixel PXL and the display device including the pixel PXL may include only the fourth insulating layer INS4 of the third and fourth insulating layers INS3 and INS4. The fourth insulating layer INS4 may include first and second openings OPN1, OPN1', OPN2, and OPN2' disposed on opposite sides of the light emitting elements LD. Furthermore, each pixel PXL and the display device including the pixel PXL may include only the third insulating layer INS3 of the third and fourth insulating layers INS3 and INS4. The third insulating layer INS3 may include each first opening OPN1, OPN1' disposed on one side or a side (for example, around the first ends EP1) of the light emitting elements LD.

As described above, in each pixel PXL, a display device including the pixel PXL, and a method of fabricating the display device in accordance with various embodiments, the light efficiency of the pixel PXL including each light emitting element LD may be enhanced (or improved).

While the scope of the disclosure is described by detailed embodiments, it should be noted that the above-described embodiments are merely descriptive and should not be considered limiting. It should be understood by those skilled in the art that various changes, substitutions, and alterations may be made herein without departing from the scope of the disclosure as defined by the following claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising a pixel disposed in a display area,
wherein the pixel comprises:
a first bank pattern and a second bank pattern disposed on a base layer and spaced apart from each other;
a first electrode and a second electrode disposed on the first bank pattern and the second bank pattern, respectively, and spaced apart from each other;
a light emitting element disposed between the first electrode and the second electrode, and including a first end electrically connected to the first electrode, and a second end electrically connected to the second electrode; and
at least one insulating layer overlapping the light emitting element and at least one the first electrode and the second electrode, and including at least of a first opening adjacent to the first end of the light emitting element and a second opening adjacent to the second end of the light emitting element.

2. The display device according to claim 1, wherein
the first opening of the at one insulating layer is disposed in an area corresponding to a space between the first end of the light emitting element and the first bank pattern, and
the second opening of the at least one insulating layer is disposed in an area corresponding to a space between the second end of the light emitting element and the second bank pattern.

3. The display device according to claim 1,
wherein
the first opening of the at least one insulating layer overlaps the first bank pattern, and
the second opening of the at least one insulating layer overlaps the second bank pattern.

4. The display device according to claim 3, wherein
the first opening of the at least one insulating layer has a width equal to or less than a width of the first bank pattern, and overlaps the first bank pattern, and
the second opening of the at least one insulating layer has a width equal to or less than a width of the second bank pattern and overlaps the second bank pattern.

5. The display device according to claim 1, wherein the first opening and the second opening of the at least one insulating layer are spaced apart from the light emitting element by a distance.

6. The display device according to claim 1, wherein each of the first opening and the second opening of the at least one insulating layer vertically passes through the at least one insulating layer at an angle in a range of about 80° to about 100° with respect to a plane on which the light emitting element is disposed.

7. The display device according to claim 1, wherein
the first bank pattern includes a substantially inclined surface or a substantially curved surface facing the first end of the light emitting element, and
the second bank pattern includes a substantially inclined surface or a substantially curved surface facing the second end of the light emitting element.

8. The display device according to claim 7, wherein each of the first electrode and the second electrode includes a substantially inclined surface or a substantially curved surface substantially corresponding to a shape of the first bank pattern and a shape of the second bank pattern, respectively, and includes a reflective electrode layer.

9. The display device according to claim 1, further comprising at least one of:
a first insulating layer disposed on the first electrode and the second electrode and exposing an area of the first electrode and an area of the second electrode; and
a second insulating layer disposed on the light emitting element and exposing the first end and the second end of the light emitting element.

10. The display device according to claim 1, wherein the pixel comprises:
a third electrode disposed on the first end of the light emitting element and the first electrode, and electrically connecting the first end of the light emitting element to the first electrode; and
a fourth electrode disposed on the second end of the light emitting element and the second electrode, and electrically connecting the second end of the light emitting element to the second electrode.

11. The display device according to claim 10, wherein
the at least one insulating layer is disposed directly on at least one of the third electrode and the fourth electrode, and
the first opening and the second opening of the at least one insulating layer expose an area of the third electrode and an area of the fourth electrode, respectively.

12. The display device according to claim 10, wherein the at least one insulating layer comprises at least one of:
a third insulating layer disposed on the third electrode and an area including the first end of the light emitting element, and overlapping an end of the third electrode on the light emitting element; and
a fourth insulating layer disposed on a surface of the display area including a space over the light emitting element, the third electrode, and the fourth electrode.

13. The display device according to claim 12, wherein
the first ocening of the at least one insulating layer passes through the third insulating layer and the fourth insulating layer, and
the second opening of the at least one insulating layer passes through the fourth insulating layer.

14. The display device according to claim 1, further comprising:
an upper substrate overlapping the pixel, and including a light conversion layer overlapping the pixel.

15. The display device according to claim 14, wherein the light conversion layer comprises at least one of:
a color filter layer facing the pixel, and diposed on the upper substrate; and
a color conversion layer disposed between the color filter layer and the pixel, and including color conversion particles.

16. A method of fabricating a display device, comprising:
forming a first bank pattern and a second bank pattern spaced apart from each other on a base layer;
forming a first electrode and a second electrode on the first bank pattern and the second bank pattern, respectively;
aligning a light emitting element between the first electrode and the second electrode;
forming a third electrode and a fourth electrode that connect a first end and a second end of the light emitting element to the first electrode and the second electrode, respectively;
forming at least one insulating layer on the light emitting element and at least one of the third electrode and the fourth electrode; and
forming at least one opening in the at least one insulating layer in an area adjacent to at least one end of the first end and the second end of the light emitting element.

17. The method according to claim 16, wherein the forming of the at least one opening comprises dry-etching the at least one insulating layer in a direction.

18. The method according to claim 16, comprising:
forming the third electrode and the fourth electrode, wherein
the forming of the at least one insulating layer comprises at least one of:
forming an insulating layer overlapping the third electrode and an area including the first end of the light emitting element after the forming of the third electrode; and
forming an insulating layer overlapping a surface of a display area including a space over the light emitting element, the third electrode, and the fourth electrode after forming the fourth electrode.

19. The method according to claim 16, wherein the forming of the at least one opening comprises:
forming a first opening by etching the at least one insulating layer in an area corresponding to a space between the first bank pattern and the first end of the light emitting element; and
forming a second opening by etching the at least one insulating layer in an area corresponding to a space between the second bank pattern and the second end of the light emitting element.

20. The method according to claim 16, wherein the forming of the at least one opening comprises:
forming a first opening by etching the at least one insulating layer in an area over the first bank pattern; and
forming a second opening by etching the at least one insulating layer in an area over the second bank pattern.

* * * * *